United States Patent
Khandani

(10) Patent No.: US 10,700,766 B2
(45) Date of Patent: Jun. 30, 2020

(54) NOISE CANCELLING AMPLIFY-AND-FORWARD (IN-BAND) RELAY WITH SELF-INTERFERENCE CANCELLATION

(71) Applicant: Amir Keyvan Khandani, Waterloo (CA)

(72) Inventor: Amir Keyvan Khandani, Kitchener (CA)

(73) Assignee: Amir Keyvan Khandani, Kitchener (CA)

(*) Notice: Subject to any disclaimer, the term of this patent is extended or adjusted under 35 U.S.C. 154(b) by 0 days.

(21) Appl. No.: 15/955,439

(22) Filed: Apr. 17, 2018

(65) Prior Publication Data

US 2018/0309502 A1    Oct. 25, 2018

Related U.S. Application Data

(60) Provisional application No. 62/487,273, filed on Apr. 19, 2017, provisional application No. 62/487,274, filed on Apr. 19, 2017.

(51) Int. Cl.
| | |
|---|---|
| *H04B 7/155* | (2006.01) |
| *H04B 7/08* | (2006.01) |
| *H04L 5/14* | (2006.01) |
| *H03H 7/12* | (2006.01) |
| *H04W 72/04* | (2009.01) |

(52) U.S. Cl.
CPC ..... *H04B 7/15535* (2013.01); *H04B 7/15557* (2013.01); *H04B 7/15578* (2013.01); *H03H 7/12* (2013.01); *H04B 7/086* (2013.01); *H04B 7/0857* (2013.01); *H04L 5/14* (2013.01); *H04L 5/1461* (2013.01); *H04W 72/042* (2013.01)

(58) Field of Classification Search
CPC ..... H04B 7/14–17; H04L 5/14; H04L 5/1461; H03H 7/12; H04W 72/042
See application file for complete search history.

(56) References Cited

U.S. PATENT DOCUMENTS

| | | | |
|---|---|---|---|
| 2,995,752 A | 8/1961 | Shyhalla | |
| 3,082,421 A | 3/1963 | Nicholas | |

(Continued)

FOREIGN PATENT DOCUMENTS

| | | |
|---|---|---|
| EP | 2180623 | 4/2010 |
| GB | 1091437 | 11/1967 |

(Continued)

OTHER PUBLICATIONS

EP Extended European Search Report for EP App. No. 13790076.7, dated Mar. 2, 2016, 8 pages.

(Continued)

*Primary Examiner* — Raymond S Dean
(74) *Attorney, Agent, or Firm* — Invention Mine LLC

(57) ABSTRACT

The methods and systems for amplify-and-forward (in-band) relaying relate to beamforming techniques including receive and transmit beamforming for reducing self-interference, and improving Signal-to-Noise Ratio (SNR), or Signal to Interference plus Noise Ratio (SINR), of an incoming signal (to be relayed). The incoming signal is amplified and retransmitted simultaneously with the incoming signal, and over the same frequency band as that of an incoming signal.

20 Claims, 38 Drawing Sheets

(56) References Cited

U.S. PATENT DOCUMENTS

| | | |
|---|---|---|
| 3,184,747 A | 5/1965 | Kach |
| 3,725,920 A | 4/1973 | Kupfer |
| 3,965,475 A | 6/1976 | Deerkoski |
| 4,112,430 A * | 9/1978 | Ladstatter ............ G01S 3/48 342/196 |
| 4,268,727 A | 5/1981 | Agrawal |
| 4,343,005 A | 8/1982 | Han |
| 4,701,935 A | 10/1987 | Namiki |
| 4,750,165 A | 6/1988 | Champagne |
| 5,383,224 A | 1/1995 | Mizoguchi |
| 5,388,124 A | 2/1995 | Laroia |
| 5,596,439 A | 1/1997 | Dankberg et al. |
| 5,630,154 A | 5/1997 | Bolstad et al. |
| 5,691,978 A | 11/1997 | Kenworthy |
| 5,805,116 A | 9/1998 | Morley |
| 6,084,919 A | 7/2000 | Kleider et al. |
| 6,255,997 B1 | 7/2001 | Ratkorn |
| 6,281,988 B1 | 8/2001 | Leung |
| 6,317,092 B1 | 11/2001 | De Schweinitz |
| 6,369,758 B1 | 4/2002 | Zhang |
| 6,608,864 B1 | 8/2003 | Strait |
| 6,621,876 B2 | 9/2003 | Camp, Jr. |
| 6,731,908 B2 | 5/2004 | Berliner |
| 6,745,009 B2 | 6/2004 | Raghothaman |
| 6,864,852 B2 | 3/2005 | Chiang et al. |
| 6,870,515 B2 | 3/2005 | Kitchener |
| 6,917,597 B1 | 7/2005 | Schmidl |
| 6,934,511 B1 | 8/2005 | Lovinggood et al. |
| 7,002,518 B2 | 2/2006 | Lin |
| 7,065,036 B1 | 6/2006 | Ryan |
| 7,091,894 B2 | 8/2006 | Fudge |
| 7,096,042 B2 | 8/2006 | Marinier |
| 7,184,466 B1 | 2/2007 | Seemann |
| 7,187,907 B2 | 3/2007 | Widrow |
| 7,221,688 B2 | 5/2007 | Vanness |
| 7,263,143 B1 | 8/2007 | Rothaar |
| 7,272,366 B2 | 9/2007 | Haapoja |
| 7,286,096 B2 | 10/2007 | Jaffer |
| 7,321,611 B2 | 1/2008 | Fullerton |
| 7,346,100 B2 | 3/2008 | Kumar |
| 7,471,204 B2 | 12/2008 | Safarian |
| 7,482,058 B2 | 1/2009 | Ahmed |
| 7,522,115 B2 | 4/2009 | Waltman |
| 7,627,325 B2 | 12/2009 | McCoy |
| 7,693,174 B2 | 4/2010 | Ishibashi |
| 7,706,744 B2 | 4/2010 | Rodgers |
| 7,817,641 B1 | 10/2010 | Khandani |
| 7,920,539 B2 | 4/2011 | Stanford |
| 7,944,871 B2 | 5/2011 | Imamura |
| 7,991,160 B2 | 8/2011 | Guccione |
| 8,023,438 B2 | 9/2011 | Kangasmaa |
| 8,031,744 B2 | 10/2011 | Radunovic |
| 8,064,502 B2 | 11/2011 | Sawai |
| 8,107,906 B2 | 1/2012 | Lum |
| 8,175,535 B2 | 5/2012 | Mu |
| 8,184,052 B1 | 5/2012 | Wu et al. |
| 8,184,061 B2 | 5/2012 | Sanford |
| 8,208,628 B2 | 6/2012 | Yener |
| 8,238,551 B2 | 8/2012 | Reznik |
| 8,280,046 B2 | 10/2012 | Rudolf |
| 8,306,480 B2 | 11/2012 | Muhammad |
| 8,351,874 B2 | 1/2013 | Dent |
| 8,373,582 B2 | 2/2013 | Hoffberg |
| 8,385,235 B2 | 2/2013 | Chiu |
| 8,401,196 B2 | 3/2013 | Goldberg |
| 8,405,543 B2 | 3/2013 | Kluge |
| 8,498,585 B2 | 7/2013 | Vandenameele |
| 8,587,492 B2 | 11/2013 | Runyon |
| 8,628,650 B2 | 1/2014 | Ah |
| 8,629,650 B2 | 1/2014 | Mohammadian |
| 8,644,768 B2 | 2/2014 | Kluge |
| 8,744,377 B2 | 6/2014 | Rimini |
| 8,767,869 B2 | 7/2014 | Rimini |
| 8,823,577 B2 | 9/2014 | Smid |
| 8,836,581 B2 | 9/2014 | Nysen |
| 8,836,601 B2 | 9/2014 | Sanford |
| 8,836,606 B2 | 9/2014 | Kish |
| 8,837,615 B2 | 9/2014 | Baldemair |
| 8,842,044 B2 | 9/2014 | Nysen |
| 8,860,629 B2 | 10/2014 | Shtrom |
| 8,897,269 B2 | 11/2014 | Ji |
| 8,918,692 B2 | 12/2014 | Braithwaite |
| 8,976,641 B2 | 3/2015 | Choi |
| 9,019,165 B2 | 4/2015 | Shtrom |
| 9,036,749 B2 | 5/2015 | Choi |
| 9,054,795 B2 | 6/2015 | Choi |
| 9,059,879 B2 | 6/2015 | Jaeger |
| 9,071,313 B2 | 6/2015 | Monsen |
| 9,077,071 B2 | 7/2015 | Shtrom |
| 9,077,407 B2 | 7/2015 | Koren |
| 9,077,421 B1 | 7/2015 | Mehlman |
| 9,093,758 B2 | 7/2015 | Kish |
| 9,130,693 B2 | 9/2015 | Reznik |
| 9,246,234 B2 | 1/2016 | Rao |
| 9,276,682 B2 | 3/2016 | Bharadia |
| 9,277,591 B2 | 3/2016 | Amini |
| 9,281,979 B2 | 3/2016 | Maltsev |
| 9,337,885 B2 | 5/2016 | Mehlman |
| 9,571,205 B1 | 2/2017 | Suarez |
| 9,608,705 B2 | 3/2017 | Maru |
| 9,622,098 B2 | 4/2017 | Emmanuel |
| 9,713,010 B2 | 7/2017 | Khandani |
| 9,791,552 B1 | 10/2017 | Schuman |
| 10,069,479 B1 * | 9/2018 | Desclos ............ H03H 11/1217 |
| 2001/0010495 A1 | 8/2001 | Helms |
| 2002/0028655 A1 * | 3/2002 | Rosener ............ H04B 7/2606 455/16 |
| 2002/0032004 A1 | 3/2002 | Widrow |
| 2002/0097810 A1 | 7/2002 | Seki |
| 2003/0043071 A1 * | 3/2003 | Lilly ............ H01Q 3/22 342/368 |
| 2003/0114128 A1 | 6/2003 | Haapoja |
| 2003/0189974 A1 | 10/2003 | Ferry |
| 2003/0189975 A1 | 10/2003 | Fullerton |
| 2004/0022229 A1 | 2/2004 | Vanness |
| 2004/0076246 A1 | 4/2004 | Vanderperren et al. |
| 2004/0132414 A1 | 7/2004 | Sendyk |
| 2005/0020771 A1 | 1/2005 | Ahmed |
| 2005/0024540 A1 | 2/2005 | Kim et al. |
| 2005/0052330 A1 | 3/2005 | Mehltretter |
| 2005/0057420 A1 | 3/2005 | Lin |
| 2005/0083863 A1 | 4/2005 | Umei |
| 2005/0275576 A1 | 12/2005 | Fudge |
| 2006/0014491 A1 * | 1/2006 | Cleveland ............ H04B 7/15571 455/17 |
| 2006/0045063 A1 | 3/2006 | Stanford |
| 2006/0109067 A1 | 5/2006 | Shtrom |
| 2006/0192720 A1 | 8/2006 | Shtrom |
| 2007/0026804 A1 | 2/2007 | Ishibashi |
| 2007/0026807 A1 | 2/2007 | Kish |
| 2007/0036353 A1 | 2/2007 | Reznik |
| 2007/0057860 A1 | 3/2007 | Jaffer |
| 2007/0063875 A1 | 3/2007 | Hoffberg |
| 2007/0080891 A1 | 4/2007 | De Lustrac |
| 2007/0082617 A1 | 4/2007 | McCallister |
| 2007/0082622 A1 * | 4/2007 | Leinonen ............ H04B 1/005 455/78 |
| 2007/0132651 A1 | 6/2007 | Nilsson |
| 2007/0254692 A1 | 11/2007 | McCoy |
| 2008/0009257 A1 | 1/2008 | Safarian |
| 2008/0063113 A1 | 3/2008 | Gao |
| 2008/0107046 A1 | 5/2008 | Kangasmaa |
| 2008/0123851 A1 | 5/2008 | Guccione |
| 2008/0129640 A1 | 6/2008 | Shtrom |
| 2008/0165874 A1 | 7/2008 | Steele et al. |
| 2008/0233966 A1 | 9/2008 | Scheim |
| 2009/0092072 A1 | 4/2009 | Imamura |
| 2009/0135748 A1 | 5/2009 | Lindoff et al. |
| 2009/0141900 A1 | 6/2009 | Ye |
| 2009/0186582 A1 | 7/2009 | Muhammad |
| 2009/0213770 A1 | 8/2009 | Mu |
| 2009/0253385 A1 | 10/2009 | Dent |
| 2009/0284218 A1 | 11/2009 | Mohammadian |

(56) References Cited

U.S. PATENT DOCUMENTS

| | | |
|---|---|---|
| 2009/0323582 A1* | 12/2009 | Proctor, Jr. ............... H04B 7/04 370/315 |
| 2010/0003931 A1 | 1/2010 | Krishnan |
| 2010/0008406 A1 | 1/2010 | Sawai |
| 2010/0020771 A1 | 1/2010 | Ji |
| 2010/0022201 A1 | 1/2010 | Vandenameele |
| 2010/0086012 A1 | 4/2010 | Rofougaran |
| 2010/0165866 A1 | 7/2010 | Sachse |
| 2010/0165895 A1 | 7/2010 | Elahi |
| 2010/0167662 A1 | 7/2010 | Kluge |
| 2010/0232324 A1 | 9/2010 | Radunovic |
| 2010/0248714 A1 | 9/2010 | Kang |
| 2010/0271987 A1 | 10/2010 | Chiu |
| 2010/0321245 A1 | 12/2010 | Aoki |
| 2011/0110451 A1 | 5/2011 | Tsai |
| 2011/0116639 A1 | 5/2011 | Yamada et al. |
| 2011/0143655 A1 | 6/2011 | Ahn |
| 2011/0149714 A1 | 6/2011 | Rimini |
| 2011/0268100 A1 | 11/2011 | Gorokhov |
| 2012/0027113 A1 | 2/2012 | Gaal |
| 2012/0068904 A1 | 3/2012 | Shtrom |
| 2012/0087424 A1 | 4/2012 | Brown |
| 2012/0113862 A1 | 5/2012 | Santhanam et al. |
| 2012/0159279 A1 | 6/2012 | Braithwaite |
| 2012/0200158 A1 | 8/2012 | Takei |
| 2012/0201153 A1 | 8/2012 | Bharadia |
| 2012/0201173 A1 | 8/2012 | Jain |
| 2012/0220246 A1 | 8/2012 | Kushnir |
| 2012/0281834 A1 | 11/2012 | Reznik |
| 2012/0300680 A1 | 11/2012 | Pietsch |
| 2012/0327881 A1 | 12/2012 | Nakano et al. |
| 2013/0010851 A1 | 1/2013 | Jaeger |
| 2013/0044791 A1 | 2/2013 | Rimini |
| 2013/0089009 A1 | 4/2013 | Li |
| 2013/0089021 A1* | 4/2013 | Gaal ............... H04B 7/155 370/315 |
| 2013/0099974 A1 | 4/2013 | Wang |
| 2013/0102254 A1 | 4/2013 | Cyzs |
| 2013/0114468 A1 | 5/2013 | Hui |
| 2013/0286903 A1 | 10/2013 | Khojastepour |
| 2013/0301487 A1 | 11/2013 | Khandani |
| 2014/0126675 A1 | 5/2014 | Monsen |
| 2014/0135056 A1 | 5/2014 | Wang |
| 2014/0169236 A1 | 6/2014 | Choi |
| 2014/0204808 A1 | 7/2014 | Choi |
| 2014/0210681 A1 | 7/2014 | Shtrom |
| 2014/0218248 A1 | 8/2014 | Schulz |
| 2014/0219139 A1 | 8/2014 | Choi |
| 2014/0225788 A1 | 8/2014 | Schulz |
| 2014/0269964 A1* | 9/2014 | Du ............... H04B 7/0452 375/267 |
| 2014/0333466 A1* | 11/2014 | Mohamadi ............ G01S 13/887 342/27 |
| 2014/0334322 A1 | 11/2014 | Shtrom |
| 2014/0348018 A1 | 11/2014 | Bharadia et al. |
| 2014/0348032 A1 | 11/2014 | Hua |
| 2015/0029906 A1 | 1/2015 | Jana |
| 2015/0043323 A1 | 2/2015 | Choi |
| 2015/0043685 A1 | 2/2015 | Choi |
| 2015/0049834 A1 | 2/2015 | Choi |
| 2015/0063176 A1 | 3/2015 | Hong |
| 2015/0070243 A1 | 3/2015 | Kish |
| 2015/0078217 A1 | 3/2015 | Choi |
| 2015/0139284 A1 | 5/2015 | Choi |
| 2015/0171903 A1* | 6/2015 | Mehlman ............ H04B 1/10 375/346 |
| 2015/0188646 A1 | 7/2015 | Bharadia |
| 2015/0223173 A1 | 8/2015 | Khojastepour |
| 2015/0236750 A1 | 8/2015 | Choi |
| 2015/0249997 A1 | 9/2015 | Clegg |
| 2015/0263780 A1 | 9/2015 | Mehlman |
| 2015/0280893 A1 | 10/2015 | Choi |
| 2015/0311599 A1 | 10/2015 | Shtrom |
| 2015/0312905 A1 | 10/2015 | Seo et al. |
| 2015/0318976 A1 | 11/2015 | Eltawil |
| 2015/0333847 A1 | 11/2015 | Bharadia |
| 2015/0334745 A1 | 11/2015 | Zhao |
| 2015/0341125 A1 | 11/2015 | Bharadia |
| 2015/0341879 A1 | 11/2015 | Shtrom |
| 2016/0127876 A1 | 5/2016 | Kish |
| 2016/0226653 A1 | 8/2016 | Bharadia |
| 2016/0248160 A1 | 8/2016 | Shtrom |
| 2016/0249376 A1 | 8/2016 | Kish |

FOREIGN PATENT DOCUMENTS

| | | |
|---|---|---|
| JP | 10502220 A | 2/1998 |
| KR | 1020040096404 | 11/2004 |
| KR | 1020070072629 | 7/2007 |
| KR | 1020120080231 | 7/2012 |
| WO | 1994028585 | 12/1994 |
| WO | 1996022643 | 7/1996 |
| WO | 2011065020 | 6/2002 |
| WO | 2003098823 | 11/2003 |
| WO | 2004007497 | 1/2004 |
| WO | WO2009156510 | 12/2009 |
| WO | 2010005951 | 1/2010 |
| WO | 2010051232 | 5/2010 |
| WO | 2011148341 | 12/2011 |
| WO | 2012042256 | 4/2012 |
| WO | 2016014016 | 1/2016 |

OTHER PUBLICATIONS

Extended European Search Report for EP App. 13790948.7, dated Nov. 4, 2015, 9 pages.

Gharavol, E., et al., "Robust Joint Optimization of MIMO Two-Way Relay Channels With Imperfect CSI", Communication, Control, and Computing (Allerton), 2011 49th Annual Allerton Conference on, IEEE, Sep. 28, 2011, pp. 1657-1664 (6 pages), XP032085749, DOI: 0.1109/ALLERTON.2011.6120368, ISBN: 978-1-4577-1817-5.

International Search Report and Written Opinion for PCT/US2013/040822 dated Jul. 18, 2013. (8 pages).

International Search Report and Written Opinion for PCT/US2014/042136 dated Dec. 9, 2014. (13 pages).

International Search Report and Written Opinion for PCT/US2014/051137 dated Nov. 24, 2014. (10 pages).

International Search Report and Written Opinion from PCT/US2014/050968 dated Nov. 19, 2014. (9 pages).

International Search Report for PCT/US2013/040818 dated Jul. 24, 2013. (2 pages).

Jain, M., "Practical, Real-Time, Full Duplex Wireless", MobiCom '11, Sep. 19-23, 2011, Las Vegans, NC, USA, 2011 (12 pages).

Jung Il, ., "Achieving single channel, full duplex wireless communication", Proceedings from the Annual International Conference on Mobile Computing and Networking, MobiCom—MobiCom' 10 and MobiHOC' 10—Proceedings of the 16th Annual International Conference on Mobile Computing and Networking and 11th ACM International Symposi, Sep. 20, 2010, pp. 1-12 12 pages), XP002696691.

McMichael, J. G., et al., "Optimal tuning of analog self-interference cancellers for full-duplex wireless communication". IEEE, Fiftieth Annual Allerton Conference, Oct. 1-5, 2012, p. 246-251. (6 pages).

Provisional Application, entitled: "Adaptive Non-Linear Digital Cancellation for Full-Duplex Radios", U.S. Appl. No. 61/864,453, filed Aug. 9, 2013. (27 pages).

Provisional Application, entitled: "Cancellation Circuit With Variable Delay and Amplifier", U.S. Appl. No. 61/876,663, filed Sep. 11, 2013. (20 pages).

Provisional Application, entitled: "Feed Forward Signal Cancellation", U.S. Appl. No. 61/736,726, filed Dec. 13, 2012. (17 pages).

Provisional Application, entitled: "Frequency Independent Analog Cancellation Circuit", U.S. Appl. No. 61/864,459, filed Aug. 9, 2013. (25 pages).

Provisional Application, entitled: "Hybrid IF/RF Digital Cancellation Architectures for Full-Duplex Radios", U.S. Appl. No. 61/915,431, filed Dec. 12, 2013. (31 pages).

(56) References Cited

OTHER PUBLICATIONS

Provisional Application, entitled: "Interference Cancellation Architectures With Frequency Isolation", U.S. Appl. No. 62/030,240, filed Jul. 29, 2014. (30 pages).
Provisional Application, entitled: "Method and Apparatus for Mitigating Phase Noise to Improve Self-Interference Cancellation", U.S. Appl. No. 61/865,943, filed Aug. 14, 2013.
Provisional Application, entitled: "Method and Apparatus for Mitigating Phase Noise to Improve Self-Interference Cancellation", U.S. Appl. No. 61/865,943, filed Aug. 14, 2013. (27 pages).
Provisional Application, entitled: "Near Band Cancellation", U.S. Appl. No. 61/970,852, filed Mar. 26, 2014. (28 pages).
Provisional Application, entitled: "Self Interference Cancellation Architecture for In-Band Full Duplex Relay Node", U.S. Appl. No. 61/871,519, filed Aug. 29, 2013. (30 pages).
Provisional Application, entitled: "Signal Cancellation Using Feedforward and Feedback", U.S. Appl. No. 61/760,518, filed Feb. 4, 2013. (19 pages).
Provisional Application, entitled: "Techniques for Digital Interference Cancellation", U.S. Appl. No. 62/002,578, filed May 23, 2014. (33 pages).
Provisional Application, entitled: "Tunable Self Interference Cancellation", U.S. Appl. No. 61/950,742, filed Mar. 10, 2014. (32 pages).
Provisional Application, entitled: "Tuning Algorithm for Multi-Tap Signal Cancellation Circuit", U.S. Appl. No. 61/754,447, filed Jan. 18, 2013. (16 pages).

Vaze, R., et al., "To Code or Not to Code in Multi-Hop Relay Channels", arxiv.org, Cornell University Library, May 20, 2008, XP080418936, 30 pages.
Chen, B., et al., "Quantization Index Modulation: A Class of Provably Good Methods for Digital Watermarking and Information Embedding", IEEE Transaction on Information Theory, vol. 47, No. 4, May 2001, pp. 1423-1443. (21 pages).
EP Extended Search Report for EP App. No. 13790160.9-1874, dated Jan. 16, 2016, 9 pages.
Persson, D., et al., "Joint Source-Channel Coding for the MIMO Broadcast Channel", IEEE Transactions on Signal Processing, vol. 60, No. 4, Apr. 2012, pp. 2085-2090. (6 pages).
Korean Patent Abstract of 1020070072629, dated Jul. 4, 2007, 1 page.
Extended European Search Report for EP App. 14865287.8, dated Jul. 4, 2017. 7 Pages.
Aono T et al: "Wireless secret key generation exploiting reactance-domain scalar response of multipath fading channels", IEEE Transactions on Antennas and Propagation, IEEE Service Center, Piscataway, NJ, US, vol. 53, No. 11, Nov. 1, 2005 (Nov. 1, 2005), pp. 3776-3784 (9 pages), XP001512766, ISSN: 0018-926X, DOI: 10.1109/TAP. 2005.858853.
Khandani Amir K: "Two-way (true full-duplex) wireless", 2013 13th Canadian Workshop on Information Theory, IEEE, Jun. 18, 2013 (Jun. 18, 2013), pp. 33-38 (6 pages), XP032495648, DOI: 10.1109/CWIT.2013.6621588 , [retrieved on Oct. 4, 2013].

* cited by examiner

Simple Source for Generating Training Signal

NOISE CANCELLING AMPLIFY-AND-FORWARD (IN-BAND) RELAY WITH SELF-INTERFERENCE CANCELLATION

CROSS-REFERENCE TO RELATED APPLICATIONS

The present application is related to and claims the benefit of the earliest available effective filing date(s) from the following listed application(s) (the "Related Applications") (e.g., claims earliest available priority dates for other than provisional patent applications or claims benefits under 35 USC § 119(e) for provisional patent applications, for any and all parent, grandparent, great-grandparent, etc. applications of the Related Application(s)). All subject matter of the Related Applications and of any and all parent, grandparent, great-grandparent, etc. applications of the Related Applications is incorporated herein by reference to the extent such subject matter is not inconsistent herewith.

The present application constitutes a nonprovisional filing of U.S. Patent Provisional Application No. 62/487,274 entitled "RF Beamforming" naming Amir Khandani as inventor, filed Apr. 19, 2017 and U.S. Patent Provisional Application No. 62/487,273, entitled "Amplify and Forward Relay with Self-Interference Cancellation" naming Amir Khandani as inventor, filed Apr. 19, 2017.

BACKGROUND

Most wireless communication systems include a central node, such as a cellular base-station, a WiFi access point, and/or an Internet of Things gateway communicating to a multitude of clients. In such configurations, it is desirable to increase the coverage area or range, and to remove blind spots. The straightforward approach is to increase transmit power. Simply increasing transmit power has several drawbacks. First, and foremost, transmission at high power levels increases the amount of interference to nearby nodes that may be reusing the same spectrum at the same time. In addition, for resource-limited clients such as mobile phones, increasing the power level will have side effects such as battery drainage and health implications for their users.

There is an ongoing need to enable transmitters to transmit at lower power levels.

SUMMARY

An apparatus and method includes embodiments directed to a noise cancelling amplify and forward relay. One embodiment is directed to an apparatus including a receive front-end including at least one receive antenna operable at a first frequency band and responsive to an incoming radio frequency signal; an amplification stage coupled to the receive front end, the amplification stage to amplify the incoming radio frequency signal received at the receive front-end to provide an amplified incoming radio frequency signal; a transmit front-end coupled to the amplification stage to receive the amplified incoming radio frequency signal, the transmit front-end including at least one transmit antenna operating at the first frequency band, the transmit front-end to transmit the amplified incoming radio frequency signal to a distant receiver while the receive front-end receives the incoming radio frequency signal; and a signal leakage filter stage coupled to the transmit front-end, the signal leakage filter stage to reduce transmitted amplified incoming radio frequency signal leaked to the receive front-end.

In one embodiment, the receive front-end includes a plurality of receive antennas to perform receive beamforming, each of the plurality of receive antennas configured with a radio frequency beamforming tunable filter.

In one embodiment, the plurality of receive antennas separately receive the incoming radio frequency signal to enable radio frequency combining and amplification to reduce signal leakage from the transmit front-end to the receive front-end via one or more tunable filters configured to create a wide-band receive null for the transmit front-end.

In one embodiment, the radio frequency beamforming tunable filters in each of the plurality of receive antennas increase the beamforming gain to improve a signal-to-noise ration of the incoming radio frequency signal.

In another embodiment, the transmit front-end includes a plurality of transmit antennas to perform transmit beamforming, each of the plurality of transmit antennas configured with a radio frequency beamforming filter.

In one embodiment, the plurality of transmit antennas receive the amplified incoming radio frequency signal for transmit via a plurality of filters that produce a transmit null over the receive front-end to reduce leakage from the transmit front-end to the receive front-end.

In one embodiment, the plurality of filters includes pairs of filters, wherein one of each pair of filters is being refreshed while another of each pair of filters is in use.

In one embodiment the plurality of transmit antennas receive the amplified incoming radio frequency signal for transmit via a plurality of filters that focus the amplified incoming radio frequency signal for transmit to a distant receiver.

In one embodiment, the apparatus includes a plurality of receive antennas organized into two or more subsets of receive antennas to enable each receive antenna of the plurality of receive antennas to pass through wide-band beamforming circuitry with a finite number of states. The finite number of states can include one or more of a 0° phase shift, a 180° phase shift and a disconnect.

In one embodiment, the amplified incoming radio frequency signal is formed as a composite signal combined from the output from the wide-band beamforming circuitry with the finite number of states.

In one embodiment, the composite signal includes a combined signal received via one or more output signals from each of the two or more subsets of receive antennas, wherein each of the two or more subsets of receive antennas coupled to a frequency selective receive beamforming filter.

The apparatus according to one embodiment includes a plurality of transmit antennas that are grouped into two or more subsets of transmit antennas, each subset coupled to a frequency selective transmit beamforming filter to produce a filtered signal, each frequency selective beamforming filter coupled to divider and beamforming circuitry with a finite number of states, wherein the beamforming circuitry with the finite number of states is coupled to a transmit antenna to transmit a recombined amplified incoming radio frequency signal.

In one embodiment, the apparatus also includes a signature signal generation circuit coupled to the transmit front-end, the signature signal generation circuit providing a signature signal included with the amplified incoming radio frequency signal for transmit, the signature signal to provide training for adapting to self-interference between the receive front-end and the transmit front-end.

In one embodiment, the training for adapting to self-interference includes one or more of blind channel estimation and analog echo cancellation via a corrective signal inserted into the receive front-end, the corrective signal created via a filtered transmit signal, the analog echo cancellation performed in at least one of Radio Frequency (RF), Intermediate Frequency (IF) and analog baseband.

In one embodiment, the apparatus transmit front-end and receive front end include a plurality of transmit antennas and a plurality of receive antennas, the plurality of transmit antennas symmetrically placed with respect to the plurality of receive antennas to reduce self-interference.

In one embodiment, the plurality of receive antennas and the plurality of transmit antennas each have two terminals for transmit and receive over the same frequency band, the plurality of receive antennas and the plurality of transmit antennas being shared between transmit and receive front-ends.

In one embodiment, the plurality of receive antennas and the plurality of transmit antennas each have four terminals for transmit and receive over at least two frequency bands, the plurality of receive antennas and the plurality of transmit antennas being shared between transmit and receive front-ends.

In one embodiment, the transmit front-end and the receive front end operate with at least two frequency bands simultaneously relaying uplink and downlink radio frequency signals in a Frequency Division Duplex (FDD) wireless network.

Another embodiment is directed to a method for relaying an incoming radio frequency signal including receiving the incoming radio frequency signal at a receive front-end including at least one receive antenna operable at a first frequency band and responsive to the incoming radio frequency signal; amplifying the incoming radio frequency signal in an amplification stage coupled to the receive front end, the amplification stage to amplify the incoming radio frequency signal received at the receive front-end to provide an amplified incoming radio frequency signal; transmitting the amplified incoming radio frequency signal via a transmit front-end coupled to the amplification stage, the transmit front-end including at least one transmit antenna operating at the first frequency band, the transmit front-end transmitting the amplified incoming radio frequency signal to a distant receiver while the receive front-end receives the incoming radio frequency signal; and reducing signal leakage from the transmit front-end to the receive front-end via providing a self-interference cancellation channel, blind channel estimation and analog echo cancellation.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
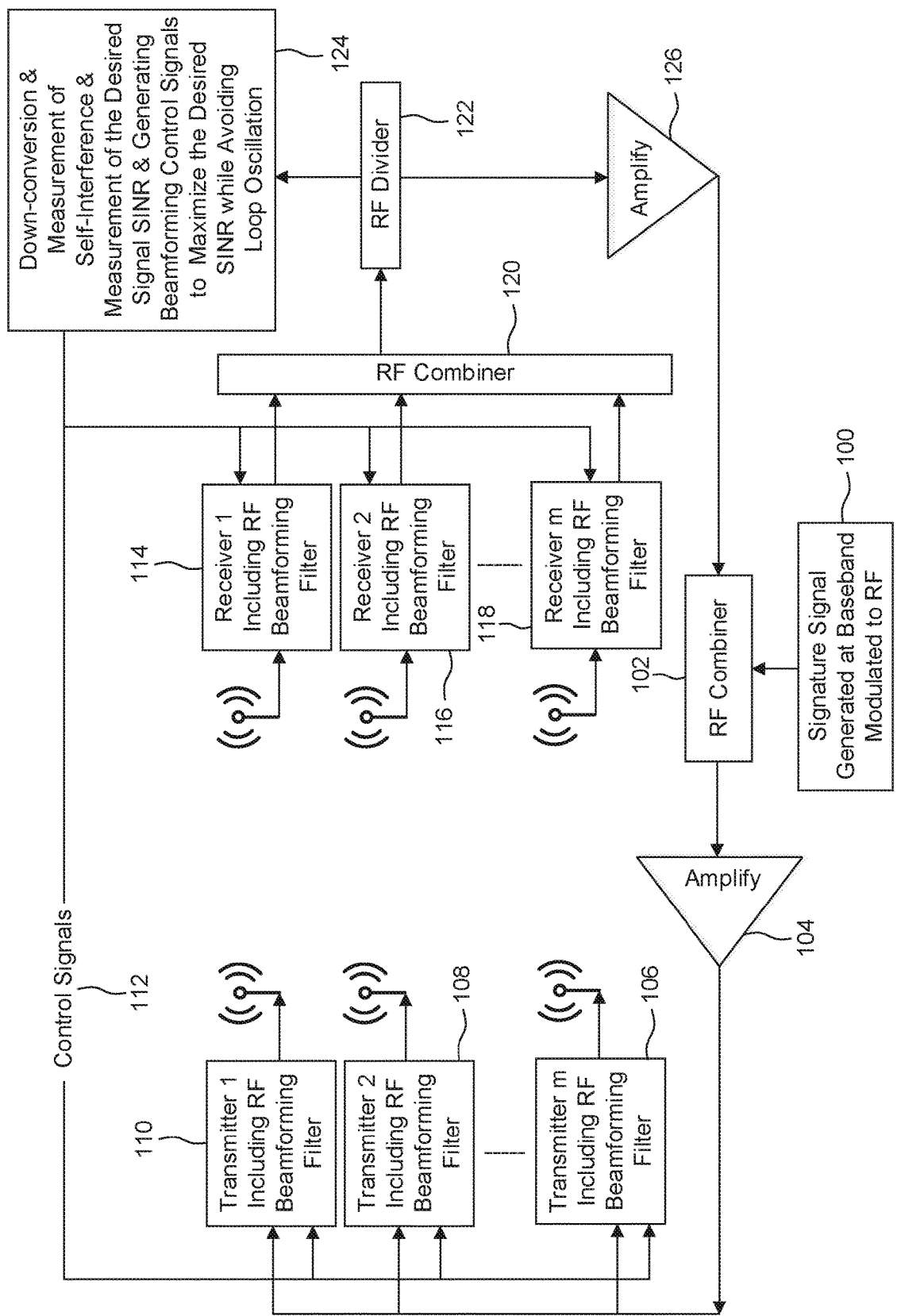
FIG. 1 illustrates a transmitter and receiver in accordance with an embodiment.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here.

Embodiments herein address the need to enable transmitters to transmit at lower power levels by providing an external unit that amplifies and provides a forward relay of their emitted signals.

Embodiments herein include amplify-and-forward relays that can be placed in locations in need of improved coverage. Thus, each relay receives the incoming signal from the central node, amplifies the incoming signal and emits the amplified signal to improve the coverage within a neighborhood. Embodiments herein provide amplify-and-forward relay structures that: (1) provide a high gain (amplification) without oscillation, (2) improve the relayed signal in terms of its (end-to-end) Signal-to-Noise Ratio (SNR), or Signal to Interference plus Noise Ratio (SINR). In addition, the relaying operation includes embodiments that, including amplification and forwarding of the incoming signal, are fast enough such that the signal passing through the relay node appears as another component of a multi-path propagation in the channel from the central node to a client (down-link), or vice versa, in the channel from client to the central node (uplink). As one of skill in the art will appreciate, a simple amplification of the incoming signal will also amplify the noise and amplify multi-user interference. Such noise and interference embedded in the signal will degrade the performance, including throughput, and error rate, of the end-to-end link.

Embodiments described herein relate to an amplify and forward relay which operates as an interface between a central transmitter, such as a cellular base-station, and client, such as mobile phones. The connection between a central node and clients can be two-way, i.e., including downlink transmission from the central node to its clients and uplink transmission from clients to the central node. Depending on the underlying standard, the downlink and uplink connections are typically multiplexed either in the time domain or in the frequency domain. Amplify-and-forward relays according to embodiments herein handle both downlink and uplink connections.

Noise related to embodiments herein can be generated by feedback within the loop formed between transmit and receive front-ends of the amplify-and-forward relay, which can cause oscillation; and by amplification of noise embedded in the incoming signal, which can potentially degrade the signal-to-noise ratio of the relayed signal. The noise can be a combination of thermal noise added by a first stage of a receive front-end, and multi-user interference caused by other nodes operating over the same frequency band.

Embodiments described herein address noise generated and amplified and remain transparent to the operation of the signal that is being relayed. Accordingly, embodiments provide "receive beamforming", "transmit beamforming", and "self-interference cancellation" by forming additional paths for the relayed signal with the property that a combination of the signal flowing through these paths also cancel the self-interference, but do not cancel the incoming signal to be relayed.

Referring now to FIG. 1, a basic structure of transmitter and receiver units is shown including a feedback structure in accordance with an embodiment is shown. Thus, a signature signal generated at baseband and modulated to a radio frequency 100 is provided to an RF combiner 102 and amplified by amplifier 104. Each of the amplified signals is provided to transmitters 1-m, identified by transmitters, 106, 108 and 110.

Transmitters 1-m (106, 108, 110) also receive control signals 112 that are also provided to receivers 1-m 114, 116, and 118. Each of receivers 1, 2 through m include beamforming filters just like transmitters 1, 2 through m. Outputs of receivers 114, 116 and 118 are provided to RF combiner 120, which combines the signals and provides the output to RF divider 122. RF divider 122 provides data to downconversion and measurement of self-interference and measurement of SINR and generating beamforming control signals block 124. RF divider 122 also provides data to amplify block 126 and back to REF combiner 102.

Figure 2:
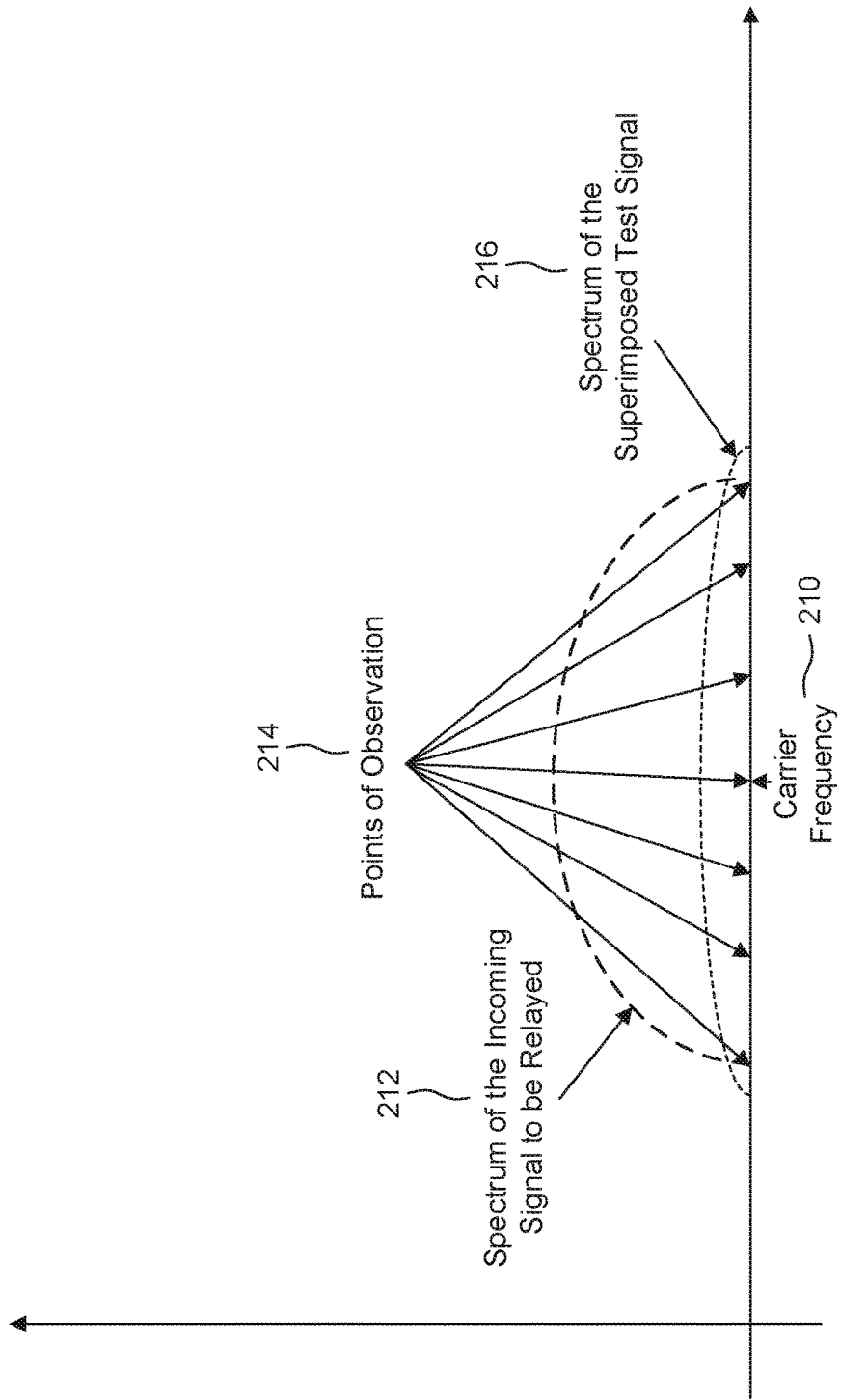
FIG. 2 illustrates a frequency spectrum including superimposed signals in accordance with an embodiment.

Referring now to FIG. 2, a test signal is superimposed on an outgoing signal and detected in a receiver chain for measuring self-interference. The results of the test signal superimposition are used to generate control signals, such as control signals 112. As shown, carrier frequency 210 is shown in the center of a spectrum of frequencies. The spectrum of the incoming signal to be relayed, 212, the points of observation 214 and the spectrum of a superimposed test signal 216 are displayed. Thus, signature signals are superimposed within the frequency band being relayed. The task of beamforming for nulling self-interference narrows down to reducing such signature signals at the receiver front-end of the relay. Examples of such signature signals include "low power OFDM signal with some tones left empty", "chirp signals", "pseudo-random spreading codes", orthogonal signals such as "Hadamard", "Zadoff Chu sequence", "Gold sequence", and the like. In multiple-in-multiple-out (MIMO) operation, several signature signals are required which can be distinguishable from each other. The MIMO signatures enable measuring the equivalent MIMO self-interference channel formed between transmit front-end and receive front-end of the relay node. The MIMO signatures can be generated using "time multiplexing", "frequency multiplexing", or "code multiplexing such as, Zadoff Chu sequence of different parameters, or CDMA spreading codes of a basic signature signal.

In addition to generating a signature signal, to cancel the self-interference, a receive structure evaluates the level of signature signal over an observation basis, such as a set of coordinates, which, collectively, capture the amount of self-interference over the frequency band being relayed. Examples for such an observation coordinate system include a discrete set of equally spaced points over the frequency band, or the impulse response of the self-interference channel in the time domain.

Typically, an observation coordinate system and a signature generation coordinate system are the same and are in the form of a set of equally spaced points in the time and/or in the frequency domain. The "signature generation coordinate system", in conjunction with the "observation coordinate system" enable measurement of the impulse response of the self-interference channel, such as the channel formed between transmit front-end and receive front-end of a relay node.

Figure 3:
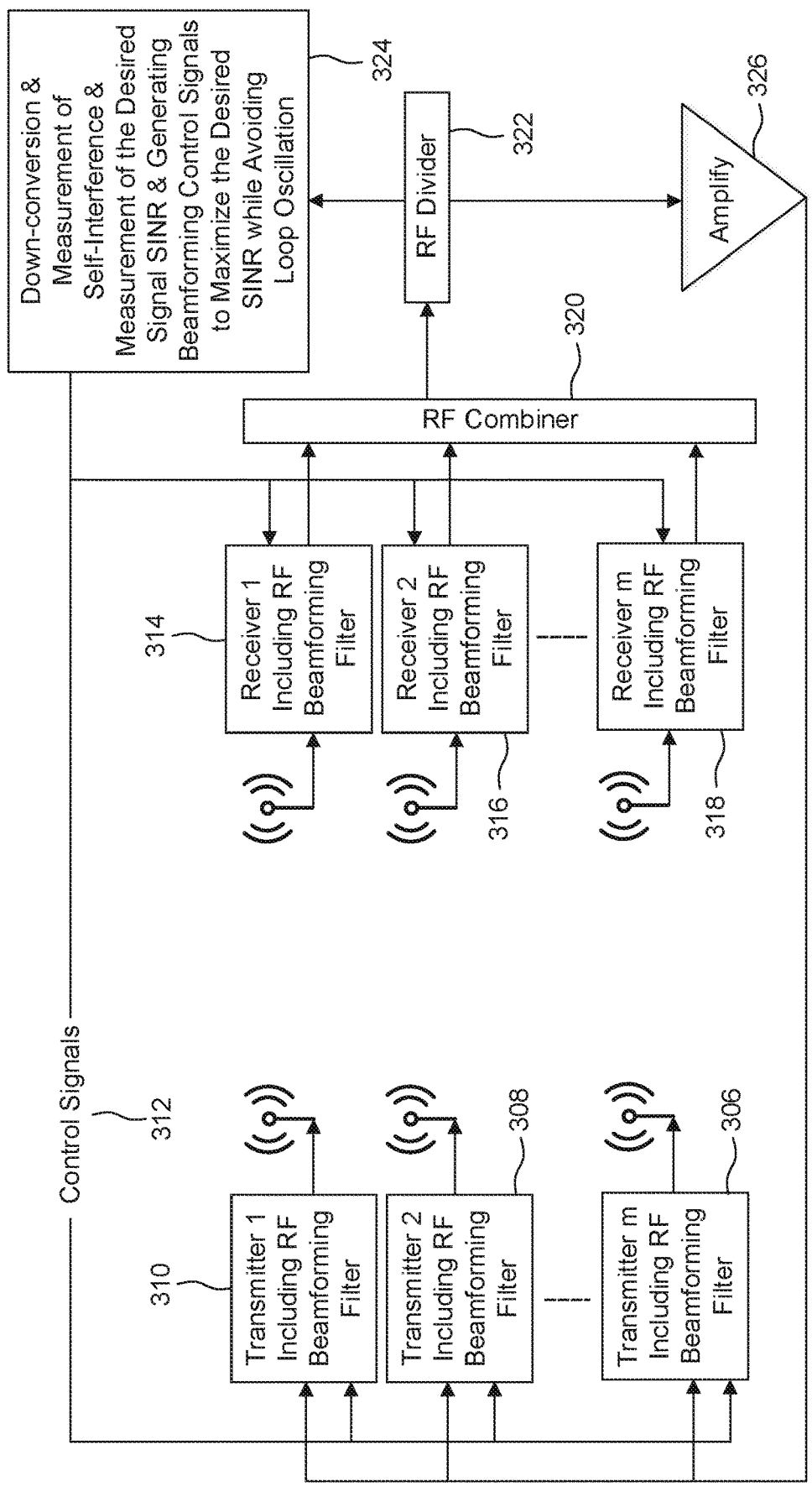
FIG. 3 illustrates transmitters and receivers without superimposed signals in accordance with an embodiment.

Referring now to FIG. 3, an embodiment illustrates transmit and receive structure without signature signals. A shown, a training signal for the measurement of an impulse response of the self-interference channel is sent in a separate time slot, time multiplexed. In all cases with or without using superimposed signature signals, the closed loop gain is controlled to avoid oscillation.

Blocks 306, 308, and Block 310, include transmitters 1-m with RF beamforming filters. The structure includes control signal 312 which is coupled to Block 324 which provides down conversion and measurement of self interference and measurements of the desired signal Signal to Interference-plus-Noise Ratio (SINR) and generating beamforming control signals to maximize the desired SINR while avoiding loop isolation. Block 324 is also couple to RF divider 322 and amplify circuit 326. receiver circuits 314, 316, 318 represent receivers including RF beamforming filter which received control signals from control signal 312 RF combiner 320 is coupled to RF divider 322.

Another embodiment relies on separate (time multiplexed) training signals to initialize the operation (measuring and cancelling of self-interference), and then uses superimposed signature signals in the tracking phase. System can stop relaying and enter this initialization phase whenever the amount of self-interference is too high, or oscillation occurs in spite of closed loop gain control, or the gain to avoid oscillation is not enough for normal relaying operation to be effective.

Figure 4:
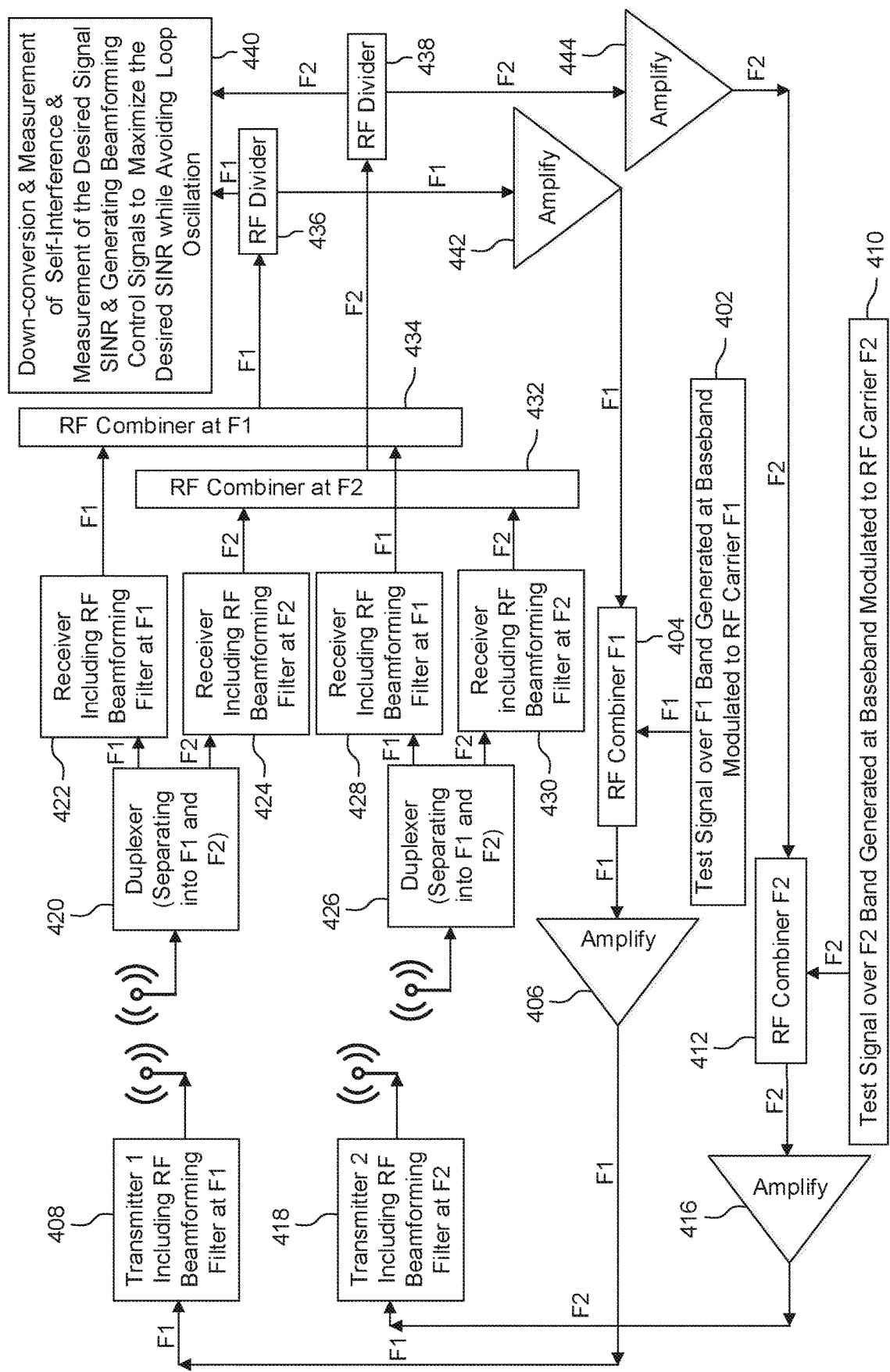
FIG. 4 illustrates a relay structure for relaying FDD signals in accordance with an embodiment.

FIG. 4 shows a relay structure for relaying FDD signals, where F1 and F2, are uplink and downlink frequencies. Receive antennas are coupled to duplexers 420 and 426 and can receive over both bands. Transmitter antenna 408 sends over F1 and can receive at F2 (not shown), and transmitter antenna 418 sends over F2 can receive over F1 (not shown). All received signals over F1 are combined after proper filtering, amplified and fed into transmit antenna operating over F1 408. All received signals over F2 are combined after proper filtering and amplification and fed into transmit antenna operating over F2 418. Duplexer 420 separates F1 and F2 such that receiver 422 receives F1 including beamforming filter at F1. Receiver 424 receives F2 including are RF beamforming filter at F2. Receiver 422 is coupled to RF combiner at F1. Receiver 424 provides F2 to RF combiner 432. Receiver 428 provides F1 to RF combiner 434 at F1. Receiver 430 provides F2 to RF combiner 432.

RF dividers 436 and 438 receive frequencies F1 and F2, respectively and are both provided to block 440.

Block 440 provides down-conversion and measurement of self interference and measurement of the desired signal SINR and generates beamforming control signals to maximize the desired SINR while avoiding loop oscillation.

The signals received at RF dividers 436 and 438 are also provided to amplify circuits 442 and 444. The output of amplify circuits 442 and 444 are provided to RF combiners 404 and 412.

Receive test band signals generated at baseband and modulated to the RF carrier at the respective frequencies F1 and F2 are generated from blocks 402 and 410, respectively and provided to RF combiners 404 and 412. Next, the output of RF combiners 404 and 412 are provided to amplify circuits 406 and 416, which are then provided transmitter 1, 408, and transmitter 2, 418.

Figure 5:
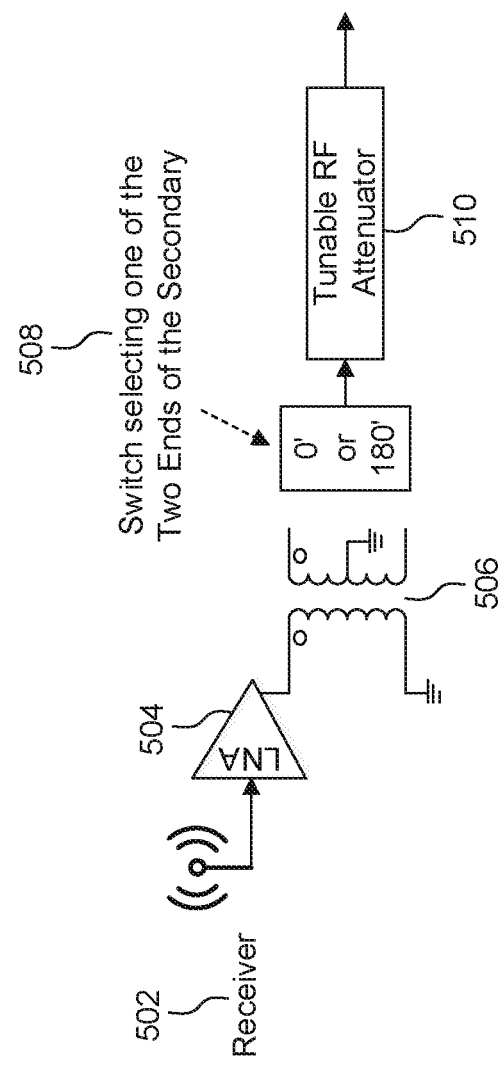
FIG. 5 illustrates a receiver including a radio frequency balun and tunable radio frequency attenuator for performing real multiplication in accordance with an embodiment.

Referring now to FIG. 5, a configuration for real multiplication (adjusting relative magnitude in different filter taps). As shown, receiver 502 is couple to entrance LNA 504, which is coupled to transformer 506, which is an RF Balun. Transformer 506 includes a switch 508 for selecting one of the two ends of the secondary winding and provide the output to tuneable RF attenuator 510. Thus, transformer 506 is responsible for changing the sign and tunable attenuator 510 is responsible for changing of magnitude.

Figure 6:
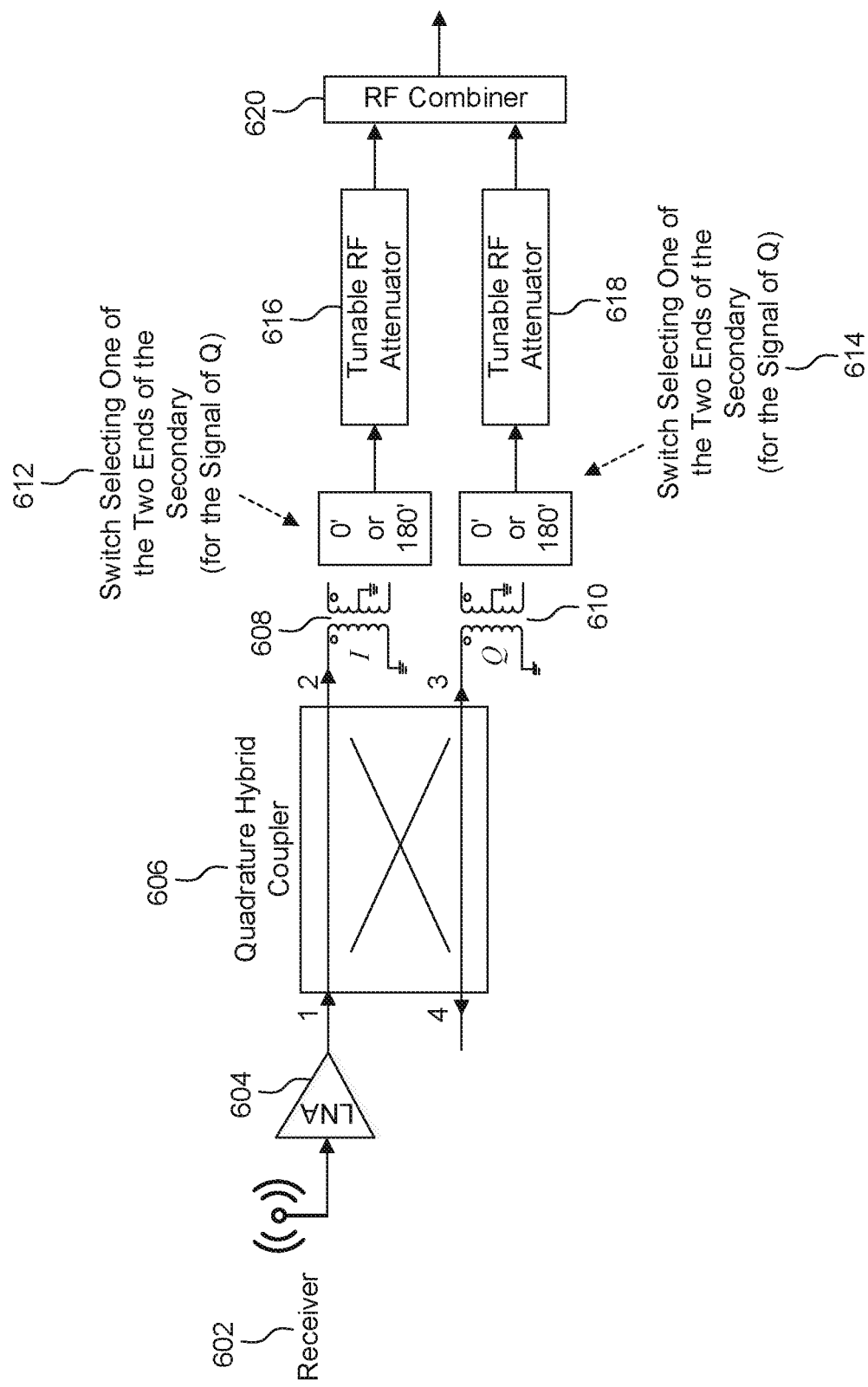
FIG. 6 illustrates a receiver that enables complex multiplication in accordance with an embodiment.

FIG. 6 shows a configuration for complex multiplication (adjusting relative magnitude/phase in different filter taps). Receiver 602 is coupled to low noise amplifier (LNA) 604 which is coupled to quadrature hybrid coupler 606. Quadrature hybrid coupler 606 is responsible for generating two versions of the input signal (point 1) with a relative phase shift of 90° (points 3 and 4). Each transformer (an RF Balun) 608 and 610 is responsible for changing the sign of its corresponding component via switch 612 and switch 614, and each tunable attenuator 616 and 618 is responsible for changing the magnitude of its corresponding component and providing the output to RF combiner 620. The configuration of FIG. 6 is for complex multiplication and can be replaced with commercially available complex multipliers such as a vector modulator, or concatenation of a tunable phase shifter and a tunable attenuator.

Figure 7:
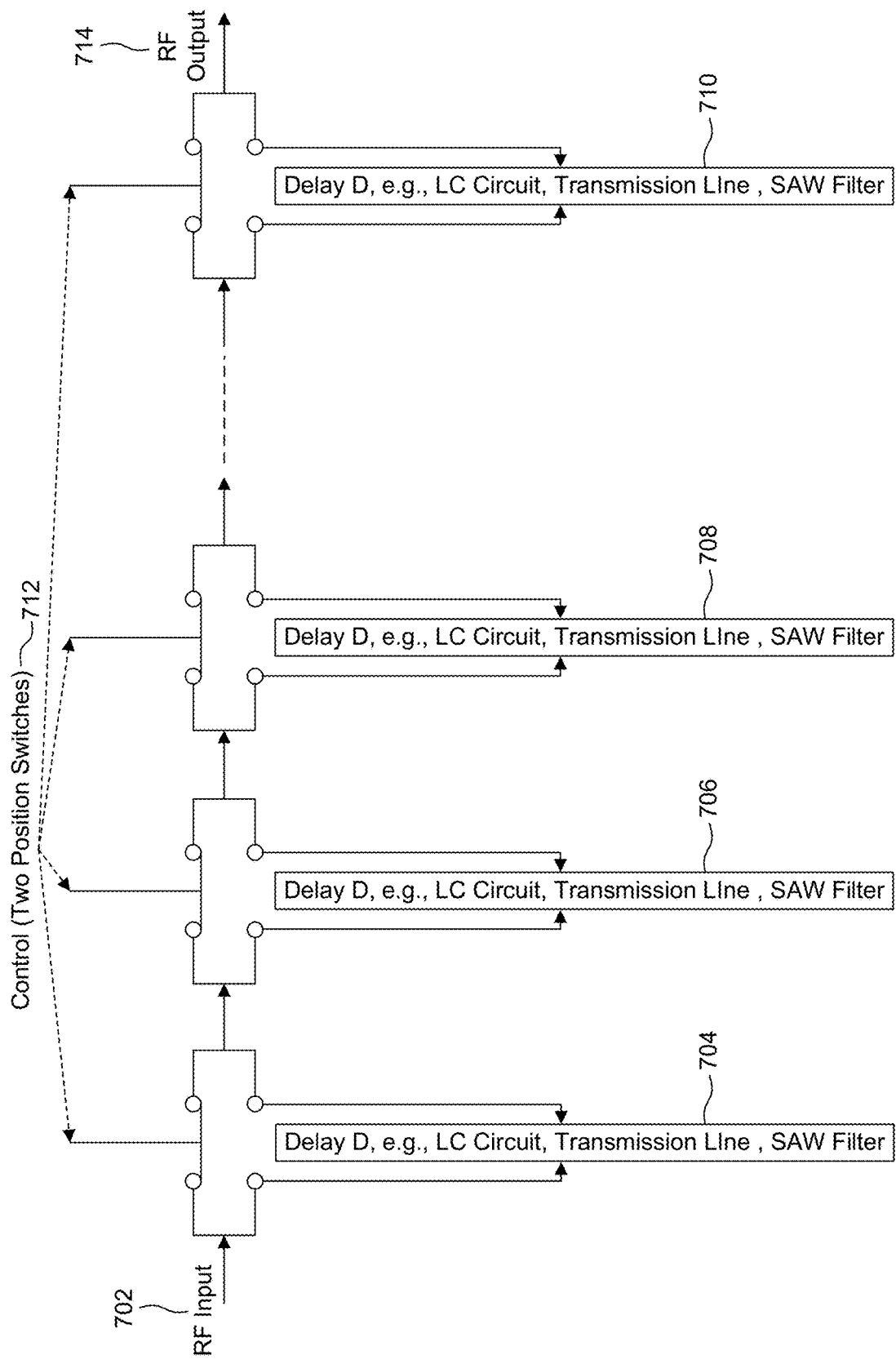
FIG. 7 illustrates tunable delay element in accordance with an embodiment.

FIG. 7 illustrates a tunable delay element capable of generating relative delays from zero (very small) all the way to $D(2^{n+1}-1)$ in integer multiples of D. As shown, an RF input 702 is received by delays 704, 706, 708 and 710, which are controlled with two position switches 712 to provide RF output 714.

FIGS. 8, 9, 10, and 11 show some examples for the implementation of RF beamforming filter at the receiver side.

Figure 8:
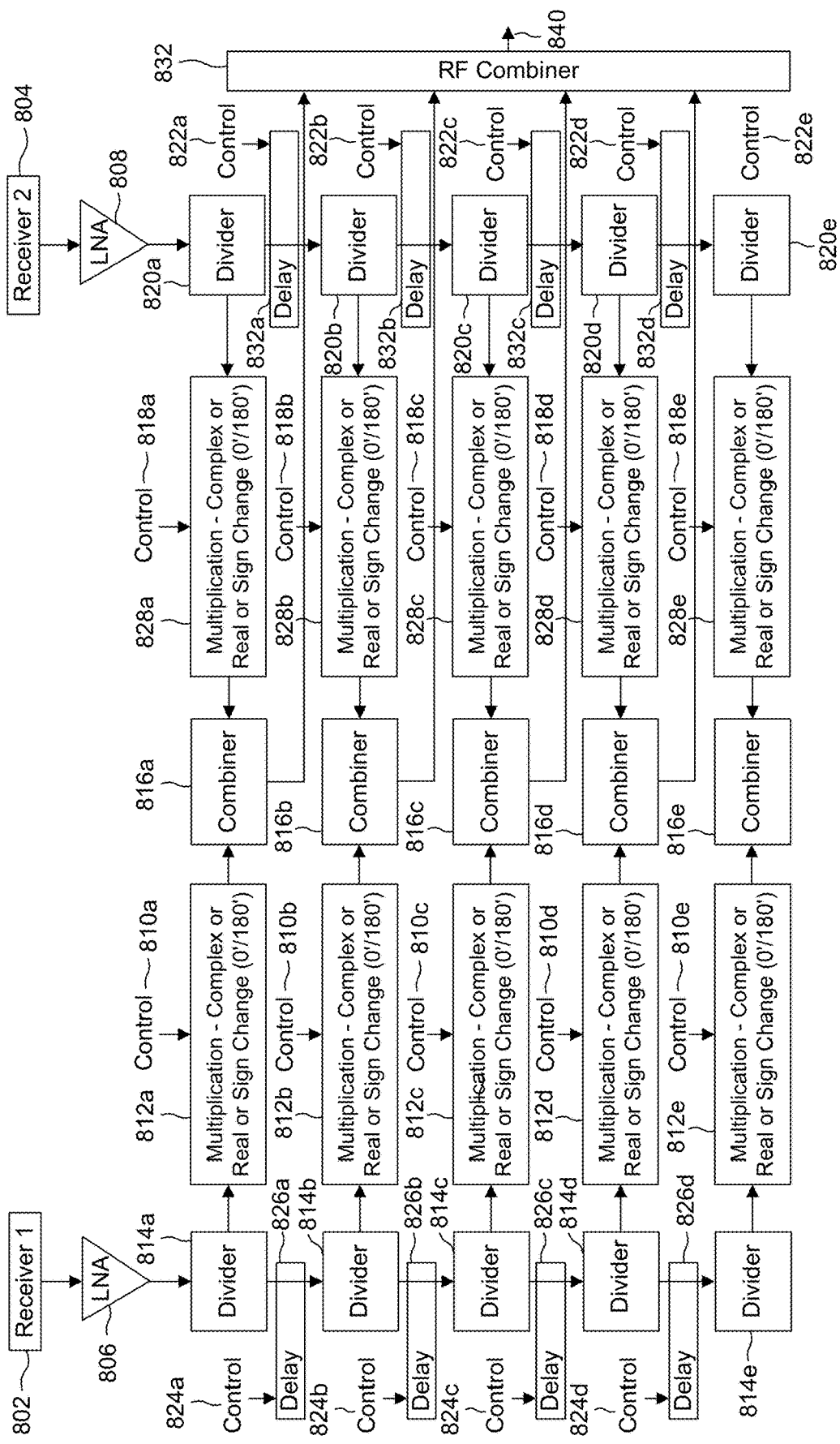
FIG. 8 illustrates a receiver implementation of a beamforming filtering in accordance with an embodiment.

Referring now to FIG. 8, receiver 1, 802 and receiver 2, 804 are coupled to low noise amplifiers (LNAs) 806 and 808, respectively. The output of LNAs 806 and 808 are coupled to dividers 814a-814e and dividers 820a-820e. Each of dividers 814 is separated by delays 826a-826d. Each of dividers 820 is separated by delays 832a-832d. Each delay is controlled by a respective control 824a-824d and 822a-822d.

The outputs of dividers 814a-814e are provided to multipliers 812a-812e. Likewise, the outputs of dividers 820a-820e are provided to multipliers 828a-828e. Each of multipliers 812a-812e is controlled by control signals 810a-810e. Likewise, each of multipliers 828a-828e is controlled by control signals 818a-818e. The outputs of each of multipliers 812a-812e and 828a-828e are provided to combiners 816a-816e. The outputs of each of combiner 816a-816e are each provided to RF combiner 832, which provides output 840.

Figure 9:
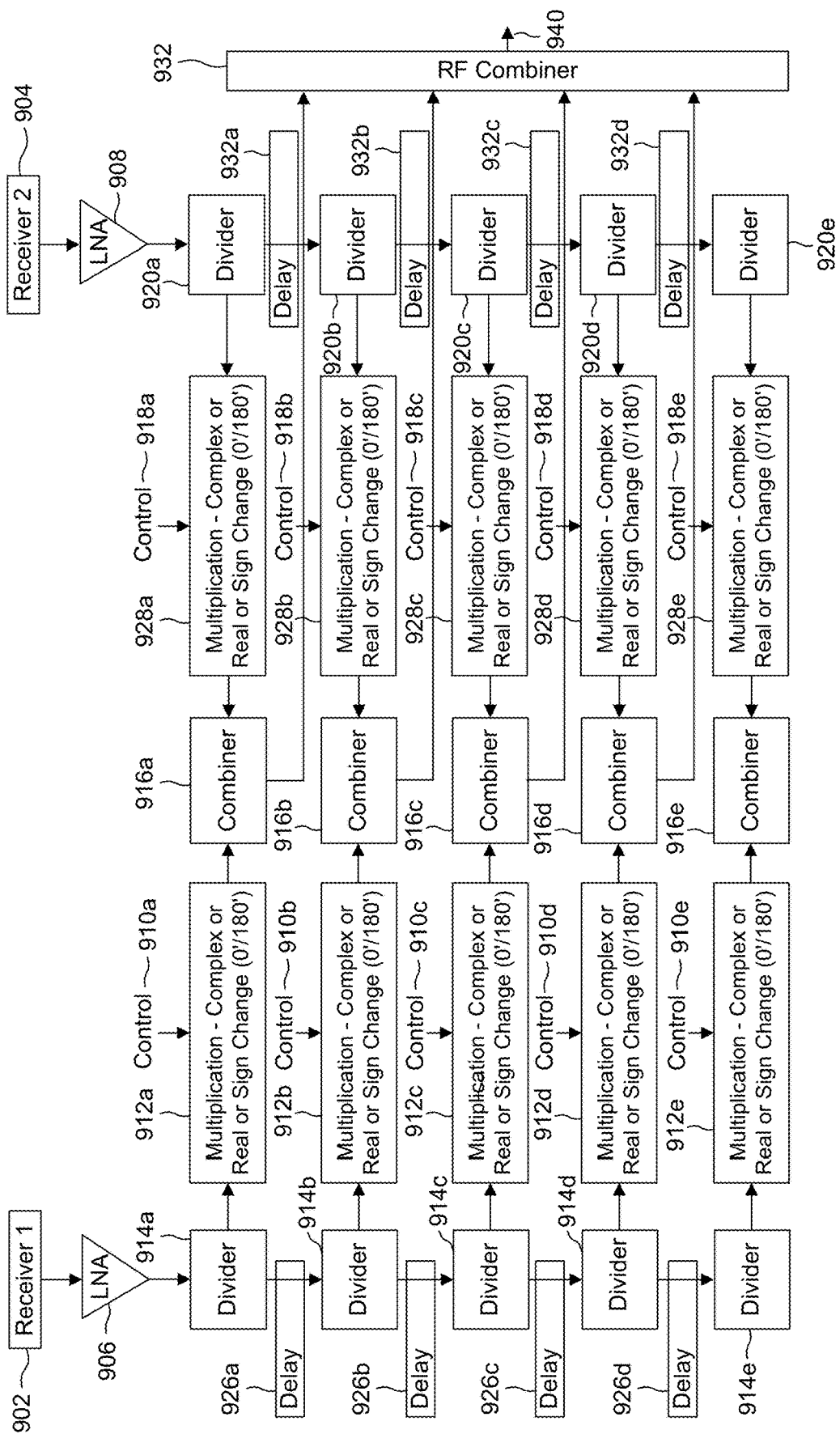
FIG. 9 illustrates a receiver implementation of a RF beamforming filter in accordance with an embodiment.

Referring now to FIG. 9, receiver 1 902 and receiver 2 904 are coupled to LNAs 906 and 908, respectively. The output of LNAs 906 and 908 are coupled to dividers 914a-914e and dividers 920a-920e. Each of dividers 914 is separated by delays 926a-926d. Each of dividers 920a-d is separated by delays 932a-932d. Unlike FIG. 8, there are no control signals coupled to the dividers.

The outputs of dividers 914a-914e are provided to multipliers 912a-912e. Likewise, the outputs of dividers 920a-920e are provided to multipliers 928a-928e. Each of multipliers 912a-912e is controlled by control signals 910a-910e. Likewise, each of multipliers 928a-928e is controlled by control signals 918a-918e. The outputs of each of multipliers 912a-912e and 928a-928e are provided to combiners 916a-916e. The outputs of each of combiner 916a-916e are each provided to RF combiner 932, which provides output 940.

Figure 10:
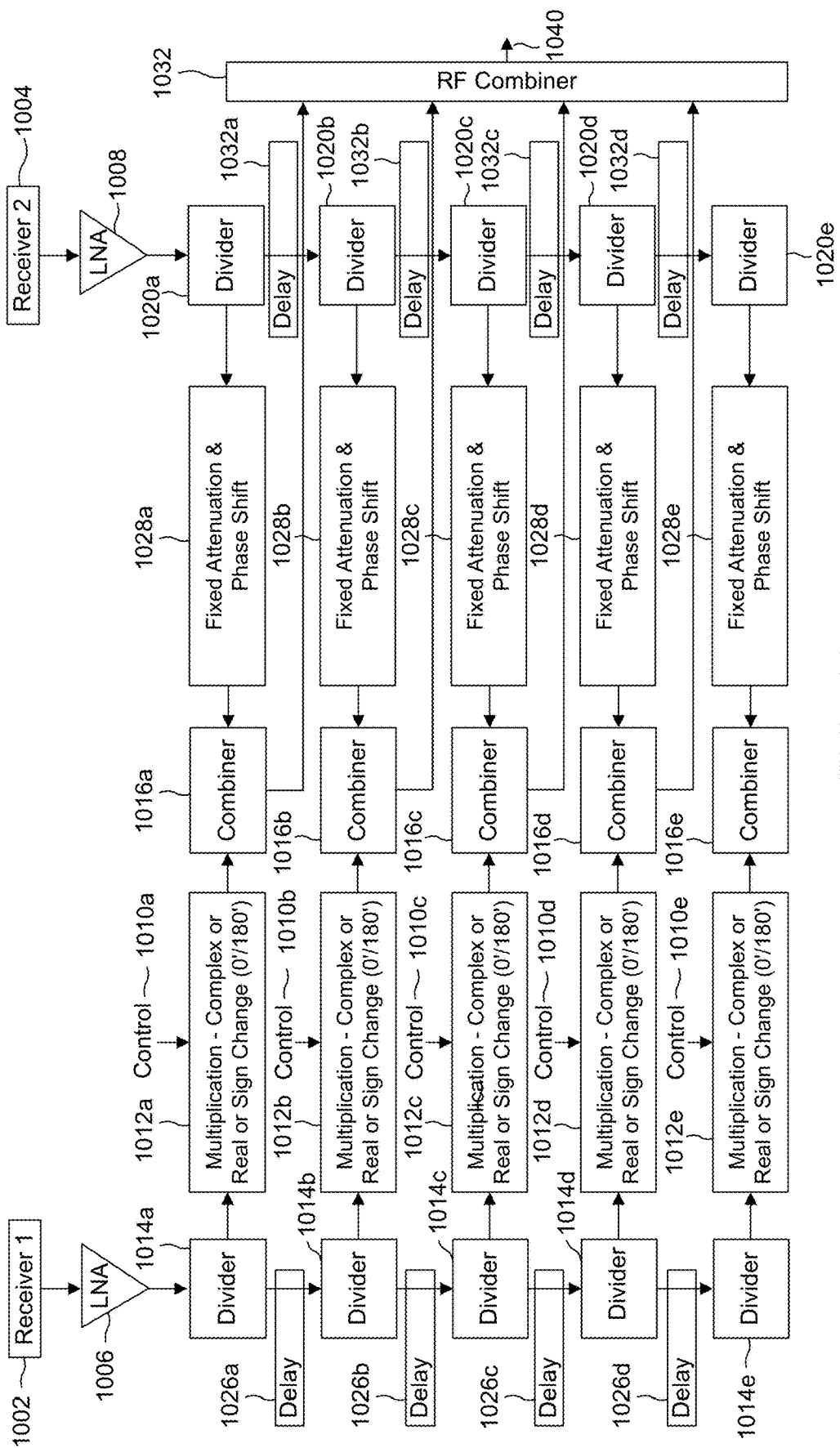
FIG. 10 illustrates another receiver implementation of a RF beamforming filter in accordance with an embodiment.

Referring now to FIG. 10, receiver 1, 1002 and receiver 2, 1004 are coupled to LNAs 1006 and 1008, respectively. The output of LNAs 1006 and 1008 are coupled to dividers 1014a-1014e and dividers 1020a-1020e. Each of dividers 1014a-1014e is separated by delays 1026a-1026d. Each of dividers 1020a-1020e is separated by delays 1032a-1032d. Unlike FIG. 8, there are no control signals coupled to the dividers.

The outputs of dividers 1014a-1014e are provided to multipliers 1012a-1012e. Likewise, the outputs of dividers 1020a-1020e are provided to fixed attenuation and phase shift blocks 1028a-1028e. Each of multipliers 1012a-1012e is controlled by control signals 1010a-1010e. The outputs of each of multipliers 1012a-1012e and fixed attenuation and phase shift blocks 1028a-1028e are provided to combiners 1016a-1016e. The outputs of each combiner 1016a-1016e are each provided to RF combiner 1032, which provides output 1040.

Figure 11:
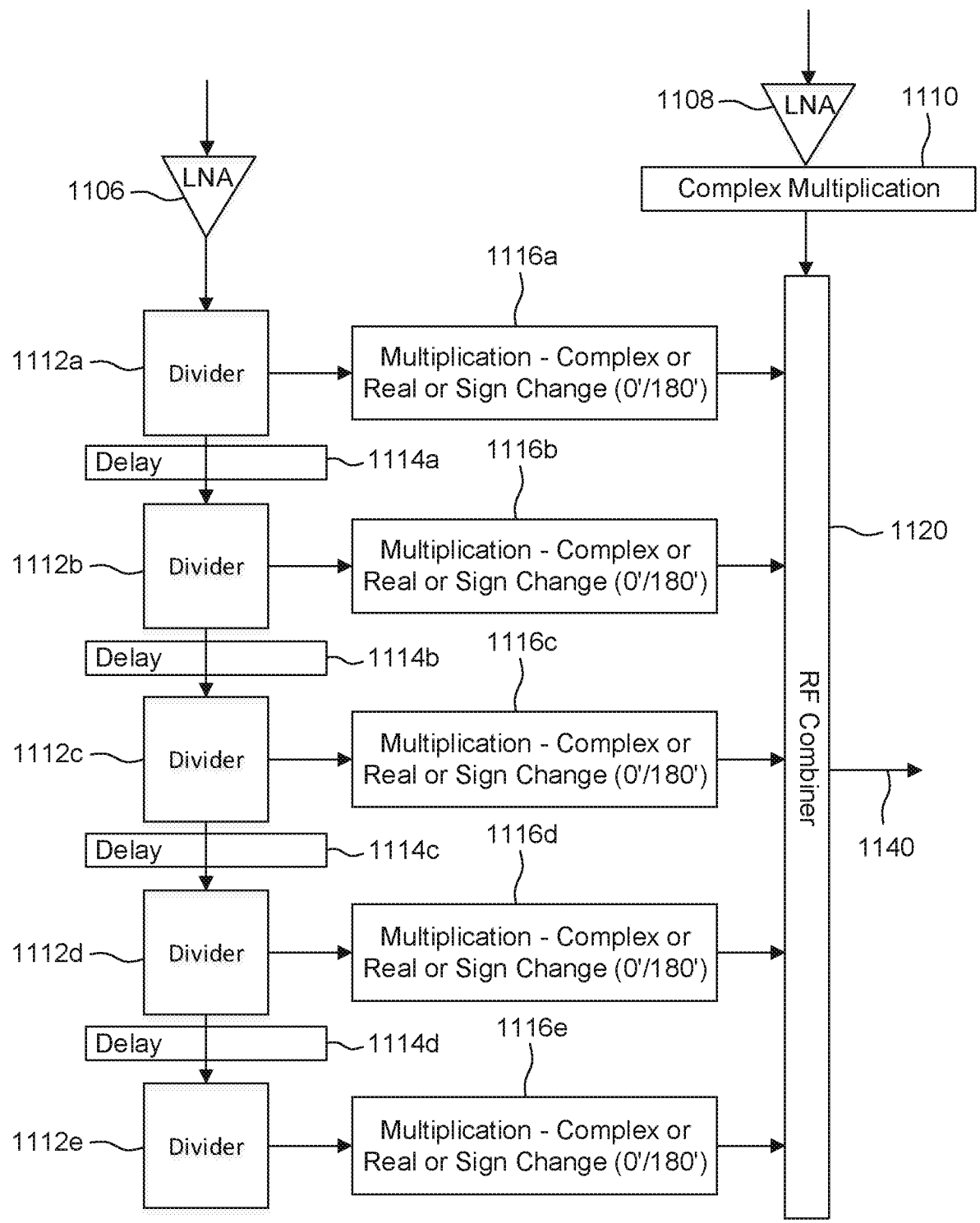
FIG. 11 illustrates another implementation of RF beamforming filter in accordance with an embodiment.

Referring now to FIG. 11, shown are LNAs 1106 and 1108 receiving signals from receivers (not shown). LNA 1108 is coupled to complex multiplication block 1110 and RF combiner 1120. LNA 1106 is shown coupled to dividers 1112a-1112e. Each of dividers 1112a-1112e is separated by delays 1114a-1114d. Each divider 1112a-1112e is also coupled to a respective multiplication block that performs complex or real or sign changes from 0°/180°.

Figure 12:
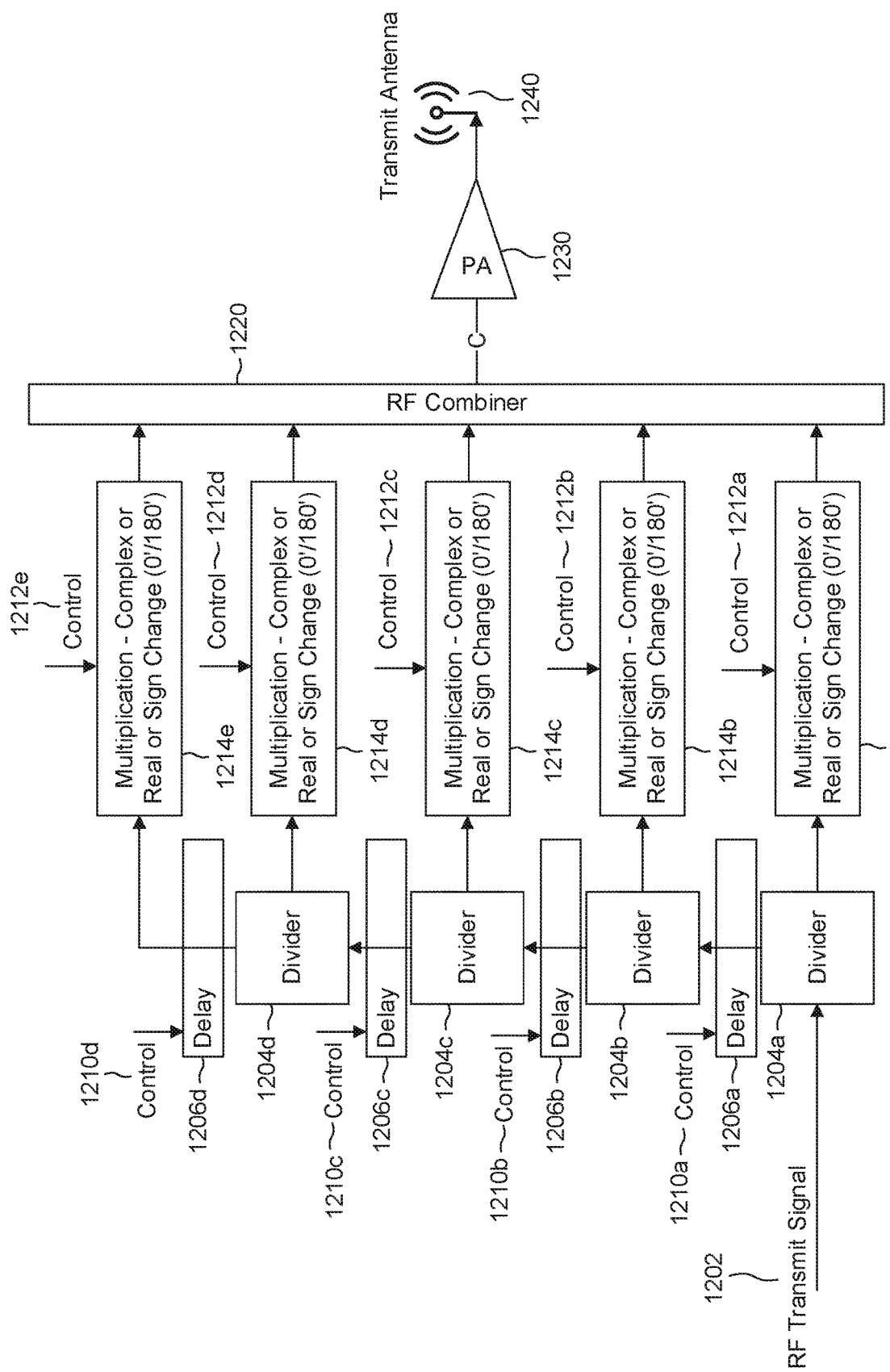
FIG. 12 illustrates a transmitter implementation of an RF beamforming filter in accordance with an embodiment.

Referring now to FIG. 12, an example of an implementation of an RF beamforming filter from the transmitter side is illustrated. An RF transmit signal 1202 is received at divider 1204a. Dividers 1204a-1204d are shown separated by delay blocks 1206a-1206d, respectively. Each of delay blocks 1206a-1206d are provided with control signals 1010a-1010d respectively. The outputs of dividers 1204a-1204d are provided to respective multiplication blocks that perform complex or real or sign changes from 0°/180° 1214a-1214d, and the output of delay 1206d is also provided to a multiplication block that performs complex or real or sign changes from 0°/180° 1214e. Each of multiplication blocks 1214a-e is coupled to a control signal 1212a-3. Each of the outputs of multiplication block 1214a-e are provided to RF combiner 1220, which is coupled to amplifier 1230 and a transmit antenna 1240.

Figure 13:
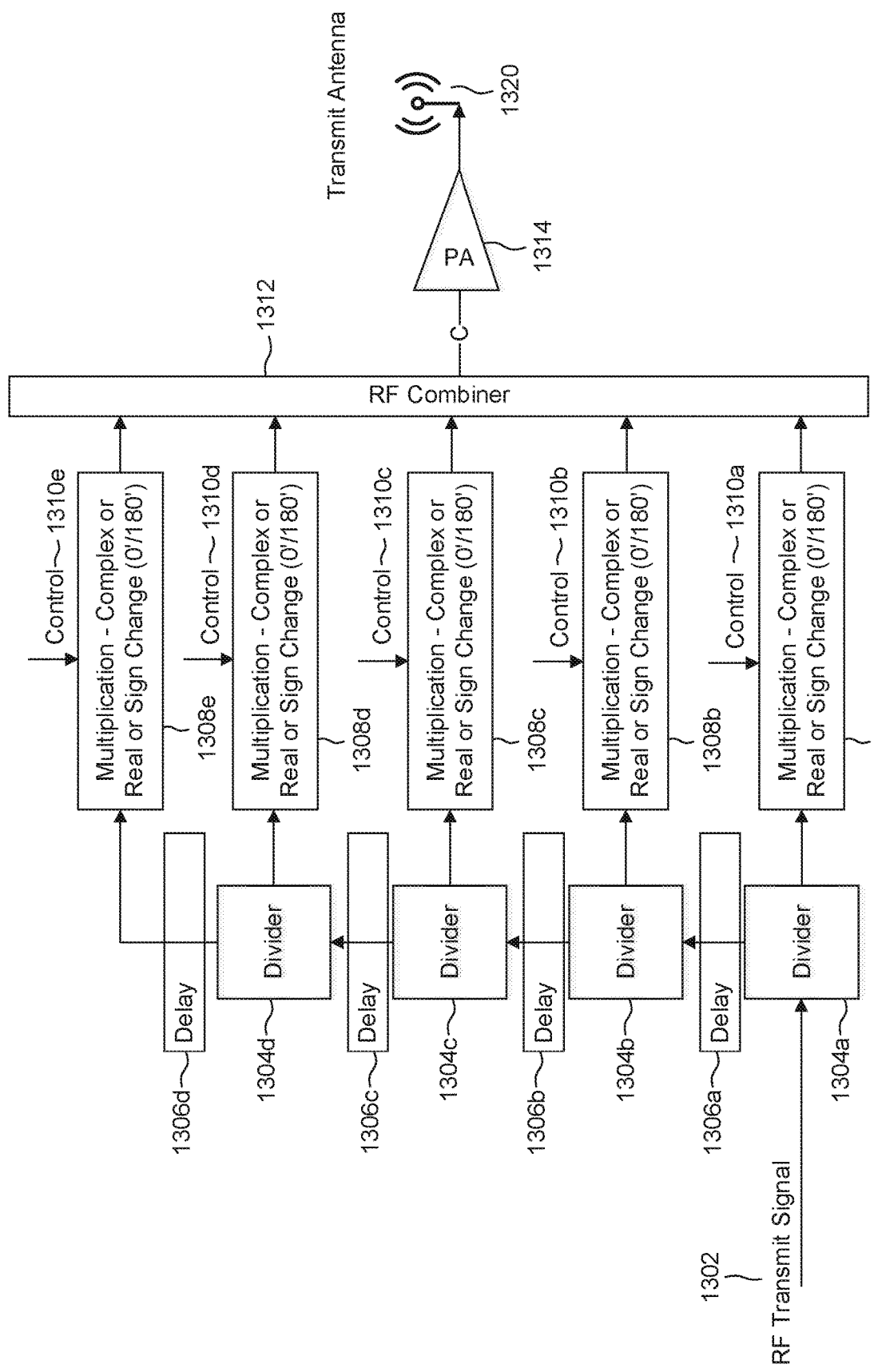
FIG. 13 illustrates another transmitter implementation of an RF beamforming filter in accordance with an embodiment.

FIG. 13 illustrates another implementation of RF beamforming filter at the transmitter side. An RF transmit signal 1302 is received at divider 1304a. Dividers 1304a-1304d are shown separated by delay blocks 1306a-1306d, respectively. Each of delay blocks 1306a-1306d, unlike FIG. 12, no control signals are coupled to the delays. The outputs of dividers 1304a-1304d are provided to respective multiplication blocks 1308a-d that perform complex or real or sign changes from 0°/180° 1314a-1314d, and the output of delay 1306d is also provided to a multiplication block 1308e that performs complex or real or sign changes from 0°/180° 1314e. Each of multiplication blocks 1308a-e is coupled to a control signal 1310a-e. Each of the outputs of multiplication block 1308a-e are provided to RF combiner 1312, which is coupled to amplifier 1314 and a transmit antenna 1320.

Figure 14:
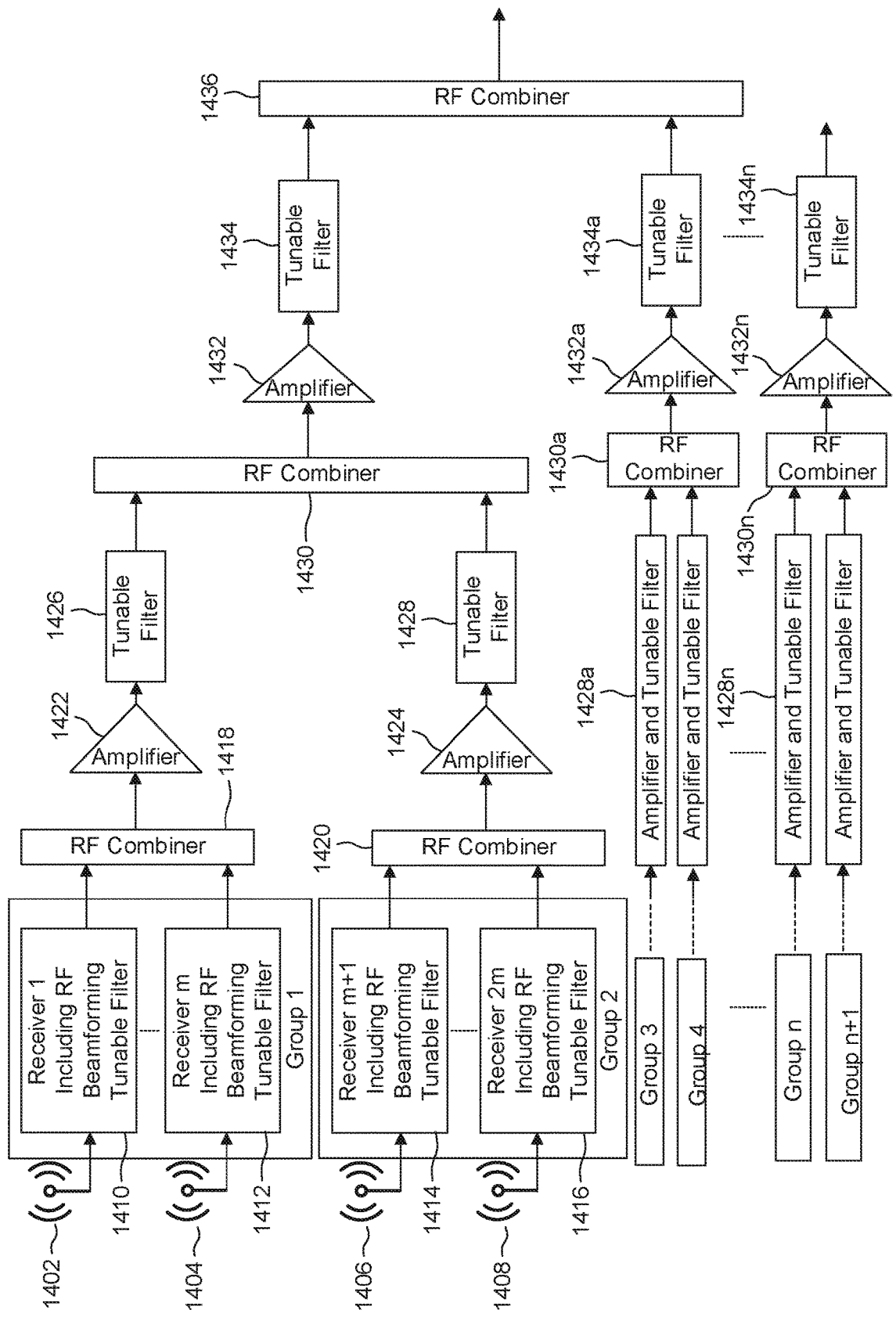
FIG. 14 illustrates a hierarchical receiver implementation of an RF beamforming filter in accordance with an embodiment.

FIG. 14 illustrates an example for the implementation of RF beamforming filter at the receiver side in a hierarchical structure. As shown, receivers 1-m identified by blocks 1410 and 1412 are coupled to receive antennas 1402 and 1404 and identified as "Group 1". Receivers m+1 and 2 m, identified by blocks 1414 and 1416 are coupled to receive antennas 1406 and 1408 and identified as "Group 2". Similar grouped receives are also illustrated as group 3, group 4, group n and group n+1.

Receivers in Group 1 output to RF combiner 1418 and receivers in Group 2 output to RF combiner 1420. RF combiner 1418 is coupled to amplifier 1422, tunable filter 1426 and RF combiner 1430. Likewise RF combiner 1420 is coupled to amplifier 1424, tunable filter 1428 and RF combiner 1430. RF combiner 1430 is coupled to amplifier 1432, tunable filter 1434 and RF combiner 1436, which provides an output.

Other grouped receivers such as group 3 and 4 and group n and n+1 can also be added to the structure such that tunable filters 1428a-1428n, RF combiners 1430a-1430n, amplifiers 1432a-1432n and tunable filters 1434a-1434n can each be output to an RF combiner as will be appreciated by one of skill in the art with the benefit of this disclosure.

Figure 15:
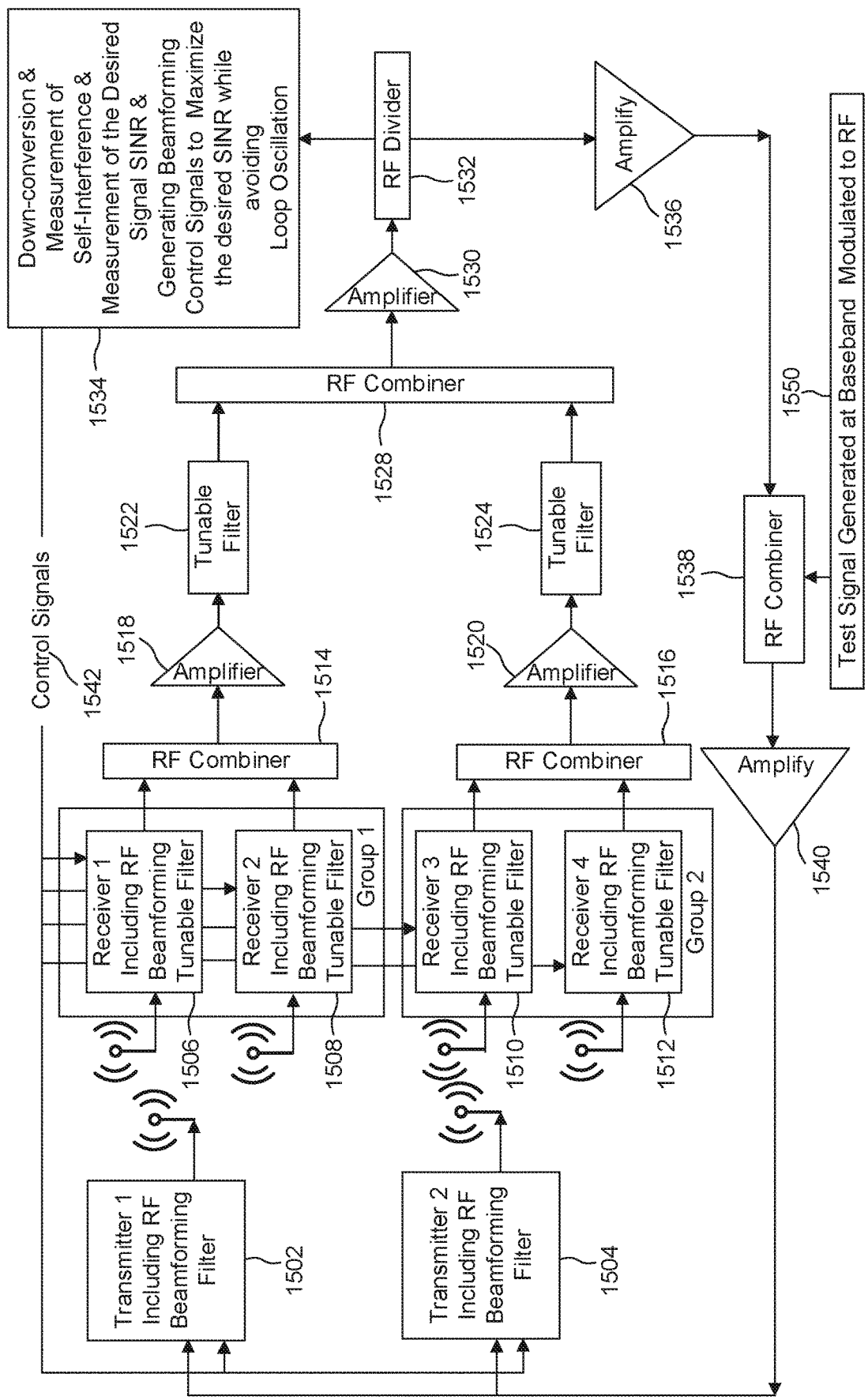
FIG. 15 illustrates a symmetrical antenna structures with reduced coupling between transmitter antenna and each of the two receive antennas in accordance with an embodiment.

FIG. 15 shows another example, for the implementation of RF beamforming filter at the receiver side in a hierarchical structure. As shown, a transmitter 1 including RF beamforming filter 1502 and a transmitter 2 including RF beamforming filter 1504 operate to relay signals received via Receivers 1-4 1506, 1508, 1510 and 1512 separated into two groups, group 1 and group 2. Receivers 1506 and 1508 are coupled to RF combiner 1514, and receivers 1510 and 1512 are coupled to RF combiner 1516. RF combiner 1514 is coupled to amplifier 1518 and RF combiner 1516 is coupled to amplifier 1520. The output of amplifiers 1518 and 1520 are respectively coupled to tunable filters 1522 and 5244, and the outputs of the tunable filters is combined at RF combiner 1528. RF combiner 1528 is coupled to amplifier 1530, which is coupled to RF divider 1532. RF divider 1532 provides signals to down-conversion and measurement block 1534 that provides down conversion and measurement of self-interference and measurement of the desired signal SINR and generates beamforming control signals to maximize the desired SINR while avoiding loop oscillation. The control signals 1542 generated by down-conversion and measurement block 1534 are provided to transmitters 1502 and 1504 for transmission.

Figure 16:
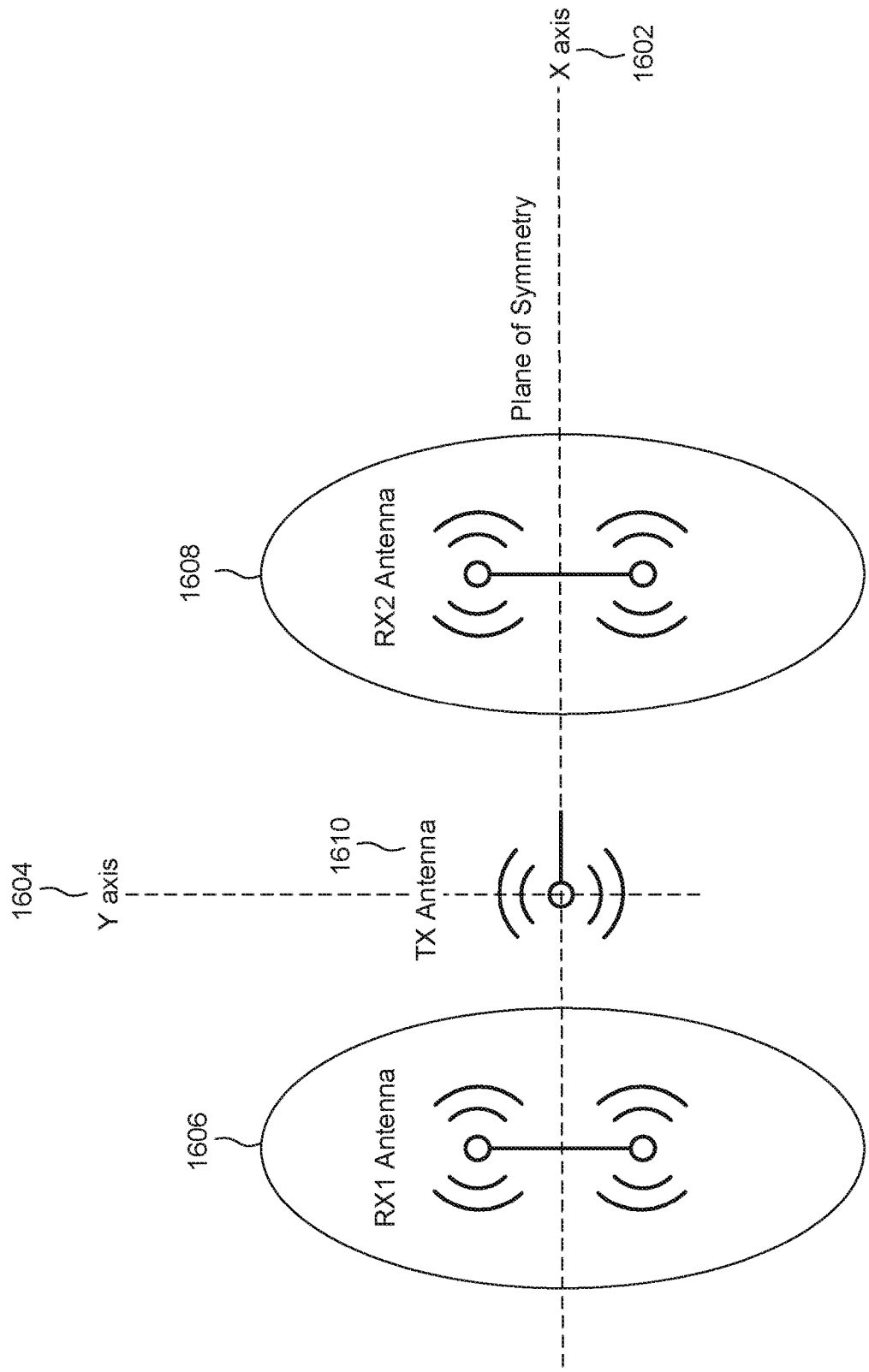
FIG. 16 illustrates a symmetrical antenna structure with reduced coupling between transmitter antenna and each of two receive antennas in accordance with an embodiment.
Figure 17:
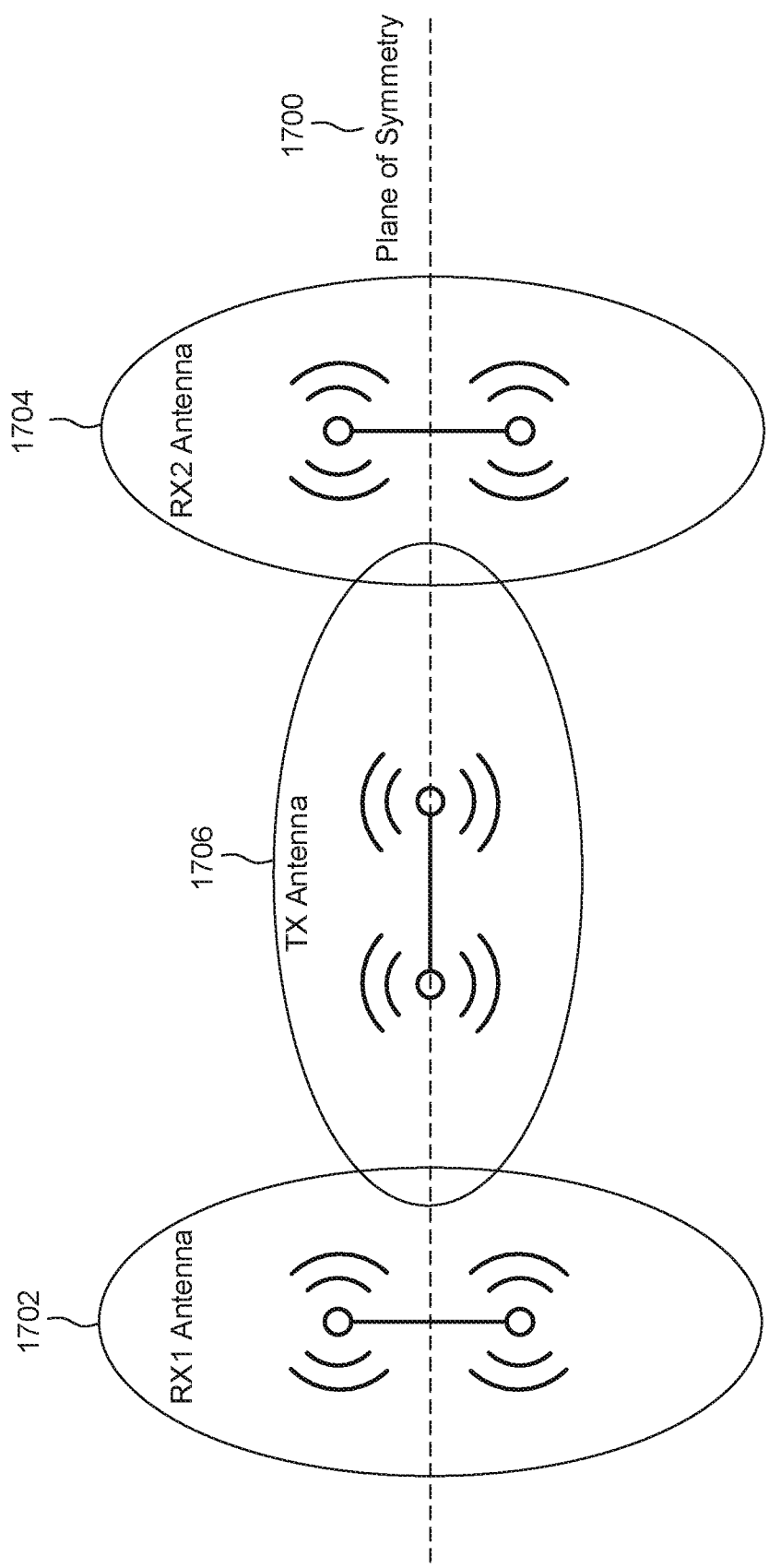
FIG. 17 illustrates an alternate version of a symmetrical antenna structure with reduced coupling between transmitter antenna and each of two receive antennas in accordance with an embodiment.

FIG. 16 illustrates an example of a symmetrical antenna structure with reduced coupling between transmitter antenna and each of the two receive antennas. As shown, an X axis 1602 and a Y axis 1604 identify the location of receive antenna 1606 and 1608 with respect to transmit antenna 1610. FIG. 17 illustrates another example of a symmetrical antenna structure showing plane of symmetry 1700, receive antenna 1702 and receive antenna 1704 and transmit antenna 1706 between the receive antennas 1702 and 1704. The configurations shown in FIGS. 16 and 17 can be extended horizontally (along the X axis) to include more antennas. FIG. 16 illustrates that the configuration can be also extended vertically (along the Y axis) by stacking several layers of receive antenna on either sides of a main layer, a main layer being the one that includes the transmit antenna in its center, and extends symmetrically by placing receive antennas on the two sides of the transmit antenna along the X axis. Receive antennas can be placed symmetrically around the transmit antenna, 1610 or 1706, with transmit antenna at the center of the array. The antenna at the center (transmit antenna) will have a very small coupling to the receive antenna placed on its left and right sides along the main layer. In vertical extension, receive antennas in layers above and below the main layer can be slightly rotated to reduce the coupling to the transmit antenna. Individual antennas in FIGS. 16 and 17 can be implemented as patch structures.

Figure 18:
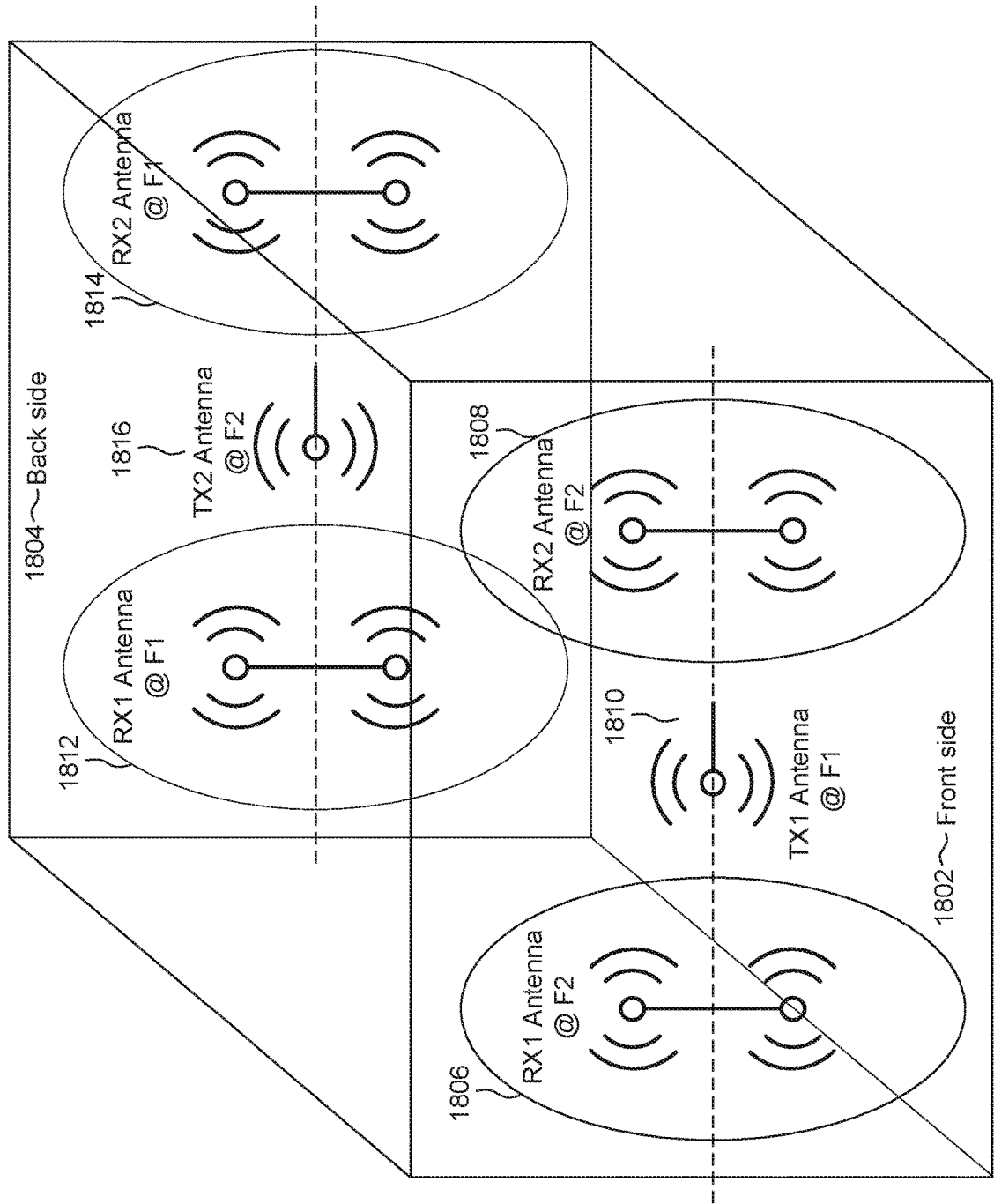
FIG. 18 illustrates antenna structures with frequency division duplex (FDD) relaying in which the antenna structures are implemented on the opposite sides of the relay box in accordance with an embodiment.

Referring now to FIG. 18, an example for FDD relaying is illustrated, wherein antenna structures are implemented on the opposite sides of the relay box. Thus, front side 1802 and back side 1804 show symmetric antenna structures with receive antennas 1806 and 1808 placed on either side of transmit antenna 1810, and receive antennas 1812 and 1814 on other side of transmit antenna 1816. In FIG. 18, receive antennas 1812 and 1814 receive at a first frequency, and receive antennas 1806 and 1808 receive at a second frequency. Transmit antenna 1, 1810 transmits at the first frequency, and transmit antenna 2, 1816 transmits at the second frequency.

Figure 19:
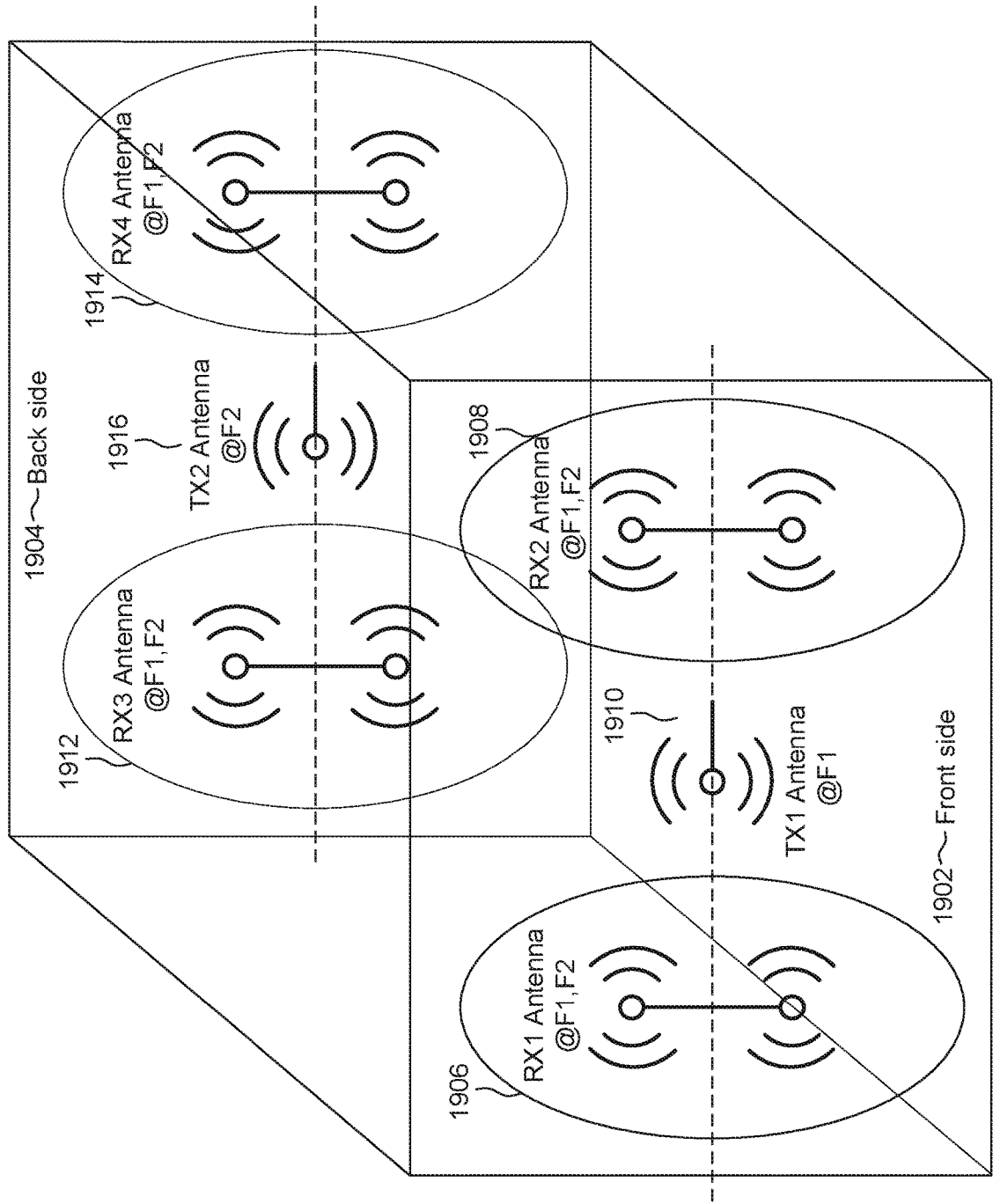
FIG. 19 illustrates an alternate version of antenna structures with frequency division duplex (FDD) relaying in which the antenna structures are implemented on the opposite sides of the relay box in accordance with an embodiment.

FIG. 19 shows another embodiment for FDD relaying, wherein antenna structures are implemented on the opposite sides of the relay box. Like FIG. 18, a front side 1902 holds a transmit/receive structure and a back side 1904 illustrates another transmit/receive structure. Front side structure includes receive antenna 1, 1906 receiving a first and a second frequency, and receive antenna 2, 1908 also receiving at the first and second frequency, and transmit antenna 1 1910 transmitting at the first frequency. Back side structure 1904 includes antenna 3, 1912 receiving at the first and second frequencies and receive antenna 4, 1914 also receiving at the first and second frequencies. Transmit antenna 2, 1916 is shown transmitting at the second frequency.

Figure 20:
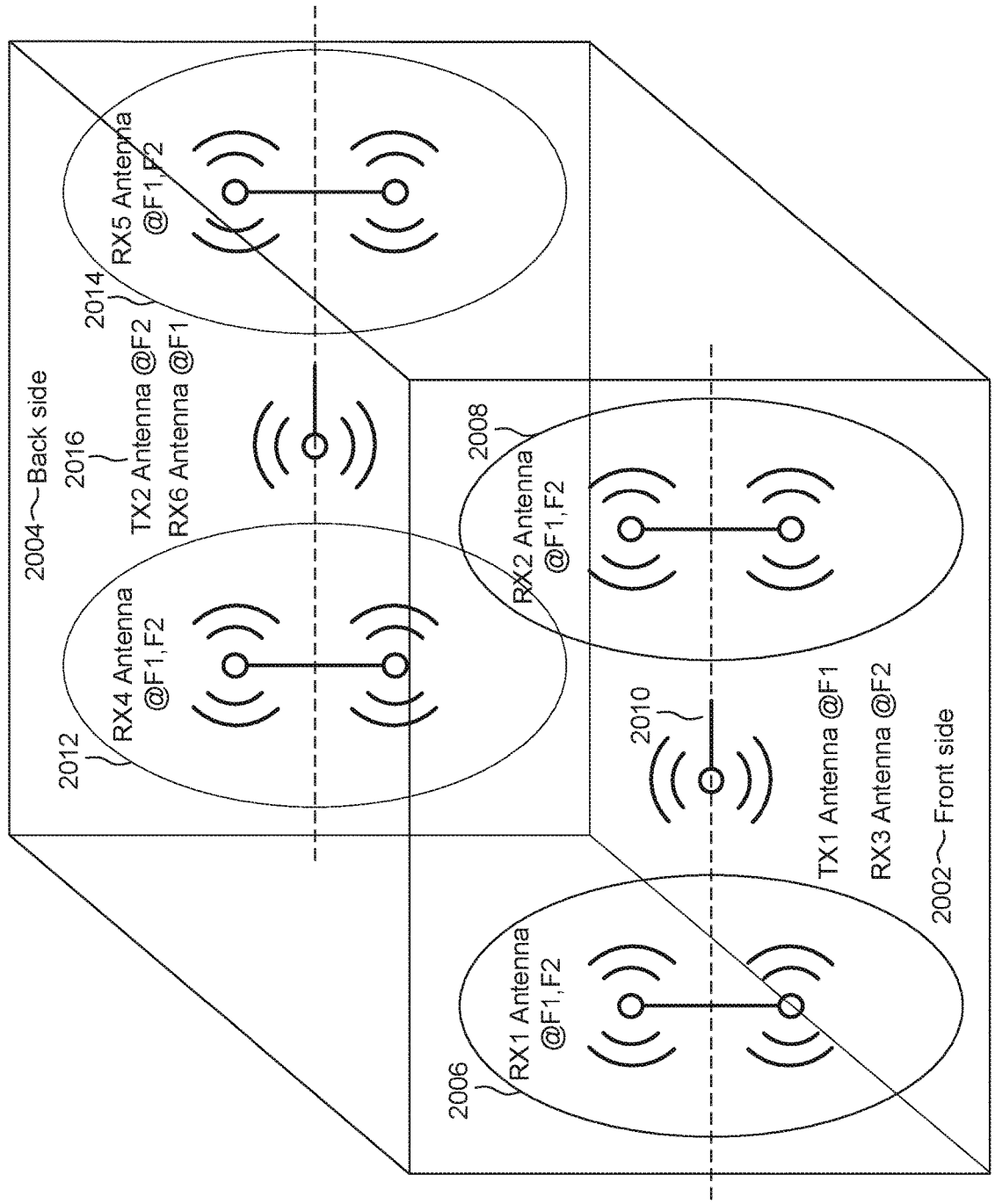
FIG. 20 illustrates another alternate version of antenna structures with frequency division duplex (FDD) relaying in which the antenna structures are implemented on the opposite sides of the relay box in accordance with an embodiment.

FIG. 20 shows another embodiment for FDD relaying, wherein antenna structures are implemented on the opposite sides of the relay box. A front side 2002 holds a transmit/receive structure and a back side 2004 illustrates another transmit/receive structure. Front side structure includes receive antenna 1 2006 receiving a first and a second frequency, and receive antenna 2, 2008 also receiving at the first and second frequency, and transmit 1/receive 3 antenna 2010 transmitting at the first frequency and receiving at the second frequency. Back side structure 2004 includes antenna 4, 2012 receiving at the first and second frequencies and receive antenna 5, 2014 also receiving at the first and second frequencies. Transmit antenna 2/Receive antenna 6 2016 is shown transmitting at the second frequency, and receiving at the first frequency.

Figure 21:
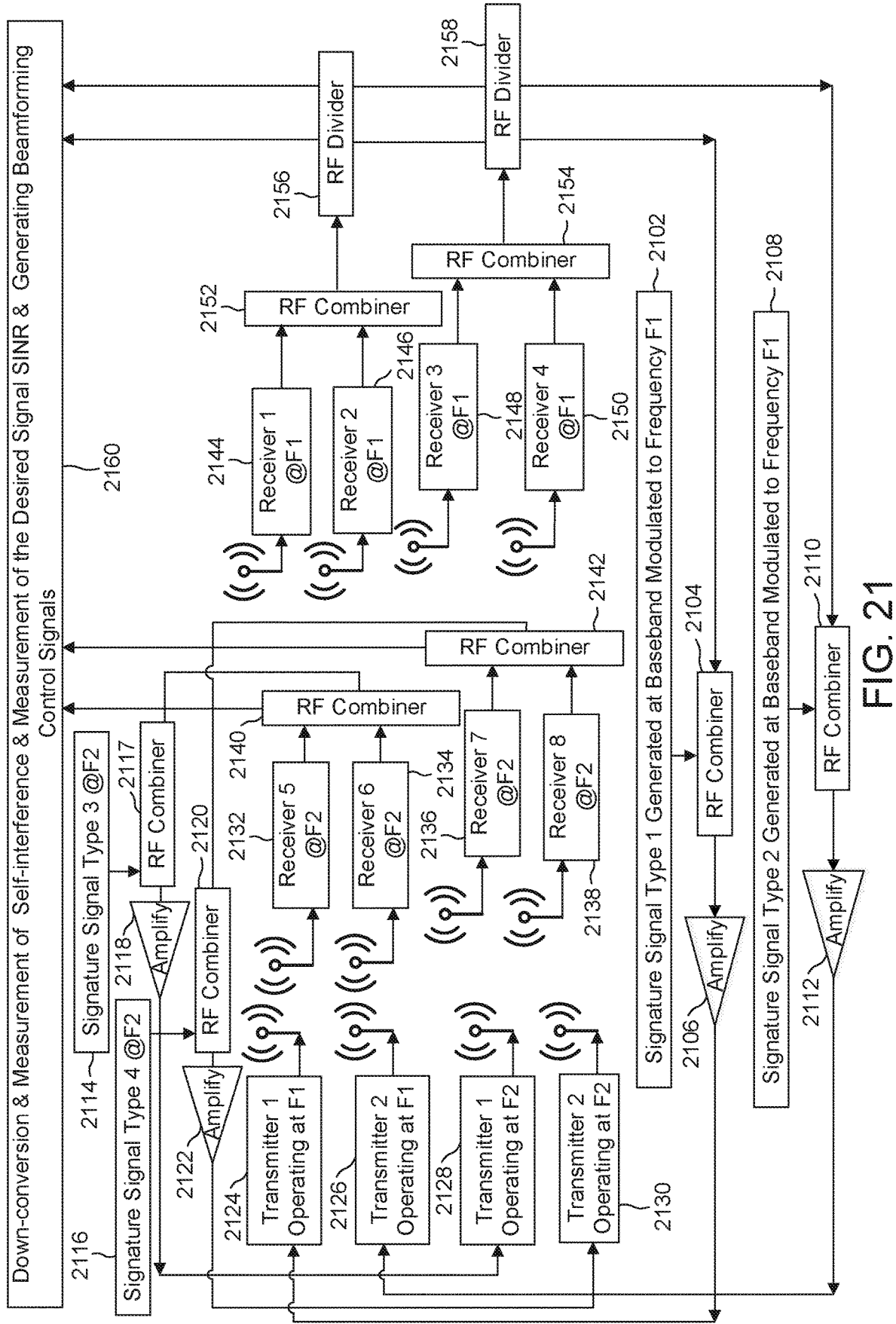
FIG. 21 illustrates a combined receiver and transmitter schematic of a relay structure for relaying multiple-in-multiple-out (MIMO) signals in accordance with an embodiment.

Referring now to FIG. 21 a generalization of the relay structure for relaying MIMO signals is illustrated. As shown, signature signal type 1 generated at baseband modulated to a first frequency 2102 is provided to RF combiner 2104 and followed by amplify 2106. Likewise, signature signal type 2 generated at baseband modulated to a second frequency 2108 is provided to RF combiner 2110 and amplified at 2112.

The outputs of amplifier 2106 is provided to transmitter 1 operating a first frequency 2124, and output of amplifier 2112 is provided to transmitter 2 operating at the first frequency 2126.

Likewise, signature signal type 3 operating at a second frequency 2114 is provided to RF combiner 2117 and amplifier 2118, and signature signal type 4 operating at the second frequency 2116 is provided to RF combiner 2120 and amplifier 2122. Output of amplifier 2122 is provided to transmitter 2 operating at the second frequency 2130, and the output of amplifier 2118 is provided to transmitter 1 operating at the second frequency 2128.

As shown there are eight receivers, identified as receiver 1, 2144, receiver 2, 2146, receiver 3, 2148, receiver 4, 2150, each of which operating at the first frequency; and receiver 5, 2132, receiver 6, 2134, receiver 7, 2136, receiver 8, 2138, each of which operating at the second frequency. Receivers 1 and 2 are coupled to RF combiner 2152; receivers 3 and 4 are coupled to RF combiner 2154; receivers 5 and 6 are coupled to RF combiner 2140; receivers 7 and 8 are coupled to RF combiner 2142.

RF combiners 2152 and 2154 are coupled to RF dividers 2156 and 2158, respectively and the outputs of RF dividers 2156 and 2158 are provided to RF combiners 2104 and 2110 as well as down-conversion and measurement block 2160, which provides down-conversion and measurement of self-interference and measurement of desired SINR and generates beamforming control signals. The outputs of RF combiner 2140 and 2142 also are provided to down-conversion and measurement block 2160 as well as to RF combiners 2120 and 2116, followed by amplifiers 2118 and 2122 and to transmitter 1 operating at the second frequency 2128 and transmitter 2 operating at the second frequency 2130.

Figure 22:
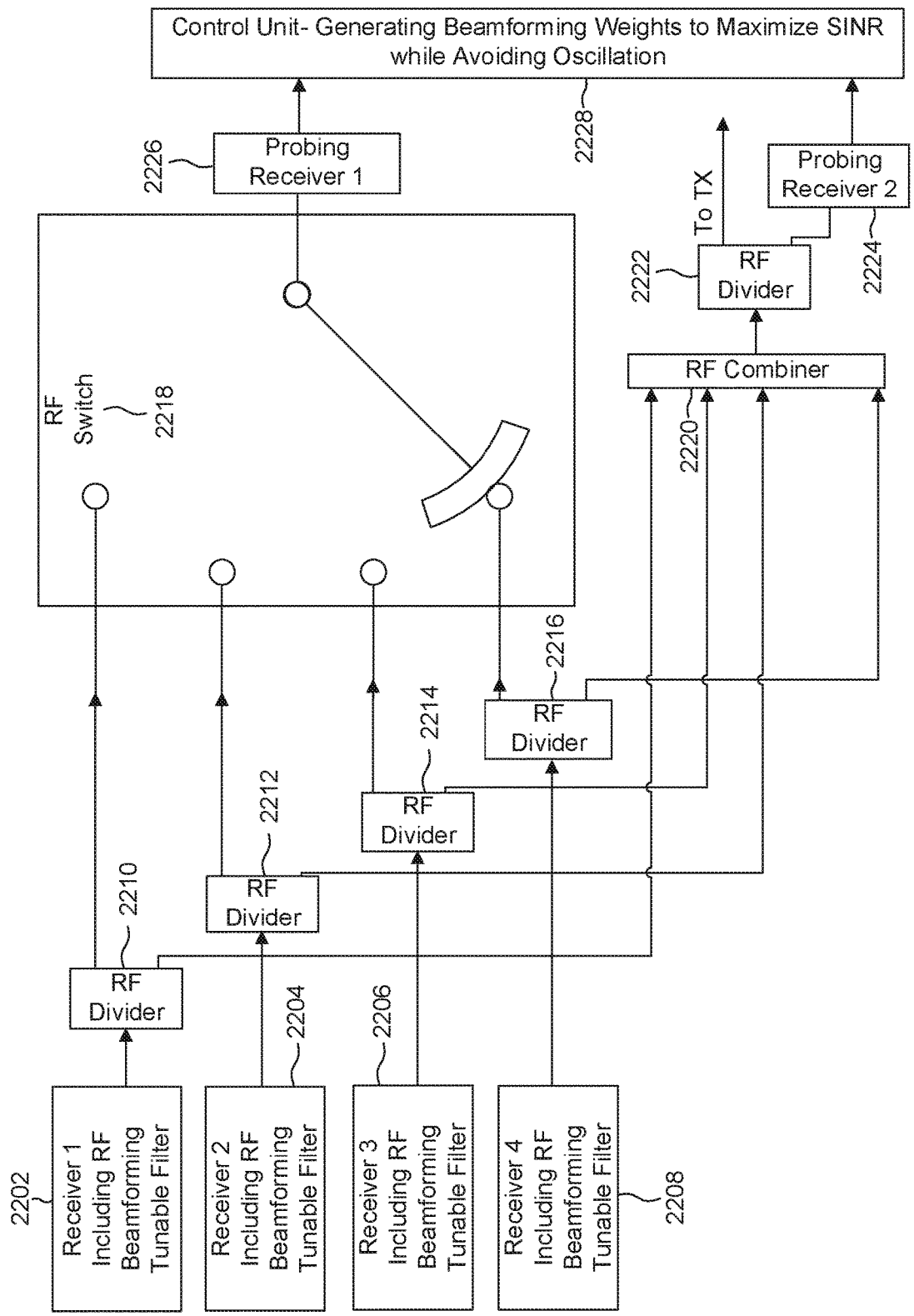
FIG. 22 illustrates a schematic of two auxiliary receivers that are shared in accordance with an embodiment.

FIG. 22 shows an embodiment in which two auxiliary receivers, denoted as "probing receiver 1, 2226" and "probing receiver 2, 2224" are shared for the purpose of probing different received signals.

Specifically, four receivers including RF beamforming and tunable filters 2202, 2204, 2206 and 2208 are shown coupled to RF divers 2210, 2212, 2214, and 2216. The outputs of the RF dividers are provided to an RF switch 2218 and to RF combiner 2220. The output of RF combiner 2220 is provided to 2222.

The output of RF divider is provided to transmitter(s) and to probing receiver 2, 2224. RF switch 2218 is also provided to probing receiver 1 2226. The outputs of both probing receivers 1 and 2 are provided to control unit 2228, which generates beamforming weights to maximize SINR while avoiding oscillation.

Probing receiver 1 2226 alternates among different receive antennas in order to (sequentially in time) update the beamforming data relevant to each of those antennas. Probing receiver 2 2224 measures the combined signal in parallel. This configuration enables maintaining synchronicity in relating the "cause of the change (adjustment in individual receiving filters)" to their corresponding "effects (change in the combined signal)".

Figure 23:
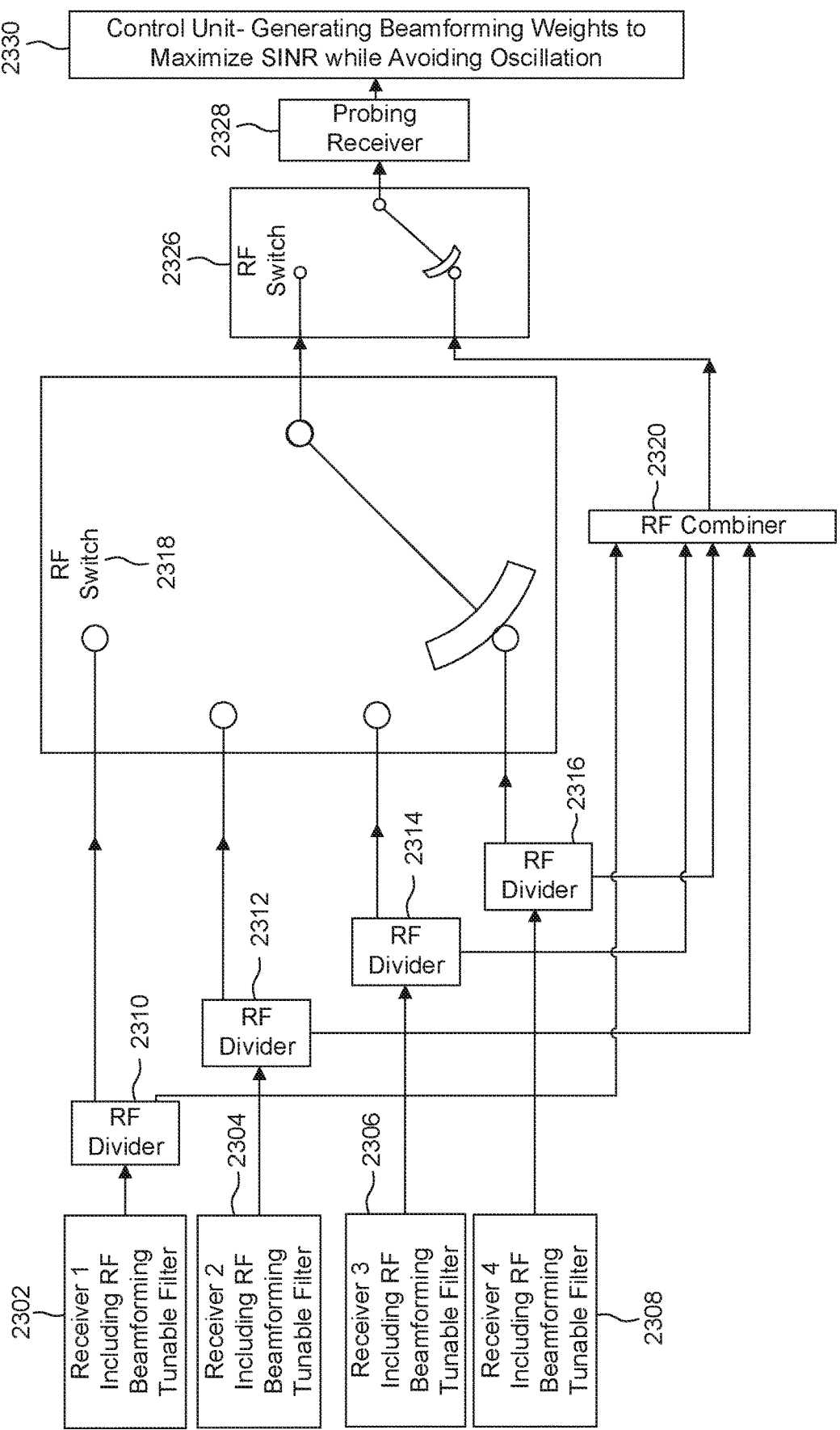
FIG. 23 illustrates a schematic of an auxiliary receiver, denoted as "probing receiver" that is shared in accordance with an embodiment.

FIG. 23 provides an embodiment in which only one auxiliary receiver, denoted as "probing receiver 2328" is shared for the purpose of probing different received signals.

Specifically, four receivers including RF beamforming and tunable filters 2302, 2304, 2306 and 2308 are shown coupled to RF divers 2310, 2312, 2314, and 2316. The outputs of the RF dividers are provided to an RF switch 2318 and to RF combiner 3220. The output of RF combiner 2320 is provided to RF switch 2326, which is also coupled to RF switch 2318.

The output of RF switch 2326 is provided to probing receiver 2328. The output of probing receiver 2328 and then to control unit 2330, which generates beamforming weights to maximize SINR while avoiding oscillation.

Figure 24:
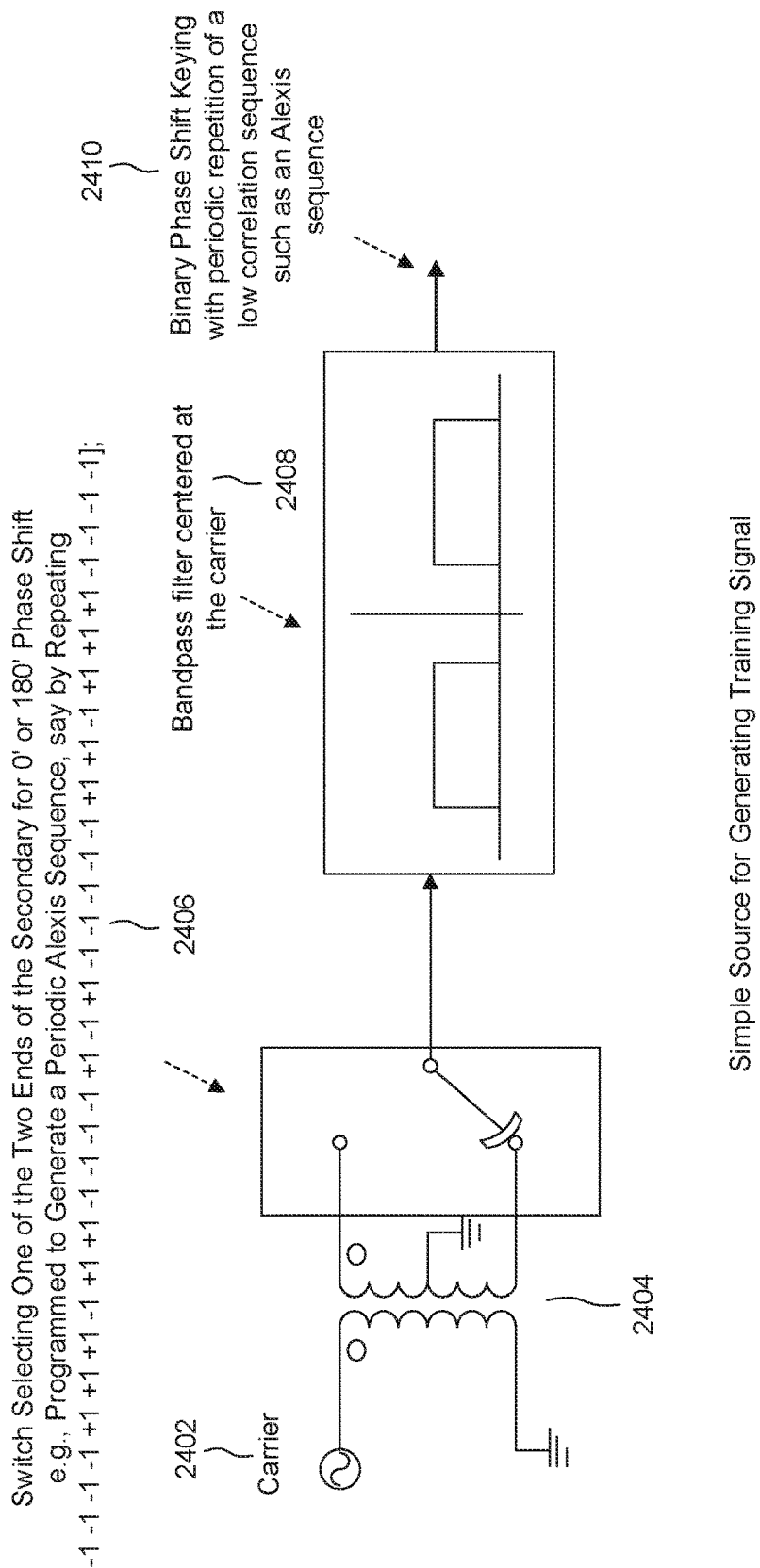
FIG. 24 illustrates a schematic of a training signal generator in accordance with an embodiment.

FIG. 24 shows the construction of a simple RF source for generating the training signal to be embedded in the transmit signal. More specifically, carrier 2402 is coupled to transformer 2404, which is coupled to switch 2406 that is capable of selecting one of two ends of transformer 2404 to enable 0 or 180 phase shift. The output of switch 2406 is provided to bandpass filter centered at a carrier frequency 2408 and the output provides a training signal 2410 such as a binary phase shift keying (BPSK) with periodic repetition of a low correlation sequence, such as an Alexis sequence.

Figure 25:
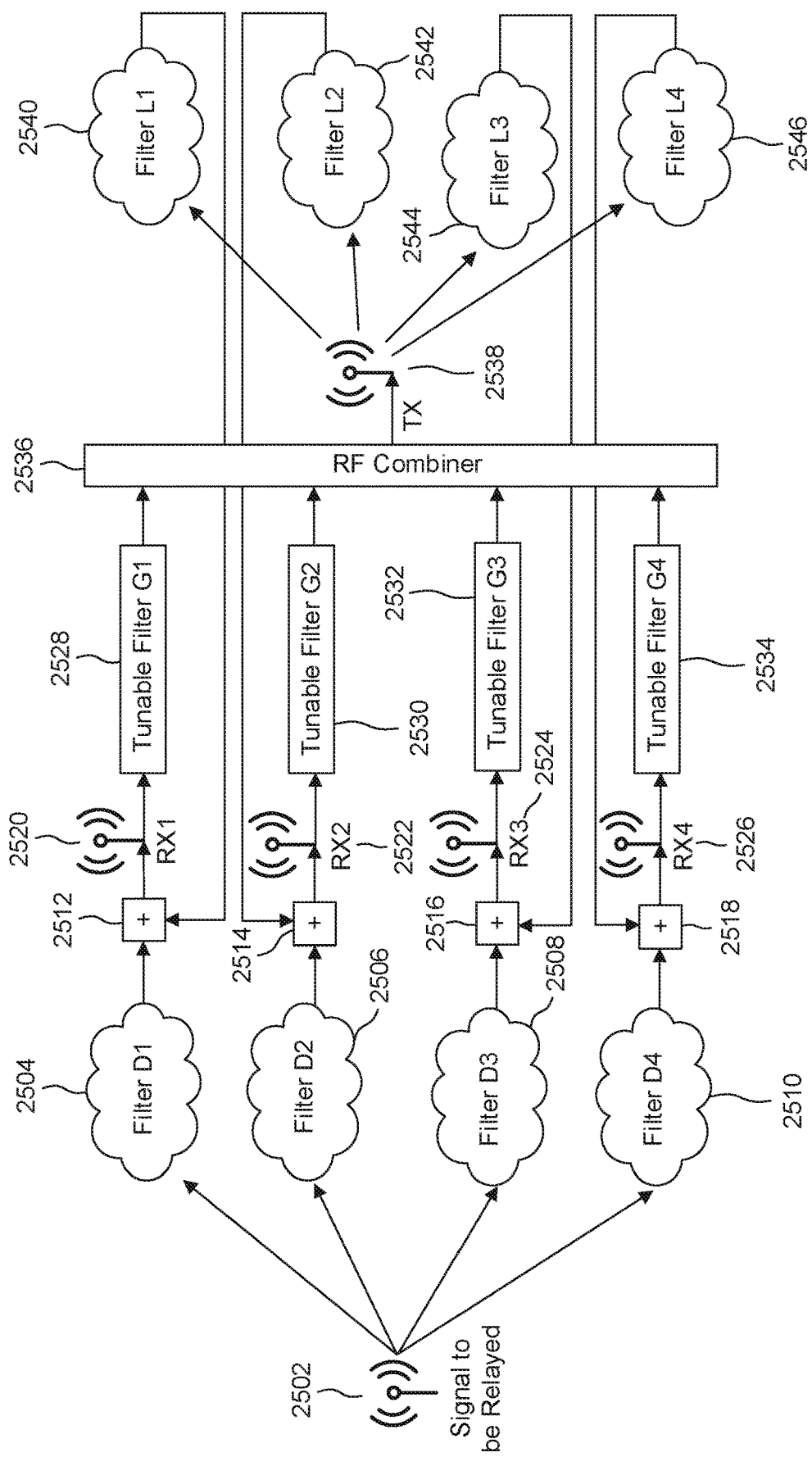
FIG. 25 illustrates a block diagram showing a leakage effect in relation to blind estimation in accordance with an embodiment.

FIG. 25 illustrates a pictorial view of the leakage effect in relation to blind estimation setup. More specifically, a signal to be relayed 2502 is coupled to filters D1, D2, D3 and D4, 2504, 2506, 2508 and 2510. Each of filters D1-4 are coupled to adders 2512, 2514, 2516 and 2518, followed by receiver 1, 2520, receiver 2, 2522, receiver 3, 2524, and receiver 4, 2526. Each receiver is coupled to a tunable filter, 2528, 2539, 2532 and 2534, respectively. Each tunable filter is coupled to RF combiner 2536, which combines the outputs of each tunable filter. RF combiner 2536 provides an output to transmitter 2538, which transmits to filters 2540, 2542, 2544 and 2546, each of which provide additive signals to adders 2512, 2514, 2516 and 2518 as described.

Figure 26:
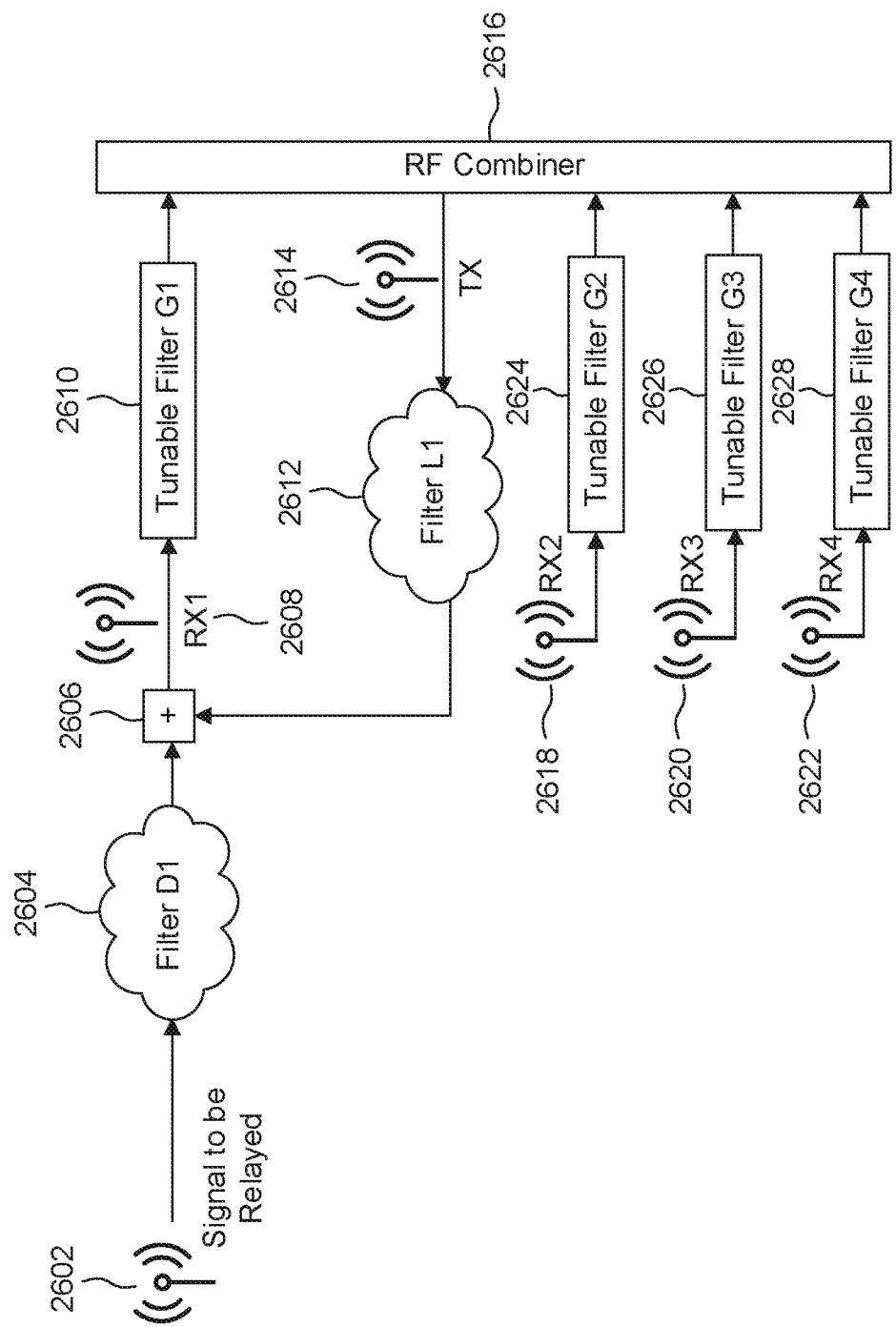
FIG. 26 illustrates another block diagram showing a leakage effect in relation to blind estimation in accordance with an embodiment.

FIG. 26 shows another pictorial view of the leakage effect in relation to blind estimation setup. Specifically, signal to be relayed 2602 is provided to filter D1 2604, which is provided to adder 2606, receiver 2608 and tunable filter G1, 2610 and to RF combiner 2616. Transmitter 2614 is shown receiving signals from RF combiner 2616 and transmitting to filter L1 2612. FIG. 26 also shows receivers 2, 2618, receiver 3, 2626 and receiver 4, 2622, which are coupled to tunable filters 2624, 2626 and 2628 and combined at RF combiner 2616.

Figure 27:
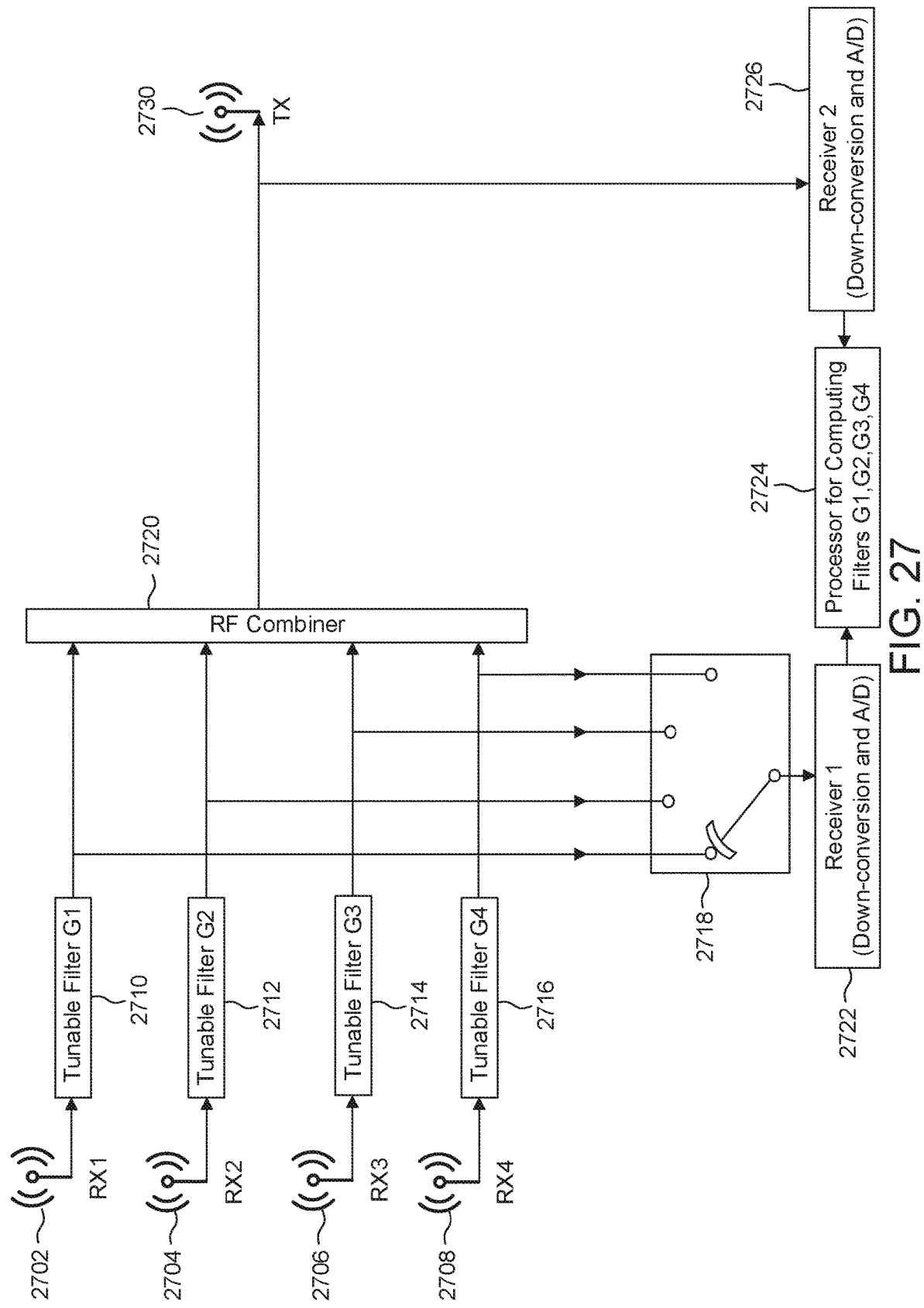
FIG. 27 illustrates a block diagram showing blind estimation in accordance with an embodiment.

FIG. 27 illustrates a blind estimation setup in accordance with an embodiment. As shown four receivers 2702, 2704, 2706 and 2708 are coupled to tunable filters 2710, 2712, 2714 and 2716. Each of the tunable filters is coupled to an RF combiner 2720 and switch 2718. The Output of RF combiner 2720 is provided to transmitter 2730.

Switch 2718 is coupled to receiver 1, 2722, which provides down-conversion and analog to digital conversion. Receiver 1 is coupled to processor 2724 for computing filters. Processor 2724 is also coupled to receiver 2 2726 which receives signals from transmitter 2730. Thus, two receivers 2722 and 2726 are used, one shared (2722) and one dedicated (2726).

Figure 28:
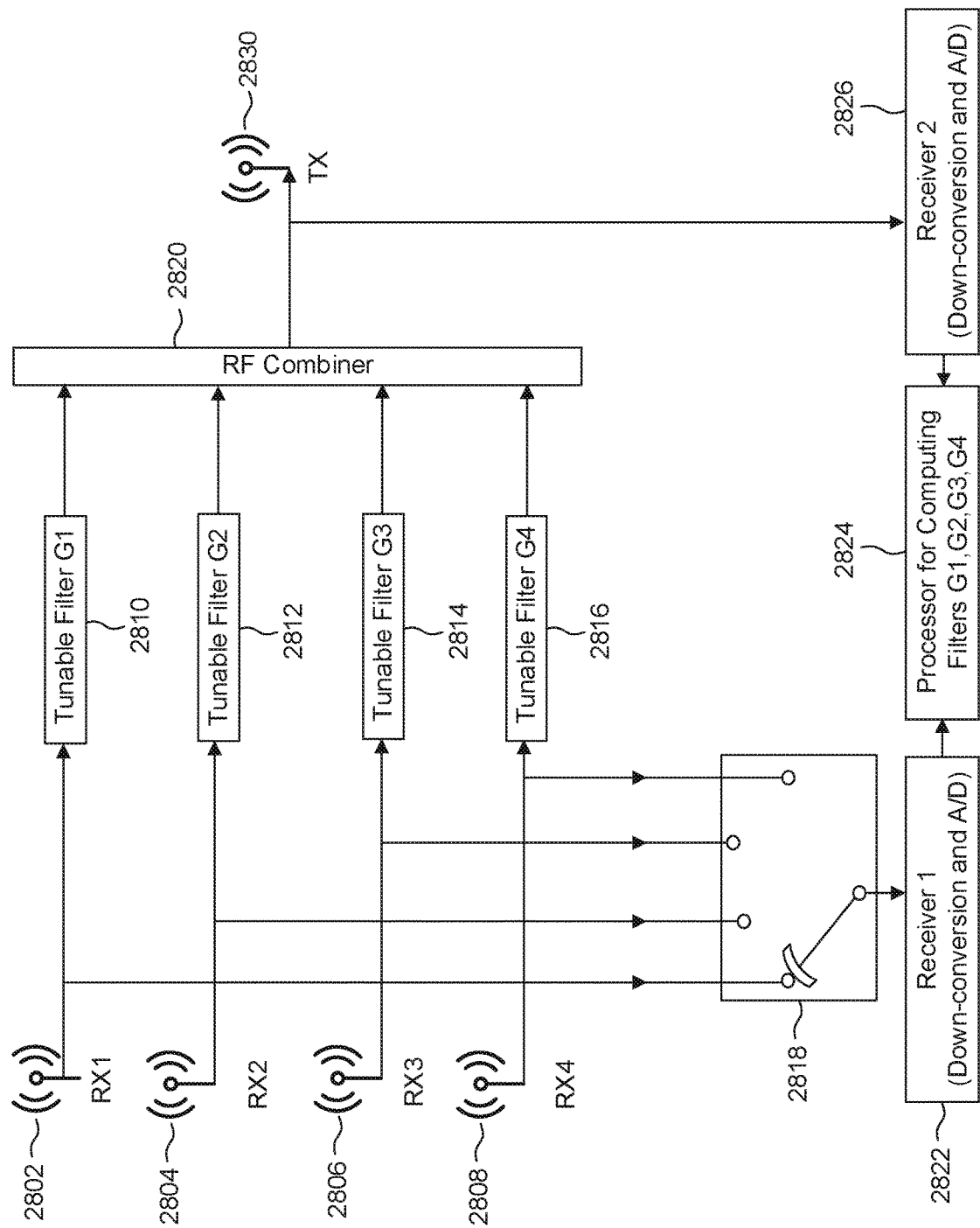
FIG. 28 illustrates a block diagram showing another version of blind estimation in accordance with an embodiment.

FIG. 28 shows another embodiment for a blind estimation setup. As shown four receivers 2802, 2804, 2806 and 2808 are coupled to tunable filters 2810, 2812, 2814 and 2816. Each of the tunable filters are coupled to an RF combiner 2820 and switch 2818. The output of RF combiner 2820 is provided to transmitter 2830.

Switch 2818 is coupled to receiver 1, 2822, which provides down-conversion and analog to digital conversion. Receiver 1 is coupled to processor 2824 for computing filters. Processor 2824 is also coupled to receiver 2, 2826 which receives signals from transmitter 2830. Thus, two receivers 2822 and 2826 are used, one shared (2822) and one dedicated (2826).

Figure 29:
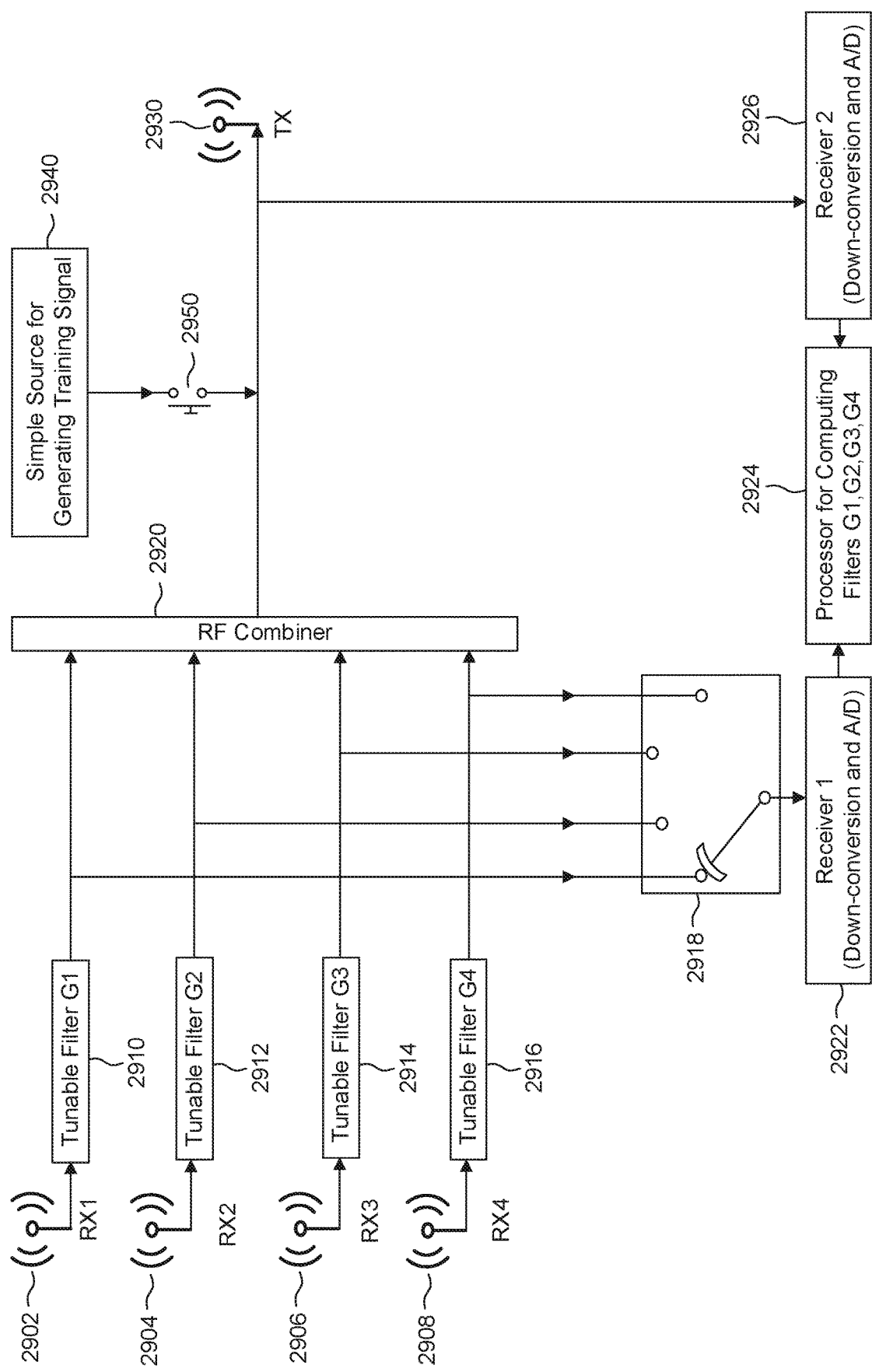
FIG. 29 illustrates a block diagram showing superimposed training and blind estimation in accordance with an embodiment.

FIG. 29 illustrates another embodiment combining the concepts of "superimposed training" and that of "blind estimation". As shown four receivers 2902, 2904, 2906 and 2898 are coupled to tunable filters 2910, 2912, 2914 and 2916. Each of the tunable filters are coupled to an RF combiner 2920 and switch 2918. The output of RF combiner 2820 is provided to transmitter 2930.

Switch 2818 is coupled to receiver 1, 2922, which provides down-conversion and analog to digital conversion. Receiver 1 is coupled to processor 2924 for computing filters. Processor 2924 is also coupled to receiver 2, 2926 which receives signals from transmitter 2930. Thus, two receivers 2922 and 2926 are used, one shared (2922) and one dedicated (2926). Unlike FIG. 28, FIG. 29 provides a simple source for generating a training signal 2940 coupled to a switch 2950 which can be provided to transmitter 2930 for training.

Superimposed training signal can be activated as needed, for example, when the relay is idle, or be used as an auxiliary mechanism (in conjunction with the blind estimation technique) to facilitate the task of estimation and compensation (tuning of filters).

Figure 30:
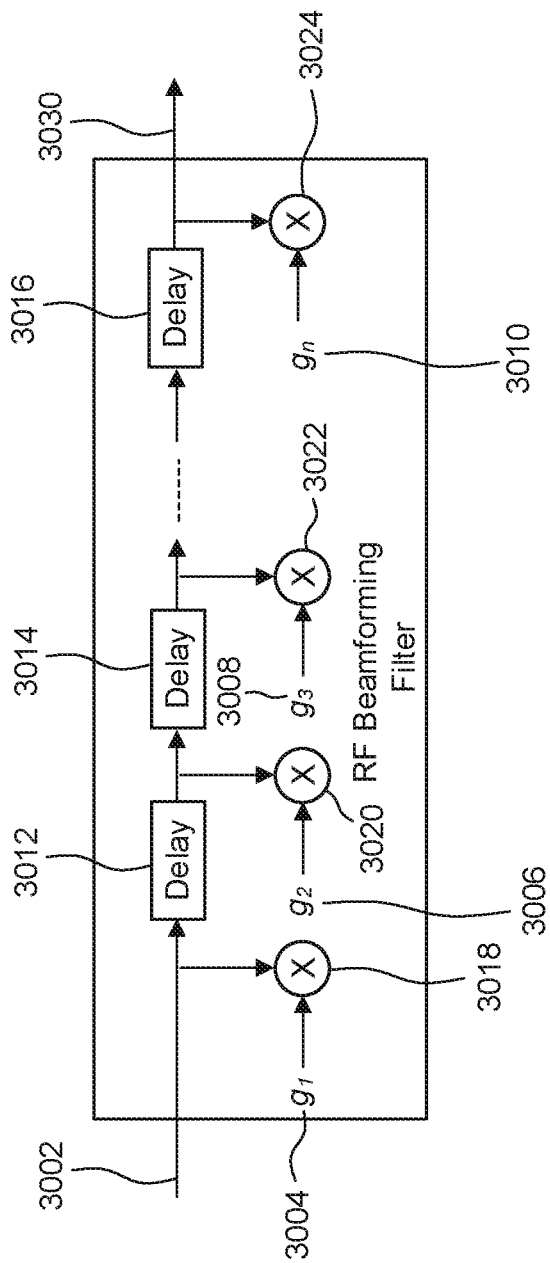
FIG. 30 illustrates a block diagram of an RF beamforming filter in accordance with an embodiment.

FIG. 30 illustrates a method for the implementation of the RF beamforming filter 3000 in accordance with an embodiment. As shown, input 3002 and signals g1-n, 3004, 3006, 3008, and 3010 are provided to respective tunable complex multipliers 1-n, 3018, 3020, 3022 and 3024, which can be vector modulators. Multipliers 1-n also receive signals via input 3002 after a series of delays, 3012, 3014 and 3016 which can be bandpass SAW filters with a bandwidth equal or slightly higher than that of the RF signal to be relayed. The output of the final delay 3016 is provided as an output 3030.

Figure 31:
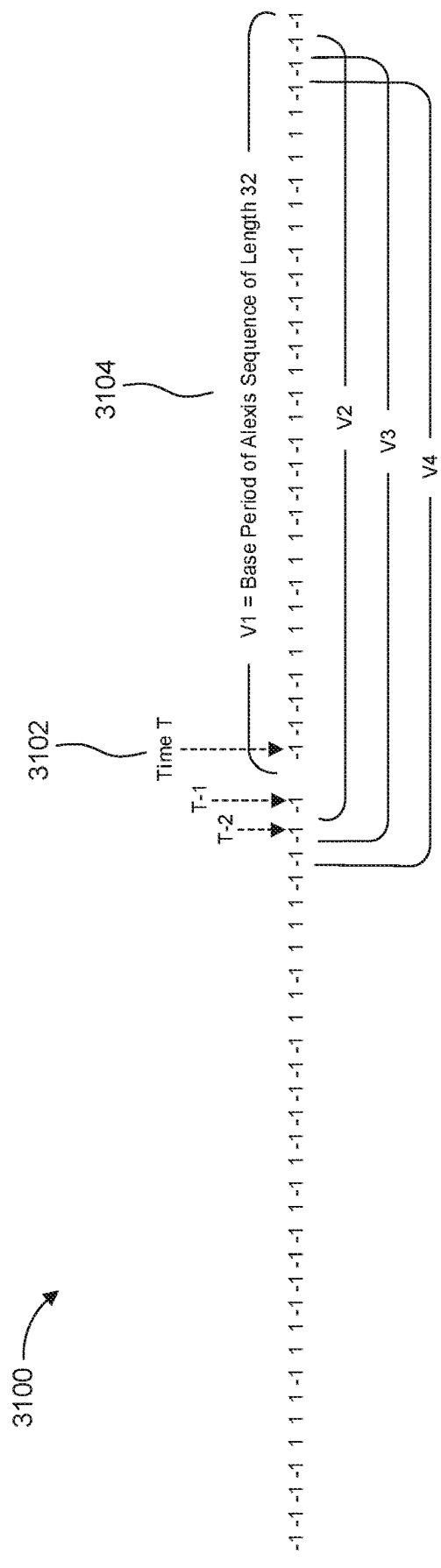
FIG. 31 illustrates a period sequence with low correlation properties for the computation of the impulse response in accordance with an embodiment.

FIG. 31 illustrates a periodic sequence 3100 with low correlation properties for the computation of the impulse response. In particular, the provided example concerns the use of an Alexis sequence of length 32 3104 over time period T 3102. FIG. 31 shows the periodic repetition of the base sequence.

Figure 32:
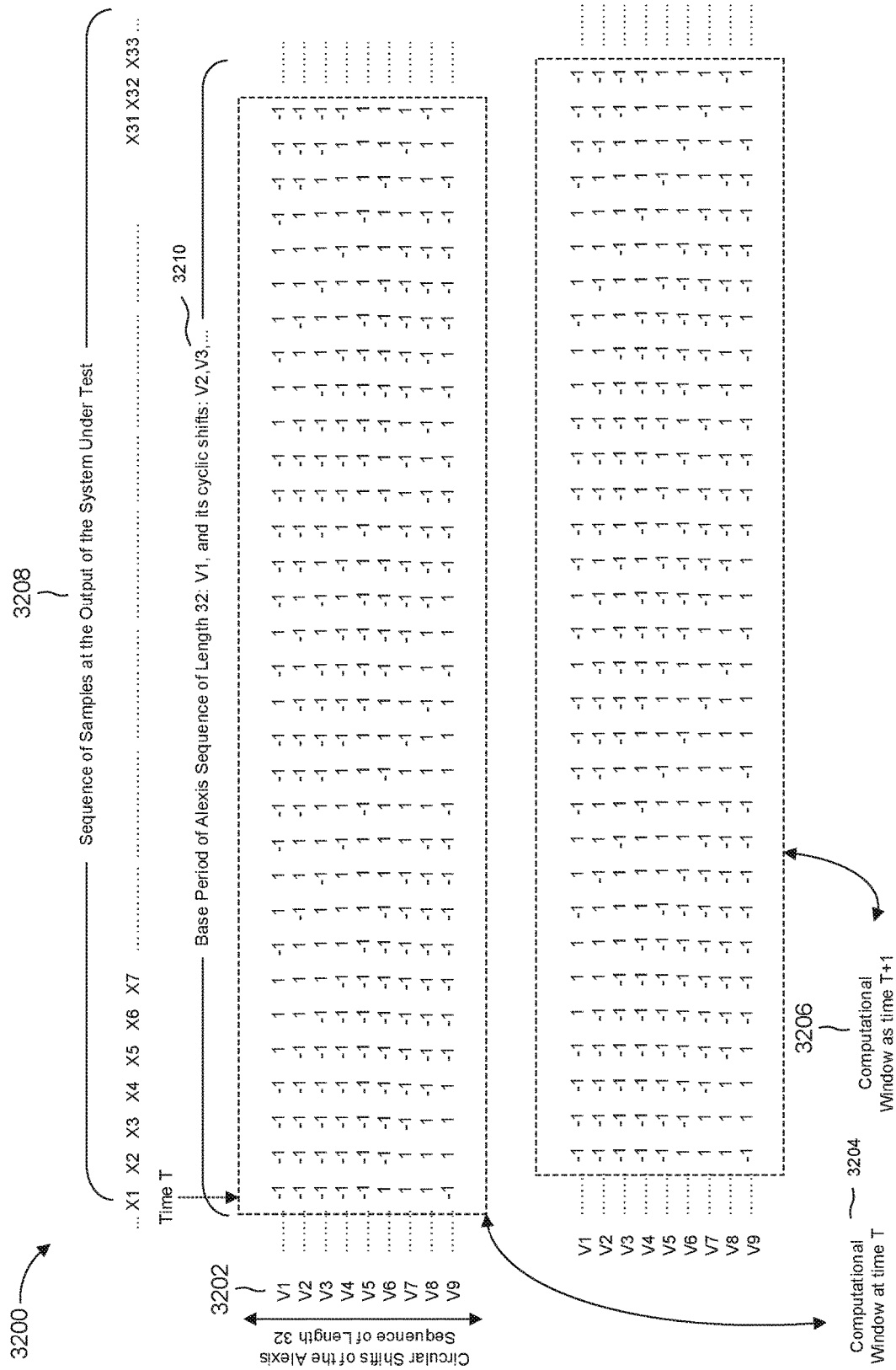
FIG. 32 illustrates a more detailed period sequence with low correlation properties for the computation of the impulse response in accordance with an embodiment.

FIG. 32 illustrates another periodic sequence diagram 3200 with cyclic shifts 3202 over a computation window at time T 3204 and a periodic sequence 3210 with a computation window at time T+1 3206. Thus, FIG. 32 shows two consecutive computational windows for extracting the impulse response.

Each computational window 3204 and 3206 show the base sequence, V1, and cyclic shifts of V1, denoted as V2, V3, ... V32 3202. For simplicity, only 9 of such cyclic shifts are shown.

Sequence of output symbols (to be used for computing the impulse response) is denoted as [X1, X2, ... X32, X33, ... ] 3208.

Assuming the impulse response is the complex vector [I0, I1, I2, ..., I9, ..., I32]. For simplicity, only the first nine components of the impulse response are shown. The assumption is that the impulse response is limited to 32 samples.

Inner product of vector Vi, i=1 to 32 (within the computation window at time T) with vector [X1, X2, ..., X32] provide an estimate of the values of the impulse response [I0, I1, I2, ..., I32].

Inner product of vector Vi, i=1 to 32 (within the computation window at time T+1) with vector [X2, X3, ..., X33] provide an estimate of the values of the impulse response

[I1, I2, . . . , I32, I0]. The construction of subsequent computational windows will be appreciated by those of skill in the art with the benefit of this disclosure.

Each computational window provides an estimate for the impulse response. To improve estimation accuracy, estimates obtained over consecutive computational windows are averaged.

In the provided example, computational windows (used for the detection) are shown to operate synchronized with the base sequence and its cyclic shifts used in transmission. In practice, the impulse response is typically composed of multiple zeros in its initial part. To improve computational efficiency, the effect of such zeros can be accounted for by cyclically delaying the computational windows with respect to transmitted base sequence. For example, if three of the initial values are known to be zero for certain, then the vectors used in the computational window at time T will be V3, V4, V5, . . . , V32, V1, V2.

Figure 33:
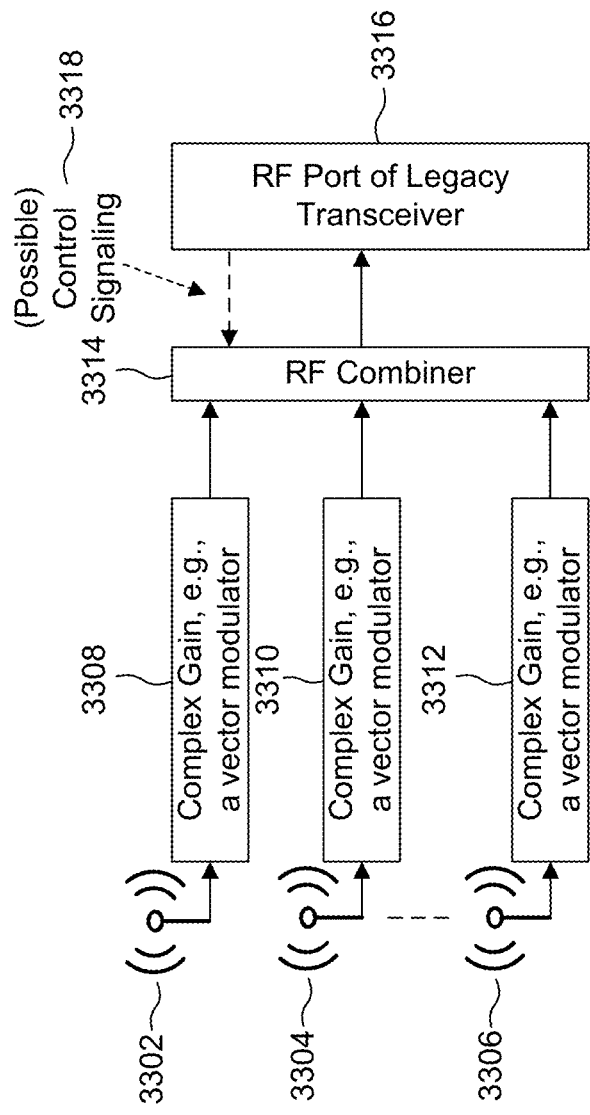
FIG. 33 illustrates a block diagram of receivers adjusting the relative phase/magnitude (complex gain) of signals in accordance with an embodiment.

For the provided example, if the length of the impulse response is known to be less than 32, then, only a subset of vectors in the computational windows suffice for finding the impulse response. In the provided example in FIG. 32, the inner product of V2 with [X1, X2, X3, . . . , X32] required within the computational window at time T can be reused in computing the inner product of V1 with [X2, X3, . . . , X32, X33] required within the computational window at time T+1. For this particular example, this is achieved by adding X1 and subtracting X33, i.e., if R(V1, T+1)=<V1, [X2, X3, . . . , X32, X33]> is the inner product in the window at time T+1, producing:

$R(V1,T+1)=+X1-X33+R(V2,T)$, similarly, $R(V2,T+1)=+X1-X33+R(V3,T)$, $R(V3,T+1)=+X1-X33+R(V4,T)$, $R(V4,T+1)=+X1-X33+R(V5,T)$, $R(V5,T+1)=+X1+X33+R(V6,T)$, $R(V6,T+1)=-X1+X33+R(V7,T)$, FIG. 33 shows an embodiment for adjusting the relative phase/magnitude (complex gain) of signals received from different receive antennas prior to RF combining. Thus, receivers 1-n, shown as 3302, 3304, and 3306 are coupled to complex gain blocks 1-n, shown as 3308, 3310, and 3312. The output of complex gain blocks are coupled to RF combiner 3314, which is coupled to RF port of legacy transceiver 3316. In some embodiments, control signalling 3318 can be provided to RF combiner 3314.

Figure 34:
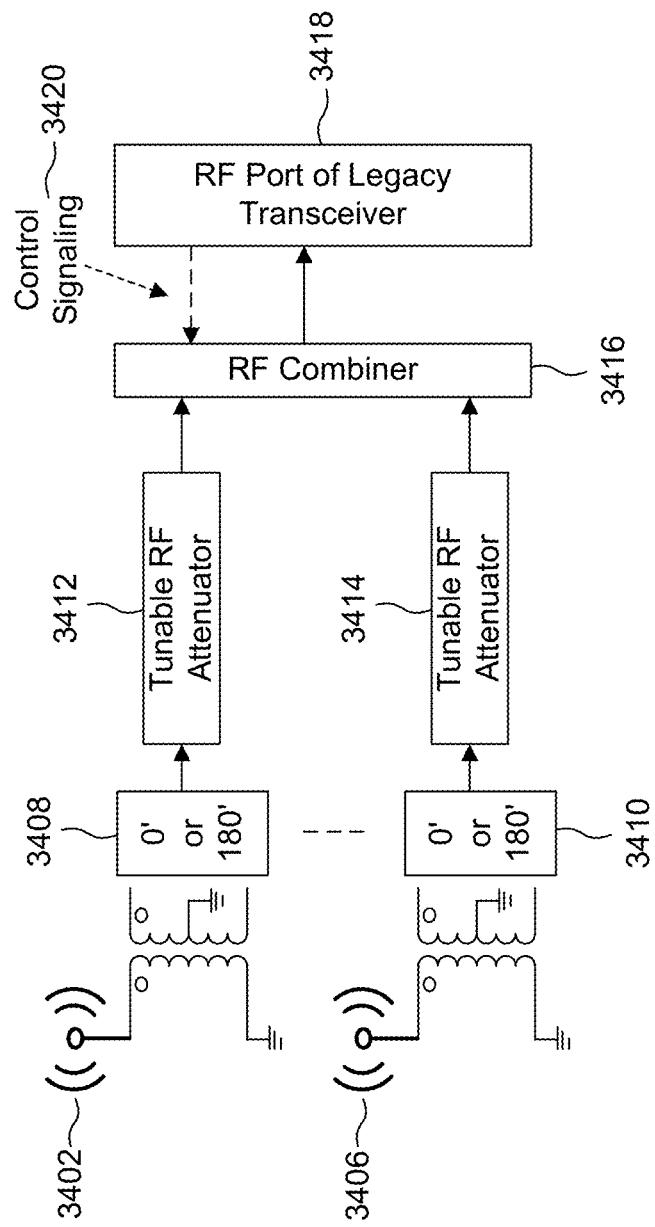
FIG. 34 illustrates a block diagram for adjusting phase at 0° or 180° of signals received from different receive antennas prior to RF combining in accordance with an embodiment.

FIG. 34 shows an embodiment for adjusting the phase at 0° or 180° or and relative magnitude of signals received from different receive antennas prior to RF combining. As shown, receivers 3402 and 3406 are coupled RF transformers 3408 and 3410, which are coupled to tunable RF attenuators 3412 and 3414, which are coupled to RF combiner 3416. RF combiner 3416 is coupled to RF port of legacy transceiver 3418. Control signalling 3420 can be implemented to provide control from transceiver 3418 to RF combiner 3416.

Figure 35:
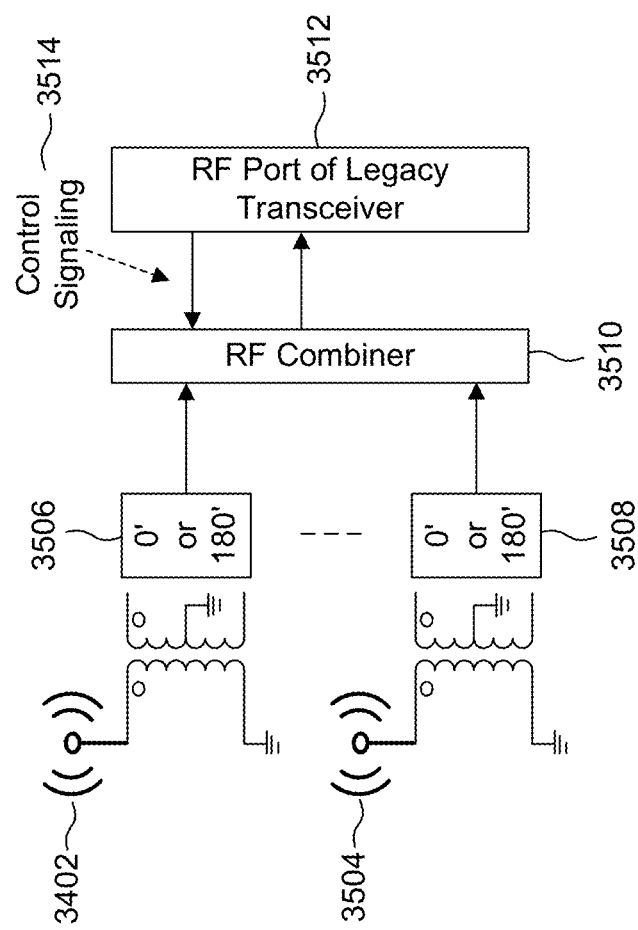
FIG. 35 illustrates another block diagram for adjusting phase at 0° or 180° of signals received from different receive antennas prior to RF combining in accordance with an embodiment.

Referring to FIG. 35, another version of an embodiment for adjusting the phase at 0°/180° of signals received from different receive antennas prior to RF combining is provided. As shown, receivers 3502 and 3504 are coupled to RF transformers 3506 and 3508, representing 2 or more receivers and transformers. RF transformers 3506, 3508 are coupled to RF combiner 3510, which is coupled to an RF port of a legacy transceiver 3512. Again, possible control signals 3514 can be provided from the transceiver to the RF combiner. An extreme case for adjusting relative magnitude of a two state scenario of connect/disconnect can be realized by implementing a three way switch (SP3T) at the secondary of the RF transformers shown in FIG. 35, wherein upper and lower taps of the RF transformer secondary provide the state of connect with 0°/180° relative phase shifts, and center tap of the RF transformer secondary (shown as grounded) provide the disconnect state.

Figure 36:
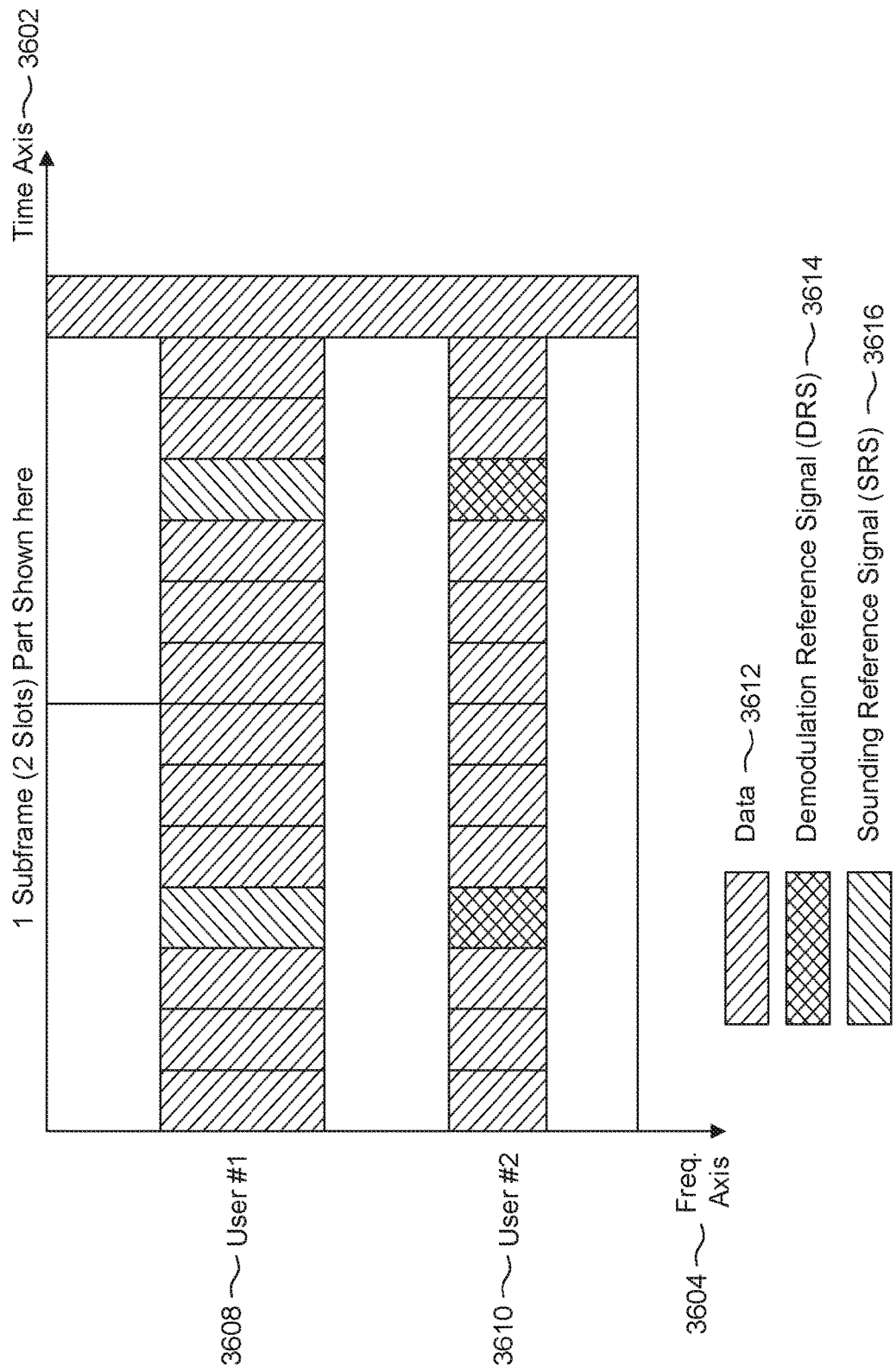
FIG. 36 illustrates a graph of an LTE Demodulation Reference Signal (DRS) and a Sounding Reference Signal (SRS) as used in LTE appropriate for embodiments.

Referring now to FIG. 36, an embodiment relates to two beamforming structures, alternating between training phase and utilization phase. As shown, 1 subframe with two slots is shown on a time axis 3602 and frequency axis 3604. Two users are shown, 3608 and 3610. The subframe is shown including data 3612, demodulation reference signal 3614 and sounding reference signal 3616.

The two beamforming structures can rely on the same set of antennas, but use two different set of phase shifters (filters). In one embodiment, one set of phase shifters is being trained (connected to the auxiliary receiver), while the other set of phase shifters is kept fixed (connected to the main receiver). Switching between the two chains is performed such that the operation of the receiver is not interrupted. In one embodiment, switching is performed in early parts of the OFDM cyclic prefix.

Specifically, FIG. 36 shows the Demodulation Reference Signal (DRS) 3614 and/or Sounding Reference Signal (SRS) 3616 used in LTE, which are examples of preambles during training/tracking required in embodiments described herein. Another example is the preamble used in WiFi (802.11) for frequency mismatch estimation/correction.

Figure 37:
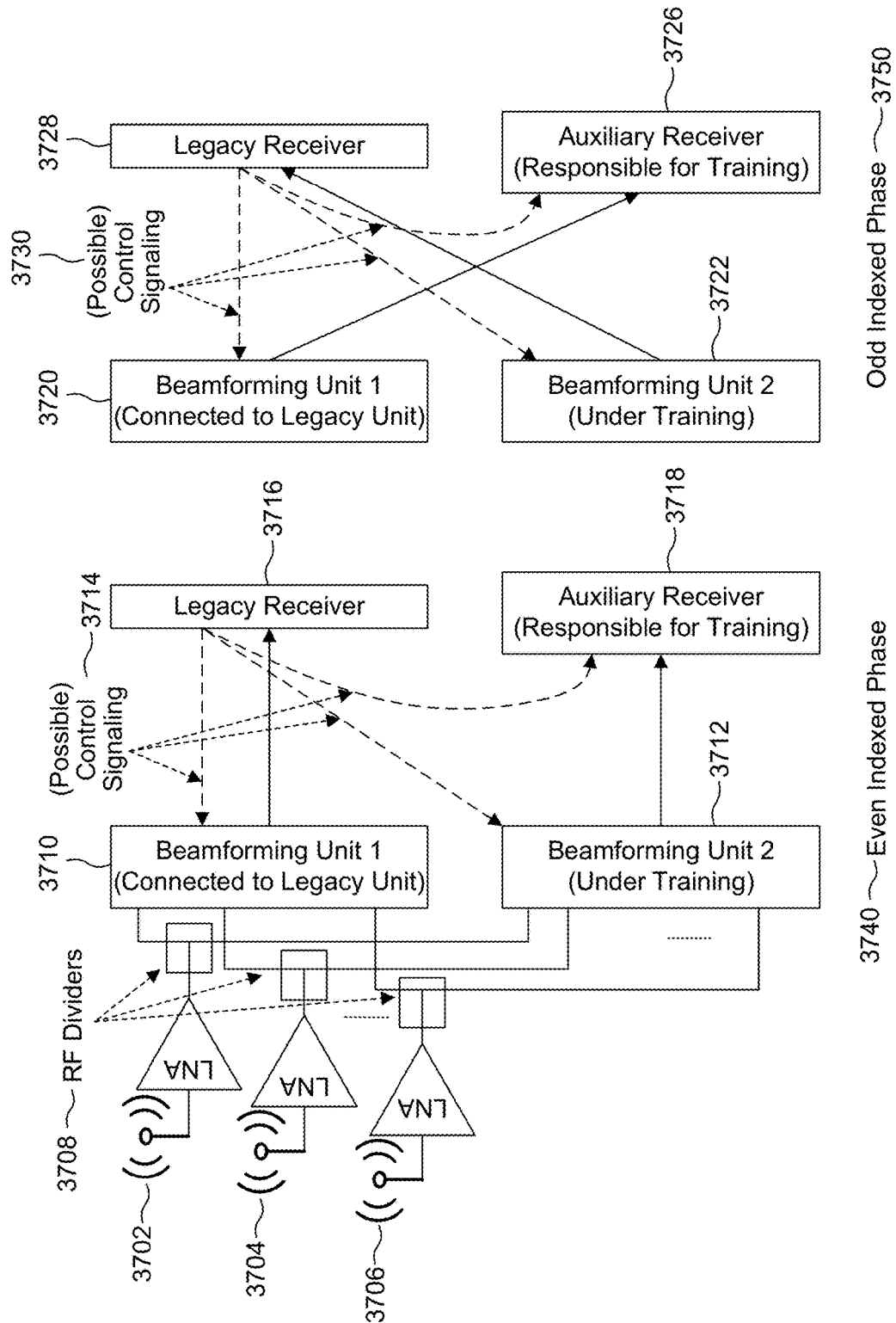
FIGS. 37 and 38 illustrate embodiments of beamforming apparatus that exchange information with legacy scheduler units in accordance with embodiments.

Referring now to FIG. 37, embodiments are directed to beamforming apparatus that exchanges information with a legacy scheduler. As shown, even indexed phase 3740 includes receivers 3702, 3704 and 3706 representing n receivers (1, 2 . . . n) are coupled to low noise amplifiers and RF dividers 3708. RF dividers 3708 are coupled to beamforming units 1 and 2. Beamforming unit 1 3710 can be connected to a legacy unit with or without control signalling 3714. Beamforming unit 2 3712 is shown under training coupled to an auxiliary receiver responsible for training 3718. Beamforming unit 1 3710 is shown coupled to legacy receiver 3716 which provides signals to beamforming unity 3712 and auxiliary receiver 3718. Odd indexed phase 3750 includes beamforming unit 1, 3720 connected to a legacy unit, beamforming unit 2 3722 under training, auxiliary receiver 3726 responsible for training and legacy receiver 3728 that can provide possible control signalling 3730.

Figure 38:
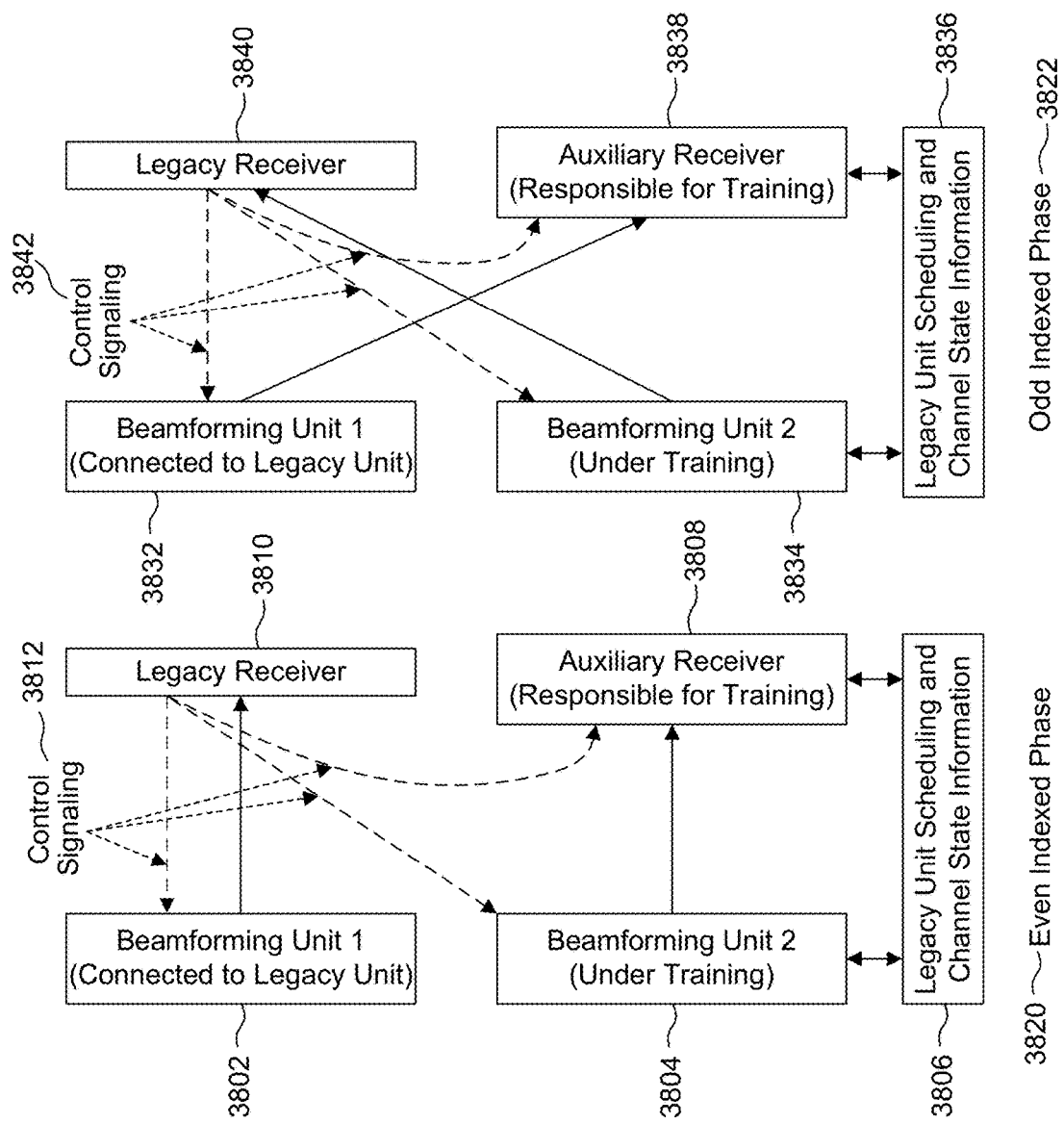

Referring now to FIG. 38, another version of embodiment directed to beamforming apparatus that exchanges information with a legacy scheduler is illustrated. As shown, even indexed phase 3920 includes beamforming units 1 and 2 3802 and 3804. Beamforming unit 1 3802 can be connected to a legacy unit with or without control signalling 3812. Beamforming unit 2 3804 is shown under training coupled to an auxiliary receiver responsible for training 3808. Beamforming unit 1 3802 is shown coupled to legacy receiver 3810 which provides signals to beamforming unit 1 3802, beamforming unit 2 3804 and to auxiliary receiver 3808. Both beamforming unit 2 3804 and auxiliary receiver 3808 responsible for training are coupled to legacy unit scheduling and channel state information block 3806.

Odd indexed phase 3822 includes beamforming unit 1 3832 connected to a legacy unit, beamforming unit 2 3834 under training, auxiliary receiver 3838 responsible for training and legacy receiver 3840 that can provide possible control signalling 3842. Legacy receiver 3840 can provide signals to auxiliary receiver 3838, and both beamforming units 3832 and 3834. Beamforming unit 2 3834 and auxiliary receiver 3838 are shown coupled to legacy unit scheduling and channel state information block 3836.

As described, FIGS. 37 and 38 show embodiments wherein the beamforming apparatus exchanges information with a legacy scheduler. Examples for such information exchanges include identifying which resource blocks are allocated to any particular uplink user and enabling beamforming apparatus to query the base-station to make adjustments in its scheduling operation, and/or query the base-station to initiate sounding operation.

Three main challenges hinder practical realization of amplify-and-forward relays: (1) noise/interference amplification, (2) delay, and (3) cancellation of self-interference (to allow increasing the relay gain without causing oscillation in the underlying closed loop).

To avoid the issue of noise/interference amplification, embodiments described herein rely on receive and/or transmit beamforming to first improve the quality of the signal to be relayed, and thereby compensate for the subsequent amplification of noise/interference.

The requirement of low delay relaying is particularly challenging. To meet the delay requirement, all underlying (adaptive) filtering operations (required in self-interference reduction) in some embodiments are be performed in the analog domain. Embodiments herein are explained in terms of filtering/amplification performed in the Radio Frequency (RF). Similar techniques can be also applied in the Intermediate Frequency (IF), and/or in analog base-band. In some embodiments, multiple stages of self-interference reduction modules are combined for operating in RF, IF and analog base-band domains, as each of these domains has its own pros and cons in realizing the required adaptive filtering.

Delay Requirements

Delay requirements, in the context of downlink channel and the case of uplink channel can be similar. In the case of downlink, the central node transmits its outgoing signal, which will be received by both clients and the amplify and forward relay unit. In some embodiments, an amplify and forward relay amplifies its incoming signal and retransmits the amplified signal to provide coverage for clients in its neighborhood. Clients will receive the downlink signal through two paths, one path is directly from the central node, and the second path is through the amplify and forward relay. It is important that these two paths are simultaneously received at the client side, otherwise, one path would act as interference to the other one. "Simultaneous" in this context means within a relative delay that can be absorbed by the client node method of channel equalization. In other words, the two paths should resemble paths formed in wireless transmission due to multi-path propagation.

Wireless standards have the capability built-in to deal with such a reception of the same signal through multiple paths, and can jointly equalize the signals received through such multiple paths. The delay spread among such a multitude of paths is the key factor that determines if the receiving units will be able to jointly equalize these separate paths, or not. For example, in standards based on Orthogonal Frequency Division Multiplex (OFDM), as long as the delay spread is less than the duration of OFDM cyclic prefix, the receiver sees the effects of such paths as a compound OFDM channel and can rely on the training signals to compute the frequency response of the compound channel, and accordingly, can equalize the combination of multiple signal in a manner that the end-to-end link, over each OFDM tone, will be a single equalized constellation.

In the context of amplify-and-forward relay structures disclosed herein, this requirement entails that the delay incurred in the process of relaying should not exceed certain threshold. In contradistinction to known methods of relaying, contradicts methods used in decode and forward relays which first recover the data by deploying a complete receive chain, and then retransmit the same data by deploying a complete transmit chain. In setups using complete transmit/receive chains, the bulk of the processing is performed in the digital domain, which includes down-conversion, equalization, demodulation and decoding (tasks of the receive chain), and then re-encoding, re-modulation, up-conversion and re-transmission (tasks of the transmit chain). In contrast, in amplify and forward relay, the processing performed on the received signal should be in the analog domain to avoid excessive delay.

Processing tasks to accomplish embodiments herein include (1) active cancellation of the self-interference through filtering and construction of an auxiliary signal which would be combined with the receive and/or transmit analog signals to reduce the effect of the self-interference; and (2) receive and/or transmit beamforming for the purpose of reducing the self-interference, improve the signal-to-noise ratio by directing the respective transmit and/or receive antennas' beam(s) to focus on the central node, improve the signal-to-noise ratio by directing the respective transmit and/or receive antennas' beam(s) to focus on the clients, improve the signal-to-noise ratio by directing the respective receive antennas' beam(s) to avoid interference from neighboring transmitters operating over the same spectrum.

To perform the above processing tasks, the embodiments described herein rely on an auxiliary receive chain which is used to provide samples of various incoming and outgoing signals for the purpose of monitoring relevant signals, and accordingly informing a signal processing engine which in turn controls the filtering and beamforming tasks. Furthermore, to distinguish the self-interference signal from the incoming signal to be relayed, some embodiments rely on embedding a known periodic sequence in the outgoing signal, which will be extracted by a correlator receiver and used to determine characteristics of the self-interference channel, i.e., channel from the transmit antenna(s) to receive antenna(s) within the same amplify and forward relay node.

To reduce the self-interference, in some embodiments, antennas are symmetrically placed as illustrated in FIGS. 17-20. Each antenna has at least one plane of symmetry. There are two types of such planes of symmetry. One type entails even symmetry, see, e.g., FIG. 17, which means RF field components at points symmetrically located at the two sides of the plane of symmetry are positive mirrors of each other (mirror without sign change) with respect to the plane of symmetry. Another type entails odd symmetry, which means RF field components at points symmetrically located at the two sides of the plane of symmetry are negative mirrors of each other (mirror with a sign change) with respect to the plane of symmetry. In some embodiments, a first set of antennas have at least one plane of even symmetry, and a second set of antennas have two orthogonal planes of symmetry, one with even symmetry and one with odd symmetry. The placement of antennas is such that the plane of even symmetry of the first set aligns (overlaps) with the plane of odd symmetry of the second set, and the resulting shared plane will be orthogonal to the plane of even symmetry of the second set.

To reduce hardware complexity of beamforming, and at the same time simplify the complexity of beamforming algorithm, some embodiments herein rely on one-bit beamformers, such as two phase values of 0° and 180°. In some embodiments, such beamforming circuitry is cascaded with circuitry for gain adjustment.

In one embodiment, corresponding to an extreme case of gain adjustment circuitry, the gain values are binary, i.e., the circuit is either connected (passing its input signal to its output), or is disconnected (terminating the path such that no signal gets through). This bypass feature is used to mimic the operation of maximum ratio combining in receive beamforming, wherein incoming paths with low signal levels (which would degrade the overall Signal-to-Noise Ratio-SNR) are bypassed. Tasks of transmit and receive beamforming are performed to provide a compromise among several factors, including boost in signal gain and SNR, nulling an external interfering signal, and creating a null for the self-interference path to improve isolation (reduce self-interference), thereby enabling an increase in the relay forward gain without causing oscillation.

The simple beamforming structures explained above, i.e., with two states (0° phase shift, 180° phase shift) or with three states (0° phase shift, 180° phase shift, bypass/disconnect), can be tuned using a sequential search algorithm. For the purpose of the search algorithm, the beamforming circuitries can be sequentially indexed by 1, 2, 3, . . . . In subsequent steps of the search algorithm, the states of beamforming circuitries can be changed one-by-one (in the order of their indices), and in each case, the new state is kept if it results in an improvement in the underlying "figure of merit," or it is reverted back, if otherwise. "Figure of merit" is a vector with components representing: "receive beamforming gain (SNR)", "transmit beamforming gain", "improvement in transmit/receive isolation (reduction in self-interference)" and "reduction in interference observed from external nodes operating over the same spectrum, i.e., improvement in Signal-to-Noise-plus-Interference Ratio (SINR)". The first priority is to improve transmit/receive isolation such that the relay can provide the desired level of forward gain, and once this condition is satisfied, other figures of merit mentioned above will be considered.

As mentioned earlier, in one embodiment, a signature signal will be embedded in the outgoing signal, which will be in turn extracted at the receiving end of the relay to distinguish the self-interference channel from the channel carrying the incoming signal from the distant transmitter (signal to be relayed). In an embodiment, the signature signal is selected as a sequence of ±1, which is repeated to create a periodic sequence. An example is binary Alexis sequence. In some embodiments, the use of ±1 has been exploited in simplifying the hardware circuitry required for up-conversion of the signature signal.

Such circuitry relies on a transformer with a center-tapped secondary. See FIGS. 5 and 6, for example. The carrier is fed to the primary of this transformer, and the output (RF modulated signature signal) is extracted from the secondary of the transformer. Secondary is connected to an RF switch, which selects one of the two outputs of the secondary following the sign of the signature signal. The resulting RF modulated signal is filtered to limit its spectrum occupancy to the ranges of interest in the relaying operation. In the case of an amplify and forward relay, transmitter generating/sending the signature signal, and the receiver detecting the signature signal can be within the same unit. In an embodiment, this feature is exploited to implement a correlation receiver for the signature signal at the RF front end of the receiving side as in FIG. 5 for example. In this embodiment, the correlation receiver is in essence similar to the center tapped transformer used for up-conversion of the signature signal. In this case, if the transformer at the receiving side is switched with a delayed version of the signature signal, with a delay that is equal to the delay of one of the propagation paths in the self-interference channel, there will be a peak at the carrier at the output of the correlation receiver.

In an embodiment, by searching for successive delay values that result in peaks in the output of the correlation receiver, and measuring magnitude and phase of the resulting peaks, the system extracts the entire impulse response of the self-interference channel. This knowledge is used to adjust the filter structures used in the cancellation of self-interference.

In another embodiment, instead of separately extracting these components (corresponding to components of multipath in the self-interference channel), the self-interference channel is measured through pre-processing (this "pre-processing" is in essence pre-equalization with respect to the self-interference channel). In this case, at the transmitter side, instead of transmitting one stream of the signature signal, multiple copies of the signature signals, after applying an appropriate relative delay and phase/magnitude adjustment to each delayed copy, are summed and the resulting waveform is RF modulated. See, for example, FIG. 21.

The relative delays and complex gain adjustments are set such that all the multipath components align in time and add coherently at the receiving side of the relay. In this case, the correlation receiver is operated ("operated" means "switching of the receiver correlator transformer") with a fixed copy of the signature signal ("fixed copy" means a single copy of the signature signal with a given delay and magnitude/phase), and the relative delays among components of the signature signal forming the pre-processed signature signal at the transmitting side, and their corresponding complex gain adjustments, are set with respect to the fixed signature signal switching the receiving transformer. All parameters (relative delays and complex gain values) are adjusted to create one large peak at the output of the correlation receiver, and adjustment are made to maximize the energy at this peak. The large peak is the result of aligning and coherently adding all the multipath components in the self-interference channel (through pre-equalization). This strategy is used in some embodiments as an alternative approach to compute the impulse response of the self-interference channel.

In some embodiments, the antennas used primarily for the purpose of reception, transmit as well, and antennas used primarily for the purpose of transmission, receive as well. This allows an increase the effective number of antennas involved in the beamforming operation.

Some of other key points behind various embodiments are as follows:

Insert low power training signals in the relayed signal to learn the characteristics of the self-interference channel (signal leaked from transmitter of the relay back to its receiver).

Use RF delay elements creating a delay equivalent (or close to) to one sample of Nyquist sampling frequency. For example, a 20 Mhz RF channel corresponds to Nyquist base delay of 50 nsec.

Use multiple transmit antennas to relay the signal while forming a transmit null at the receive front-end of the relay.

Use multiple receive antennas to enable receive beamforming for the purposes of: Reducing self-interference through receive beamforming (to null the self-interference channel), i.e., create a receive null with respect to the relay transmit front-end, and improve the reception (signal to noise ratio) of the (desired) incoming signal prior to amplifying/relaying it.

One embodiment is for relaying Frequency Division Duplex (FDD) signals. FDD systems use two distinct frequency bands to send and to receive. An embodiment relies on six antennas to relay a (SISO) FDD signal, such as those shown in FIGS. 18, 19 and 20. These antennas are divided into groups:

Set A1: Two antennas are mainly responsible for receiving over the first frequency band, F1. In an enhanced version, these two antennas can receive over F2, or transmit over F2.

Set A2: Two antennas are mainly responsible for receiving over the second frequency band, F2. In an enhanced version, these two antennas can receive over F1, or transmit over F1.

B1: One antenna is mainly responsible for transmitting over the first frequency band, F1. In an enhanced version, this antenna can receive over F2.

B2: One antenna is mainly responsible for transmitting over the second frequency band, F2. In an enhanced version, this antenna can receive over F1.

In one embodiment, sets A1 and A2 act as receiver over F1 and F2; and sets B1 and B2 act as a transmitter over F1 and F2, respectively.

In another embodiment, sets A1 and A2 are comprised of many more antennas, for example 100 antennas, each equipped with a simple beamforming circuitry which, e.g., applies a one-bit phase adjustment, i.e., (0°,180°) phase adjustment, to the signal received by its respective antenna prior to signal combining. In a slightly more advanced version, the beamforming circuitry can be associated with each antenna is capable of (0°, 180°) phase adjustment in a "connected state", or terminating the signal in a "disconnected state". Antennas that are in the disconnected states will not contribute to the combined signal. The disconnecting the signal of any particular antenna from entering the combiner allows to improve the effective signal-to-noise ratio by mimicking the operation used in maximum ratio combining. This means, the signals of antennas that have a low signal-to-noise ratio will be simply dropped prior to combining.

As will be appreciated by those of skill in the art, various other configurations, including a large number of antennas in sets A1, A2, B1 and B2, equipped with a combination of simple circuitries explained above for beamforming, and more complex beamforming circuitries for adjustment of phase and/or magnitude will be possible. In one embodiment appropriate for installation in locations that would allow large form factors, sets A1 and A2 include hundreds of antennas and sets B1 and B2 are composed of a smaller number of antennas (e.g., less than 10). The use of a large number of antennas allows satisfying the objectives of: "beamforming for the purpose of nulling self-interference," as well as "realizing advantages of traditional beamforming for improving signal gain and/or reducing multi-user interference".

Embodiments herein can be generalized to Multiple-Input Multiple-Output (MIMO) antenna structures based on the following principles: (1) In case of MIMO, the basic structure is repeated M times, M is the number of antennas in the M×M MIMO; (2) M transmit antennas are equipped with M distinguishable signature signals, such as sinusoidal separated in time and/or in frequency, and (3) received signals are combined and relayed such that all signature signals are nulled.

Another embodiment disclosed herein relies on Blind Channel Estimation for training (initial nulling of self-interference) and/or tracking (gradual readjustments upon completion of the training phase). Tracking includes following time variations in the self-interference channel, and/or time variations in the channels related to the primary signals (used for the purpose of traditional beamforming towards improving signal gain and/or reducing multi-user interference). In embodiments relying on Blind Channel Estimation, instead of embedding a training signal in the signal to be relayed, the task of channel estimation is performed blindly by relying on some auxiliary receivers, called "probing receiver(s)", and using the correspondence between transmit and receive signals (in baseband) to estimate the impulse response of the leakage paths, and accordingly adjust the beamforming filters (see, e.g., FIGS. 25-29).

Wireless systems, such as LTE, benefit from beamforming for the purpose of maximizing the signal strength, minimizing interference, or a combination of the two, e.g., maximizing the Signal-to-Interference-Plus-Noise Ratio (SINR). Similar benefits can be realized for relayed signals. In addition to amplify-and-forward relays, embodiments for beamforming at the RF level can be integrated with legacy setups. This would be an add-on component operating transparent to the operation of the legacy transceiver, while improving its performance. In the following, these techniques are explained in the context of interface to legacy setups, but similar setups apply to the case of beamforming at the RF front-end for an amplify-and-forward relay. If a legacy system has multiple antennas, each of such legacy antennas can be enhanced by the addition of RF beamforming. Beamforming can be learned in the uplink, which can be applied to uplink (FDD setups), or to both uplink and downlink (TDD setups) relying on channel reciprocity. In the latter case, the downlink beamforming is adjusted based on storing the selected beam for each particular client, which are then selected knowing the client(s) targeted in a downlink transmission phase.

Receive Beamforming

Hereafter, embodiments in the context of receive beamforming in the uplink.

Receive beamforming is achieved by one or more, or the combination of (1) adjusting the relative phase/magnitude (complex gain) of signals received from different receive antennas prior to RF combining, such as FIG. 33; (2) adjusting the phase at 0° or 180° and relative magnitude of signals received from different receive antennas prior to RF combining, such as shown in FIG. 34. Note that the relative magnitude, in its extreme case of one-bit resolution, means the signal is either connected or is disconnected.

Adjusting the phase at 0° or 180° of signals received from different receive antennas prior to RF combining is described above with respect to FIG. 35.

Transparent Training/Tracking

Embodiments herein relate to perform training for the computation of beamforming strategy such that the operation of the legacy receiver is not affected. This operation can be performed by training/tracking during receiver idle time (when there are no signals in the air).

Training/tracking is performed during preambles that are not used for channel training/equalization. An example is the preamble used in WiFi (802.11) for frequency mismatch estimation/correction, or the Demodulation Reference Signal (DRS) and/or Sounding Reference Signal (SRS) used in LTE. See, for example, FIG. 36.

Training/tracking can be performed during cyclic prefix of the OFDM or SC-FDMA structure (in parts that will be discarded by the legacy transceiver).

Embodiments herein include two beamforming structures, alternating between training phase and utilization phase. The two beamforming structures can rely on the same set of antennas, but use two different set of phase shifters (filters). In this embodiment, one set of phase shifters is being trained (connected to the auxiliary receiver), while the other set of phase shifters is kept fixed (connected to the main receiver). The "switched training" is described with respect to FIGS. 37 and 38. Switching between the two chains is performed such that the operation of the receiver is not interrupted. In one embodiment, switching is performed in early parts of the cyclic prefix.

Using Legacy Preambles for Training

In order to avoid modification to legacy standard, embodiments herein rely on preamble structures used in legacy system, in particular preamble used for channel estimation, to compute the beamforming strategy. In particular, in standards based on OFDM and its variants (such as SC-FDMA used in LTE Uplink), training signals are transmitted that have equal magnitude in all their occupied tones. These signals are typically used for the purpose of channel estimation. Upon compensating for the phase in successive tones (frequency segments), the sequence of the equalized tones will be separated into two parts: (1) Slowly changing part specifies the signal gain (channel magnitude); and (2) Fast changing part specifies the noise plus interference.

These two parts can be separated by a simple filtering of the successive values of the equalized tones.

In case of switched training, the preamble as well as data part of successive OFDM (or SC-FDMA) symbols can be used.

In a preferred embodiment for LTE uplink, DRS and/or SRS, possibly in addition to in-between SC-FDMA data symbols are used. In DRS (as well as in successive SC-FDMA symbols within a "slot"), regardless of user scheduling, it is known that at least 12 successive carriers are received from the same user, and, as a result, averaging over segments of length 12 can be used to estimate the signal and the interference. Then, a "min-max" (or an "averaging") criterion can be used to select the best antenna pattern.

In LTE uplink, there are two reference signals as shown in FIG. 36. The demodulation reference signal can be separated into consecutive segments of tones corresponding to different transmitters sending in the uplink using SC-FDMA. Then, the signal power (channel gain) as well as the interference level for each of these consecutive segments is computed (for different antenna patterns) and the best pattern is selected. The best pattern can be selected to balance the quality of the signals received from different clients, i.e., maximize the minimum SINR (in order to accommodate transmitters at the cell edge, or those in fading).

In one embodiment, switched training (as shown in FIGS. 37 and 38) in conjunction with 0°/180° phase shift structure as shown in FIGS. 33 and 34 is used. During the cyclic prefix of the reference signals, or during the data part (see FIG. 38), the antennas' phases are sequentially switched by 180°, the outcome of switching is computed over the subsequent reference signal, and the applied phase shift is accepted/rejected depending on the observed outcome. The latest best pattern for each uplink transmitter is stored and used to initialize the search next time the same client is scheduled.

In one embodiment, the beamforming apparatus listens and interprets some of the control signalling exchanged between its associated base-station and legacy units being served by this base-station. In particular, this allows the beamforming apparatus to act synchronous with the timing of the legacy unit, for example, to extract the start of the demodulation reference signal, and accordingly adjust its switching and beam selection strategy.

In another embodiment as shown in FIG. 38, the beamforming apparatus exchanges information with the legacy scheduler. Examples for such information exchanges include (1) knowing which resource blocks are allocated to any particular client in the uplink; and (2) beamforming apparatus can ask the base-station to make adjustments in its scheduling operation, and/or ask the base-station to initiate the sounding operation.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

I claim:

1. An apparatus comprising:
a receive front-end including a plurality of receive antennas configured to perform receive beamforming, wherein the plurality of receive antennas include a respective first plurality of radio frequency beamforming filters, and wherein the receive front-end operates within at least a first frequency band and is responsive to an incoming radio frequency signal;
an amplification stage coupled to the receive front end, the amplification stage configured to amplify the incoming radio frequency signal received at the receive front-end and to produce an amplified incoming radio frequency signal;
a transmit front-end coupled to the amplification stage to receive the amplified incoming radio frequency signal, wherein the transmit front-end includes a plurality of transmit antennas configured to perform transmit beamforming, wherein the plurality of transmit antennas include a respective second plurality of radio frequency beamforming filters, and wherein the transmit front-end operates within at least the first frequency band, the transmit front-end being configured to transmit the amplified incoming radio frequency signal to a distant receiver while the receive front-end is receiving the incoming radio frequency signal;
a signature signal generation circuit coupled to the transmit front-end, wherein the signature signal generation circuit is configured to generate a signature signal that is included within the first frequency band in which the amplified incoming radio frequency signal is to be transmitted, and wherein the signature signal includes a periodic sequence to distinguish the signature signal from the transmitted amplified incoming radio frequency signal; and
a self-interference measurement circuit configured to generate beamforming control signals to control at least one of (i) the plurality of receive antennas including the respective first plurality of radio beamforming filters or (ii) the plurality of transmit antennas including the respective second plurality of beamforming filters, wherein the self-interference measurement circuit is further configured to (i) detect the signature signal present at the receive front-end to measure self-interference and (ii) to generate the beamforming control signals based on the detected signature signal such that an amount of the transmitted amplified incoming radio frequency signal and the signature signal leaked from the transmit front-end back to the receive front-end is reduced.

2. The apparatus of claim 1, wherein each of the plurality of receive antennas separately receives the incoming radio frequency signal to enable radio frequency combining and amplification, and wherein the respective first plurality of radio frequency beamforming filters are configured to create a receive null with respect to the transmit front-end so as to reduce a signal leakage from the transmit front-end back to the receive front-end.

3. The apparatus of claim 1, wherein each of the respective first plurality of radio frequency beamforming filters in the receive front-end is configured to increase a beamforming gain to improve a signal-to-noise ratio of the amplified incoming radio frequency signal.

4. The apparatus of claim 1, wherein the plurality of transmit antennas receive the amplified incoming radio frequency signal for transmit to the distant receiver via the respective second plurality of radio frequency beamforming filters that are configured to produce a transmit null with respect to the receive front-end so as to reduce a signal leakage from the transmit front-end back to the receive front-end.

5. The apparatus of claim 1, wherein each of the respective first plurality of radio frequency beamforming filters in the receive front-end or each of the respective second plurality of radio frequency beamforming filters in the transmit front-end has at least two states, wherein the at least two states include a 0° phase shift and a 180° phase shift, and wherein each filter having the at least two states is configured such that the at least two states are controlled selectively to improve isolation between the receive front-end and the transmit front-end.

6. The apparatus of claim 1, wherein the plurality of transmit antennas receive the amplified incoming radio frequency signal for transmit to the distant receiver via the respective second plurality of radio frequency beamforming filters, and wherein the respective second plurality of radio frequency beamforming filters are configured to produce one or more transmit beams that focus the amplified incoming radio frequency signal onto the distant receiver.

7. The apparatus of claim 5, wherein the at least two states further include a disconnect state.

8. The apparatus of claim 1 further comprising:
a training signal generation circuit coupled to the transmit front-end, wherein the training signal generation circuit is configured to generate a training signal that is included with the amplified incoming radio frequency signal for transmit, and wherein the training signal provides initial training for adapting to self-interference between the receive front-end and the transmit front-end.

9. The apparatus of claim 1, wherein the transmit front-end and the receive front end operate within at least two frequency bands simultaneously relaying uplink and downlink radio frequency signals in a Frequency Division Duplex (FDD) wireless network.

10. The apparatus of claim 9, wherein:
the plurality of receive antennas are organized into at least two sets of receive antennas, the first set of receive antennas operating within the first frequency band and a second set of receive antennas operating within a second frequency band, and
the plurality of transmit antennas are organized into at least two sets of transmit antennas, the first set of transmit antennas operating within the first frequency band and a second set of transmit antennas operating within the second frequency band.

11. The apparatus of claim 10, wherein a number of receive antennas in the at least two sets of receive antennas is greater than a number of transmit antennas in the at least two sets of transmit antennas.

12. The apparatus of claim 10, wherein each of the the plurality of receive antennas includes a corresponding radio frequency beamforming filter that has a connected state and a disconnected state.

13. The apparatus of claim 12, wherein one or more of the radio frequency beamforming filters in the at least two sets of receive antennas are in the disconnected state to prevent signals from corresponding one or more receive antennas from entering a radio frequency combiner to improve signal-to-noise ratio.

14. An apparatus comprising:
a receive front-end including a plurality of receive antennas configured to perform receive beamforming, wherein the plurality of receive antennas include a respective first plurality of radio frequency beamforming filters, and wherein the receive front-end operates within at least a first frequency band and is responsive to an incoming radio frequency signal;
an amplification stage coupled to the receive front end, the amplification stage configured to amplify the incoming radio frequency signal received at the receive front-end and to produce an amplified incoming radio frequency signal;
a transmit front-end coupled to the amplification stage to receive the amplified incoming radio frequency signal, wherein the transmit front-end includes a plurality of transmit antennas configured to perform transmit beamforming, wherein the plurality of transmit antennas include a respective second plurality of radio frequency beamforming filters, and wherein the transmit front-end operates within at least the first frequency band, the transmit front-end being configured to transmit the amplified incoming radio frequency signal to a distant receiver;
a signature signal generation circuit coupled to the transmit front-end, wherein the signature signal generation circuit is configured to generate a signature signal that is included within the first frequency band in which the amplified incoming radio frequency signal is to be transmitted, and wherein the signature signal includes a periodic sequence to distinguish the signature signal from the transmitted amplified incoming radio frequency signal; and
a self-interference measurement circuit configured to generate beamforming control signals for the transmit front-end and the receive front-end, wherein the self-interference measurement circuit is further configured to (i) detect the signature signal present at the receive front-end to measure self-interference and (ii) to generate the beamforming control signals based on the detected signature signal such that the signature signal leaked from the transmit front-end back to the receive front-end is reduced.

15. The apparatus of claim 14, wherein the periodic sequence comprises a binary Alexis sequence.

16. The apparatus of claim 14, wherein the self-interference measurement circuit is further configured to evaluate a level of the signature signal over a given observation basis to measure an amount of self-interference over the first frequency band.

17. The apparatus of claim 16, wherein the given observation basis comprises an observation coordinate system including a discrete set of equally spaced points over the first frequency band.

18. The apparatus of claim 1, wherein the periodic sequence comprises a binary Alexis sequence.

19. The apparatus of claim 1, wherein the self-interference measurement circuit is further configured to evaluate a level of the signature signal over a given observation basis to measure an amount of self-interference over the first frequency band.

20. The apparatus of claim 19, wherein the given observation basis comprises an observation coordinate system including a discrete set of equally spaced points over the first frequency band.

* * * * *